(12) United States Patent
Morishita et al.

(10) Patent No.: US 6,819,619 B2
(45) Date of Patent: Nov. 16, 2004

(54) SEMICONDUCTOR MEMORY DEVICE ALLOWING REDUCTION OF AN AREA LOSS

(75) Inventors: Fukashi Morishita, Hyogo (JP); Hiroshi Kato, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 60 days.

(21) Appl. No.: 10/356,560

(22) Filed: Feb. 3, 2003

(65) Prior Publication Data

US 2004/0022114 A1 Feb. 5, 2004

(30) Foreign Application Priority Data

Aug. 2, 2002 (JP) ........................................ 2002-225705

(51) Int. Cl.⁷ .................................................. G11C 5/14
(52) U.S. Cl. .............. 365/226; 365/189.09; 365/189.11
(58) Field of Search ........................... 365/226, 189.09, 365/189.11, 63

(56) References Cited

U.S. PATENT DOCUMENTS

| | | | | |
|---|---|---|---|---|
| 4,952,825 A | | 8/1990 | Yoshida | |
| 5,875,146 A | * | 2/1999 | Itou | 365/226 |
| 6,519,191 B1 | * | 2/2003 | Morishita | 365/189.09 |
| 6,563,746 B2 | * | 5/2003 | Fujioka et al. | 365/189.09 |
| 6,654,300 B2 | * | 11/2003 | Ikeda | 365/201 |

FOREIGN PATENT DOCUMENTS

JP 01233756 A 9/1989

* cited by examiner

*Primary Examiner*—Tan T. Nguyen
(74) *Attorney, Agent, or Firm*—Leydig, Voit & Mayer, Ltd.

(57) ABSTRACT

A semiconductor memory device includes a memory cell array, a data bus, a reference voltage generating circuit, a voltage down converter, a VPP generating circuit, a circuit group, and a test circuit. The reference voltage generating circuit, voltage down converter, and VPP generating circuit include thick film transistors having a gate oxide film thickness suitable to a power supply voltage of 3.3 V. Circuits included in the circuit group include thin film transistors having a gate oxide film thickness suitable to a power supply voltage of 1.5 V. The reference voltage generating circuit, voltage down converter, and VPP generating circuit including the thick film transistors are arranged to form units corresponding to the position of the memory cell array.

11 Claims, 36 Drawing Sheets

FIG.37 PRIOR ART

| TEST CIRCUIT | CONTROL CIRCUIT (VPP, VDC, ETC.) | | Vcc/2 CIRCUIT, ETC. | | VREF GENERATING CIRCUIT | | VBB GENERATING CIRCUIT | |
|---|---|---|---|---|---|---|---|---|
| | VPP | VPP | VDC | VDC | VDC | VDC | VPP | VPP |
| DATA BUS | 2 Mb MEMORY CELL ARRAY | 2 Mb MEMORY CELL ARRAY | 2 Mb MEMORY CELL ARRAY | 2 Mb MEMORY CELL ARRAY | 2 Mb MEMORY CELL ARRAY | 2 Mb MEMORY CELL ARRAY | 2 Mb MEMORY CELL ARRAY | 2 Mb MEMORY CELL ARRAY |

SEMICONDUCTOR MEMORY DEVICE ALLOWING REDUCTION OF AN AREA LOSS

BACKGROUND OF THE INVENTION

1. Field of the Invention

The present invention relates to a semiconductor memory device, and particularly to a semiconductor memory device allowing reduction of an area loss in a power supply circuit, which generates an internal voltage within the semiconductor memory device.

2. Description of the Background Art

Owing to advances in semiconductor technology, it is now possible to produce a logic-mixed memory, which includes a logic circuit and a DRAM (Dynamic Random Access Memory) in a single chip. This can significantly improve a data transfer rate between the logic circuit and the DRAM.

Referring to FIG. 34, a logic-mixed memory 700 includes a DRAM 800, SRAMs (Static Random Access Memories) 810 and 820, a logic circuit 830 and pads 840.

DRAM 800 and SRAMs 810 and 820 are memories for storing data. Logic circuit 830 controls input/output of data to and from DRAM 800 and SRAMs 810 and 820. Pads 840 are terminals and are arranged in a peripheral portion for inputting and/or outputting a power supply voltage, control signals and data to and/or from logic-mixed memory 700.

In logic-mixed memory 700, logic circuit 830 rapidly transmits data and others to and from the memories, i.e., DRAM 800 and SRAMs 810 and 820.

Referring to FIG. 35, DRAM 800 includes memory cell arrays 801 and 802, a row column decoder 803, data buses 804 and 805, a control circuit 806, a power supply circuit 807 and a test circuit 808.

Each of memory cell arrays 801 and 802 includes a plurality of memory cells, a plurality of word lines, a plurality of bit line pairs, a plurality of sense amplifiers provided corresponding to the respective bit line pairs, a plurality of equalize circuits provided corresponding to the respective bit line pairs, and others. The plurality of memory cells are arranged in rows and columns. The plurality of word lines are arranged in the row directions of the plurality of memory cells arranged in rows and columns. The plurality of bit line pairs are arranged in the column direction of the plurality of memory cells arranged in rows and columns.

Row column decoder 803 is arranged between memory cell arrays 801 and 802. Row column decoder 803 decodes an externally applied address, and activates the word line or the bit line pair designated by the decoded address.

Data buses 804 and 805 are lines for transmitting the data to and from the plurality of memory cells included in memory cell arrays 801 and 802. Control circuit 806 controls operations such as input/output of data with respect to the plurality of memory cells.

Power supply circuit 807 generates an internal voltage based on an external power supply voltage, which is externally supplied, and supplies the internal voltage thus generated to memory cell arrays 801 and 802 as well as peripheral circuits such as control circuit 806.

Test circuit 808 conducts tests on DRAM 800.

Referring to FIG. 36, power supply circuit 807 includes a Vbb generating circuit 850, a reference voltage generating circuit 860, a voltage down converter 870, Vcc/2 generating circuits 880 and 890, and a VPP generating circuit 900.

Vbb generating circuit 850 is formed of a level converter 851, a control circuit 852, a detecting circuit 853, an oscillator 854 and a pump circuit 855. Level converter 851 receives power supply voltages from nodes N1 and N2. Node N1 supplies the power supply voltage, e.g., of 1.5 V. Node N2 supplies the power supply voltage, e.g., of 3.3 V. Level converter 851 receives a control signal such as a test mode signal TM, and converts the voltage level forming test mode signal TM thus received from 1.5 V to 3.3 V. Level converter 851 provides test mode signal TM subjected to the level conversion to control circuit 852.

Control circuit 852 receives the power supply voltage of 3.3 V from node N2. Control circuit 852 controls detecting circuit 853 based on test mode signal TM received from level converter 851. More specifically, when test mode signal TM is at an H (logical high) level, control circuit 852 activates or deactivates detecting circuit 853 for conducting various tests. When test mode signal TM is at an L (logical low) level, control circuit 852 activates detecting circuit 853.

Detecting circuit 853 receives the power supply voltage of 3.3 V from node N2. Detecting circuit 853 detects a negative voltage Vbb when a signal BIASL received from a current source 861 of reference voltage generating circuit 860 is at H-level, and provides the detection signal of negative voltage Vbb to oscillator 854.

Oscillator 854 receives the power supply voltage of 3.3 V from node N2. Oscillator 854 generates a clock CLK, which has a phase corresponding to the logical level of the detection signal received from detecting circuit 853, and provides clock CLK thus generated to pump circuit 855.

Pump circuit 855 receives a power supply voltage of 3.3 V from node N2. Pump circuit 855 pumps carriers to generate negative voltage Vbb of 0.7 V in synchronization with clock CLK received from oscillator 854.

As described above, Vbb generating circuit 850 is driven by the power supply voltage of 3.3 V received from node N2, and generates negative voltage Vbb of −0.7 V for providing it to memory cell arrays 801 and 802.

Reference voltage generating circuit 860 includes current source 861 and a voltage generating circuit 862. Current source 861 receives the power supply voltage of 3.3 V from node N2. Based on the power supply voltage of 3.3 V received from node N2, current source 861 generates a voltage VII as well as signals BIASL and ICONST formed of a voltage in a linear operation region of the MOS transistor, provides voltage VII and signal ICONST thus generated to voltage generating circuit 862, and provides signal BIASL to detecting circuit 853 of Vbb generating circuit 850, voltage down converter 870 and VPP generating circuit 900. Signal ICONST is formed of a maximum voltage in the linear motion region of the MOS transistor. Signal BIASL is formed of a minimum voltage in the linear motion region of the MOS transistor.

Voltage generating circuit 862 receives voltage VII and signal ICONST from current source 861, and operates based on voltage VII and signal ICONST thus received to generate a reference voltage VrefS of 1.5 V and provide it to voltage down converter 870 and VPP generating circuit 900.

As described above, reference voltage generating circuit 860 is driven by the power supply voltage of 3.3 V received from node N2, and generates reference voltage VrefS of 1.5 V lower than the power supply voltage.

Voltage down converter 870 includes a level converter 871, a control circuit 872, differential amplifier circuits 873 and 876, P-channel MOS transistors 874 and 877, and N-channel MOS transistors 875 and 878. Level converter 871 receives the power supply voltage of 1.5 V from node N1, and receives the power supply voltage of 3.3 V from node N2. Level converter 871 receives control signals such as test mode signal TM, sense amplifier enable signal SAE or the like, and converts the voltage level of received test mode signal TM or sense amplifier enable signal SAE from 1.5 V to 3.3 V. Level converter 871 provides test mode signal TM or sense amplifier enable signal SAE at the converted level to control circuit 872.

Control circuit 872 receives the power supply voltage of 3.3 V from node N2. Control circuit 872 receives test mode signal TM or sense amplifier enable signal SAE from level converter 871, and provides received test mode signal TM or sense amplifier enable signal SAE to a gate terminal of N-channel MOS transistor 875. In the test mode of DRAM 800, control circuit 872 receives test mode signal TM at H- or L-level corresponding to contents of the intended test, and provides received test mode signal TM at H- or L-level to the gate terminal of N-channel MOS transistor 875. In the normal operation of DRAM 800, control circuit 872 receives sense amplifier enable signal SAE at H-level, and provides received sense amplifier enable signal SAE at H-level to the gate terminal of N-channel MOS transistor 875. During standby of DRAM 800, control circuit 872 receives sense amplifier enable signal SAE at L-level, and provides received sense amplifier enable signal SAE at L-level to the gate terminal of N-channel MOS transistor 875.

Differential amplifier circuit 873 is connected between node N2 and N-channel MOS transistor 875, receives reference voltage VrefS sent from reference voltage generating circuit 860 on its noninverting input terminal, and receives on its inverting input terminal an array voltage VccS carried on an output node NOUT. When N-channel MOS transistor 875 receives test mode signal TM at H-level or sense amplifier enable signal SAE at H-level on its gate terminal, differential amplifier circuit 873 is activated. When N-channel MOS transistor 875 receives test mode signal TM at L-level or sense amplifier enable signal SAE at L-level on its gate terminal, differential amplifier circuit 873 is deactivated.

When differential amplifier circuit 873 is activated, it differentially amplifies array voltage VccS so that array voltage VccS may attain the voltage level of reference voltage VrefS, and provides the amplified voltage of 1.5 V to the gate terminal of P-channel MOS transistor 874. When differential amplifier circuit 873 is deactivated, it provides a voltage, which is close to the power supply voltage of 3.3 V received from node N2, to the gate terminal of P-channel MOS transistor 874.

P-channel MOS transistor 874 is connected between node N2 and output node NOUT. P-channel MOS transistor 874 supplies carriers from node N2 to output node NOUT in accordance with the voltage received from differential amplifier circuit 873.

N-channel MOS transistor 875 is connected between differential amplifier circuit 873 and a ground node NS1, and receives test mode signal TM or sense amplifier enable signal SAE from control circuit 872 on its gate terminal.

Differential amplifier circuit 876 is connected between node N2 and N-channel MOS transistor 878, receives reference voltage VrefS from reference voltage generating circuit 860 on its noninverting input terminal, and receives, on its inverting input terminal, array voltage VccS carried on output node NOUT. Differential amplifier circuit 876 is activated when N-channel MOS transistor 878 receives signal BIASL at H-level from current source 861 of reference voltage generating circuit 860, and is deactivated when it receives signal BIASL at L-level. When activated, differential amplifier circuit 876 differentially amplifies array voltage VccS so that array voltage VccS may attain the voltage level of reference voltage VrefS, and provides the amplified voltage of 1.5 V to the gate terminal of P-channel MOS transistor 877.

P-channel MOS transistor 877 is connected between node N2 and output node NOUT. P-channel MOS transistor 877 supplies carriers from node N2 to output node NOUT in accordance with the voltage received from differential amplifier circuit 876.

N-channel MOS transistor 878 is connected between differential amplifier circuit 876 and ground node NS1, and receives signal BIASL sent from current source 861 of reference voltage generating circuit 860 on its gate terminal.

When N-channel MOS transistor 875 receives test mode signal TM at H-level or sense amplifier enable signal SAE at H-level on its gate terminal, differential amplifier circuit 873 is activated so that it differentially amplifies array voltage VccS to attain the voltage level of reference voltage VrefS, and provides the amplified voltage of 1.5 V to the gate terminal of P-channel MOS transistor 874. P-channel MOS transistor 874 supplies carriers from node N2 to output node NOUT in accordance with the voltage of 1.5 V received from differential amplifier circuit 873, and thereby sets voltage VccS on output node NOUT to 1.5 V. When differential amplifier circuit 873 is inactive, P-channel MOS transistor 874 receives a voltage close to 3.3 V on its gate terminal so that it is substantially turned off, and the voltage level of array voltage VccS on output node NOUT lowers.

When N-channel MOS transistor 878 receives signal BIASL at H-level on its gate terminal, differential amplifier circuit 876 and P-channel MOS transistor 877 perform the same operations as differential amplifier circuit 873 and P-channel MOS transistor 874, respectively, so that array voltage VccS on output node NOUT is set to 1.5 V. When N-channel MOS transistor 878 receives signal BIASL at L-level and differential amplifier circuit 876 is deactivated, the voltage level of array voltage VccS on output node NOUT lowers similarly to the case when differential amplifier circuit 873 is deactivated.

When DRAM 800 in on standby, N-channel MOS transistor 875 receives sense amplifier enable signal SAE at L-level on its gate terminal, and N-channel MOS transistor 878 receives signal BIASL formed of a voltage level of 0.7 V on its gate terminal. Consequently, differential amplifier circuit 873 is deactivated, and differential amplifier circuit 876 is activated.

Thereby, differential amplifier circuit 876 differentially amplifies array voltage VccS on output node NOUT so that array voltage VccS may attain the voltage level of reference voltage VrefS, and provides the amplified voltage to the gate terminal of P-channel MOS transistor 877. P-channel MOS transistor 877 supplies carriers from node N2 to output node NOUT in accordance with the voltage received from differential amplifier circuit 876.

Accordingly, differential amplifier circuit 876 as well as P- and N-channel MOS transistors 877 and 878 lower the power supply voltage of 3.3 V to generate array voltage VccS of 1.5 V when DRAM 800 is on standby. In this case, N-channel MOS transistor 878 receives signal BIASL formed of the voltage level of 0.7 V on its gate terminal, and therefore has a channel width smaller than that in the normal operation. Accordingly, a current flowing through differential amplifier circuit 876 is smaller than that in the normal operation, and differential amplifier circuit 876 provides a voltage at a higher level than that in the normal operation to P-channel MOS transistor 877. Thereby, P-channel MOS transistor 877 supplies carriers smaller in amount than those in the normal operation from node N2 to output node NOUT so that array voltage VccS attains the voltage level of 1.5 V more slowly than that in the normal operation.

In the normal operation of DRAM 800, N-channel MOS transistor 875 receives sense amplifier enable signal SAE at H-level on its gate terminal, and N-channel MOS transistor 878 receives signal BIASL formed of the voltage level of 0.7 V on its gate terminal. Thereby, differential amplifier circuits 873 and 876 are activated. In this case, sense amplifier enable signal SAE at H-level is formed of a voltage level of 3.3 V so that the channel width of N-channel MOS transistor 875 is wider than that of N-channel MOS transistor 878. Therefore, the current flowing through differential amplifier circuit 873 is larger than the current flowing through differential amplifier circuit 876, and differential amplifier circuit 873 provides a voltage lower than that of differential amplifier circuit 876 to P-channel MOS transistor 874. Consequently, P-channel MOS transistor 874 supplies more carriers than P-channel MOS transistor 877 from node N2 to output node NOUT.

In the normal operation of DRAM 800, therefore, differential amplifier circuit 873, P-channel MOS transistor 874 and N-channel MOS transistor 875 set the voltage level of array voltage VccS to 1.5 V more rapidly than differential amplifier circuit 876, P-channel MOS transistor 877 and N-channel MOS transistor 878.

In the normal operation of DRAM 800, as described above, differential amplifier circuit 873, P-channel MOS transistor 874 and N-channel MOS transistor 875 lower the power supply voltage of 3.3 V to set rapidly the voltage level of array voltage VccS to 1.5 V. During standby of DRAM 800, differential amplifier circuit 876, P-channel MOS transistor 877 and N-channel MOS transistor 878 lower the power supply voltage of 3.3 V to set slowly the voltage level of array voltage VccS to 1.5 V.

The number of circuits each formed of differential amplifier circuit 873 and P- and N-channel MOS transistors 874 and 875 as well as the number of circuits each formed of differential amplifier circuit 876 and P- and N-channel MOS transistors 877 and 878 are variable depending on the number of blocks forming memory cell arrays 801 and 802.

As described above, voltage down converter 870 is driven by the power supply voltage of 3.3 V. In the normal operation of DRAM 800, voltage down converter 870 lowers the power supply voltage of 3.3 V to supply rapidly array voltage VccS of 1.5 V to output node NOUT. During standby of DRAM 800, voltage down converter 870 lowers the power supply voltage of 3.3 V to supply slowly array voltage VccS of 1.5 V to output node NOUT.

Vcc/2 generating circuit 880 is driven by the power supply voltage of 3.3 V received from node N2. Vcc/2 generating circuit 880 receives array voltage VccS on output node NOUT, and halves array voltage VccS to generate a precharge voltage VBL. Vcc/2 generating circuit 890 is driven by the power supply voltage of 3.3 V received from node N2. Vcc/2 generating circuit 890 receives array voltage VccS on output node NOUT, and halves array voltage VccS to generate a cell plate voltage VCP.

VPP generating circuit 900 includes a level converter 901, a control circuit 902, a dividing circuit 903, detecting circuits 904 and 905, an oscillator 906 and pump circuits 907–910.

Level converter 901 receives the power supply voltage of 1.5 V from node N1, and receives the power supply voltage of 3.3 V from node N2. Level converter 901 receives test mode signal TM or a row address strobe signal RAS, and converts the voltage level of received test mode signal TM or row address strobe signal RAS from 1.5 V to 3.3 V for providing it to control circuit 902.

Control circuit 902 receives the power supply voltage of 3.3 V from node N2. Control circuit 902 provides test mode signal TM or row address strobe signal RAS received from level converter 901 to detecting circuits 904 and 905. In the test mode of DRAM 800, control circuit 902 receives test mode signal TM at H- or L-level depending on contents of the test, and provides received test mode signal TM at H- or L-level to detecting circuits 904 and 905. In the normal operation of DRAM 800, control circuit 902 receives row address strobe signal RAS at H-level, and provides received row address strobe signal RAS at H-level to detecting circuit 904. During standby of DRAM 800, control circuit 902 receives row address strobe signal RAS at L-level, and provides received row address strobe signal RAS to detecting circuit 904.

Dividing circuit 903 divides boosted voltage VPP of 3.3 V to provide a divided voltage VDIV of 1.5 V to detecting circuits 904 and 905. Detecting circuit 904 receives the power supply voltage of 3.3 V from node N2. Detecting circuit 904 is activated by row address strobe signal RAS at H-level received from control circuit 902, and differentially amplifies divided voltage VDIV so that divided voltage VDIV provided from dividing circuit 903 may match with reference voltage VrefS received from reference voltage generating circuit 860. Thus, detecting circuit 904 detects divided voltage VDIV, and provides it to oscillator 906.

Detecting circuit 905 receives the power supply voltage of 3.3 V from node N2. Detecting circuit 905 is activated by signal BIASL sent from current source 861 of reference voltage generating circuit 860, and differentially amplifies divided voltage VDIV received from dividing circuit 903 so that divided voltage VDIV may match with reference voltage VrefS received from reference voltage generating circuit 860. Thus, detecting circuit 905 detects divided voltage VDIV, and provides it to oscillator 906.

Row address strobe signal RAS at H-level is formed of a voltage level of 3.3 V, and signal BIASL is formed of a voltage level of 0.7 V. Therefore, detecting circuit 904 detects divided voltage VDIV more rapidly than detecting circuit 905, and provides it to oscillator 906.

In the normal operation of DRAM 800, detecting circuit 904 receives row address strobe signal RAS at H-level, and detecting circuit 905 receives signal BIASL. Therefore, detecting circuit 904 detects divided voltage VDIV more rapidly than detecting circuit 905, and provides it to oscillator 906. During standby of DRAM 800, detecting circuit 904 receives row address strobe signal RAS at L-level, and detecting circuit 905 receives signal BIASL formed of the voltage level of 0.7 V. Detecting circuit 904 is inactive, and detecting circuit 905 detects divided voltage VDIV more slowly than that in the normal operation, and provides it to oscillator 906. Therefore, detecting circuit 904 detects divided voltage VDIV in the normal operation, and detecting circuit 905 detects divided voltage VDIV during standby.

Oscillator 906 receives power supply voltage of 3.3 V from node N2. Oscillator 906 generates dock CLK having a phase corresponding to the voltage level of divided voltage VDIV received from detecting circuits 904 and 905, and provides clock CLK thus generated to pump circuits 907–910.

Each of pump circuits 907–910 receives the power supply voltage of 3.3 V from node N2. Each of pump circuits 907–910 pumps carriers in synchronization with clock CLK received from oscillator 906 to generate boosted voltage VPP. The number of pump circuits 907–910 is variable depending on the number of blocks forming memory cell arrays 801 and 802.

As described above, VPP generating circuit 900 is driven by the power supply voltage of 3.3 V, and boosts the power supply voltage of 3.3 V to generate boosted voltage VPP. As described above, power supply circuit 807 is driven by the power supply voltage of 3.3 V, and the MOS transistors forming Vbb generating circuit 850, reference voltage generating-circuit 860, voltage down converter 870, Vcc/2 generating circuits 880 and 890, and VPP generating circuit 900 have gate oxide films having a large thickness suitable to the drive voltage of 3.3 V.

However, control circuits 852, 872 and 902 as well as detecting circuits 853, 904 and 905, included in Vbb generating circuit 850, reference voltage generating circuit 860, voltage down converter 870, Vcc/2 generating circuits 880 and 890, and VPP generating circuit 900 are arranged adjacent to memory cell arrays 801 and 802, although they are not arranged in accordance with a pattern of repetition of the array circuits forming memory cell arrays 801 and 802 (see FIG. 35). Therefore, if the structures of memory cell arrays 801 and 802 are changed, the foregoing circuits cannot flexibly follow such changes. In particular, the control circuits are configured to form groups each having an independent or similar function, and this layout is determined in advance so each group corresponds to an integer multiple of the number into which memory cell arrays 801 and 802 are divided.

Accordingly, if memory cell arrays 801 and 802 have small capacities, an area loss occurs in arrangements of the respective circuits in power supply circuit 807.

More specifically, as shown in FIGS. 37–40, if a memory cell array has a capacity of 16 megabytes (Mb), the various circuits in the power supply circuit are arranged without an area loss (see FIG. 37). However, as the capacity of the memory cell array decreases to 4 Mb, 2 Mb and 1 Mb, an empty region increases so that the area loss increases (FIGS. 38–40).

If the arrangement of respective circuits in the power supply circuit is determined in accordance with the memory cell array having a small capacity, the area loss increases with an increase in the capacity of the memory cell array.

SUMMARY OF THE INVENTION

Accordingly, an object of the invention is to provide a semiconductor memory device provided with a power supply circuit, in which an area loss due to changes in capacity of a memory cell array is suppressed.

According to the invention, a semiconductor memory device includes a memory cell array storing data, a peripheral circuit inputting and outputting data to and from the memory cell array, and a power supply circuit supplying a power supply voltage to the memory cell array and the peripheral circuit. The power supply circuit is formed of a first power supply circuit group including voltage generating circuits of m (m: natural number) in number formed of thick film transistors having a first gate oxide film thickness, and each generating an internal voltage for inputting and outputting the data to and from the memory cell array, and a second power supply circuit group including voltage generating circuits of n (n: natural number) in number formed of thin film transistors having a second gate oxide film thickness smaller than the first gate oxide film thickness, and each generating an internal voltage. The first power supply circuit group corresponds to the memory cell array and is arranged in a first region neighboring to the memory cell array. The m voltage generating circuits are arranged in the first region to form units of m in number, and the second power supply circuit group is arranged in a second region other than the first region, and the n voltage generating circuits are arranged in the second region in a shuffled fashion.

According to the semiconductor memory device of the invention, the circuits formed of the thick film transistors having the first gate oxide film thickness are arranged to form units corresponding to the position of the memory cell array, and the circuits formed of the thin film transistors having the second gate oxide film thickness are arranged in a shuffled fashion.

In the invention, the thick film transistor represents an MOS transistor, which has a gate oxide film thickness suitable to a power supply voltage at a higher voltage level between two kinds of power supply voltages at different voltage levels. The thin film transistor represents an MOS transistor, which has a gate oxide film thickness suitable to the power supply voltage at a lower voltage level.

According to the invention, therefore, the circuits formed of the thick film transistors and the circuits formed of the thin film transistors can be arranged in a manner reducing the area loss even if changes occur in capacity of the memory cell array.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 37 is a schematic block diagram of a conventional semiconductor memory device having a capacity of 16 Mb;

DESCRIPTION OF THE PREFERRED EMBODIMENTS

Figure 1:
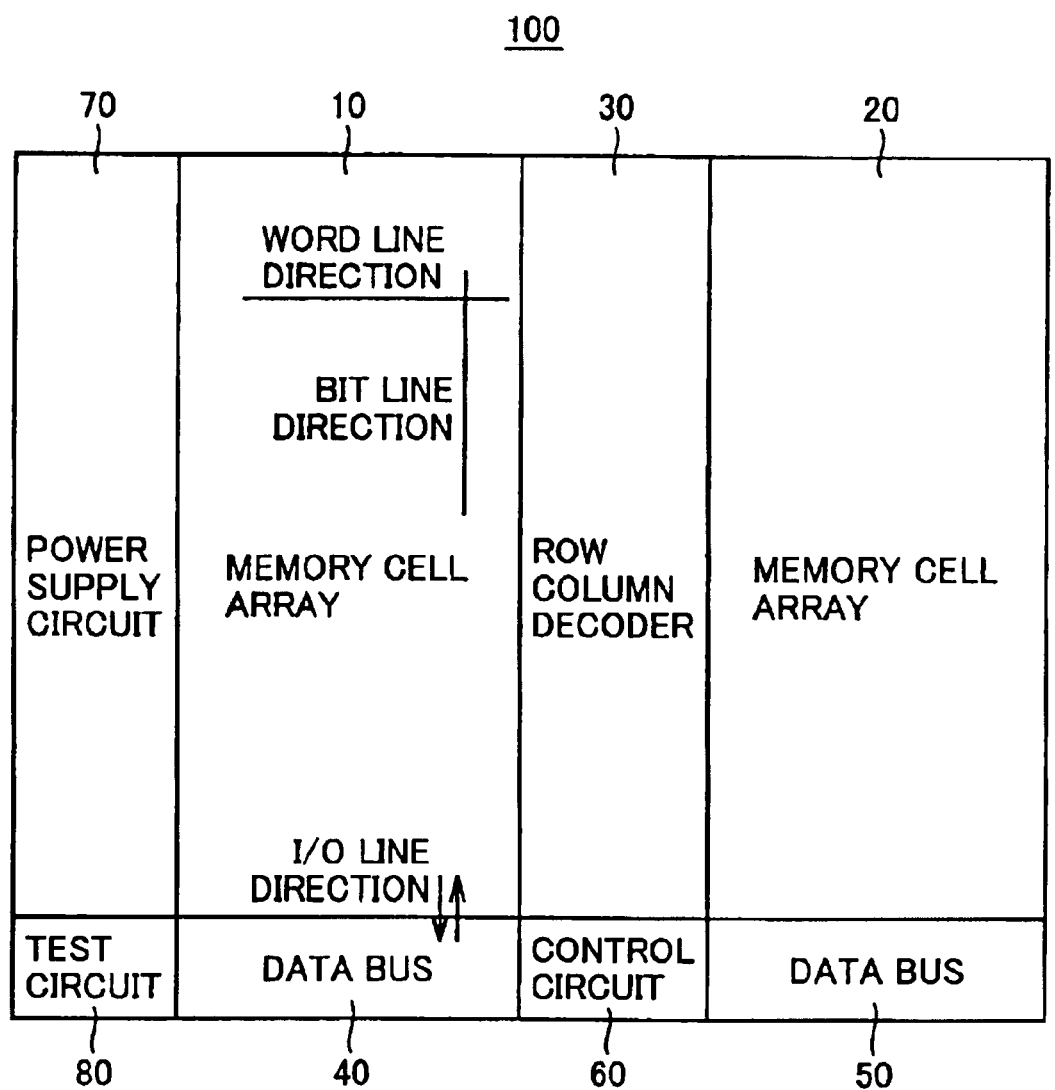
FIG. 1 is a schematic block diagram of a semiconductor memory device according to a first embodiment.

Embodiments of the invention will now be described in greater detail with reference to the drawings. In the drawings, the same or corresponding portions bear the same reference numbers, and description thereof is not repeated.

[First Embodiment]

Referring to FIG. 1, a semiconductor memory device 100 according to a first embodiment of the invention includes memory cell arrays 10 and 20, a row column decoder 30, data buses 40 and 50, a control circuit 60, a power supply circuit 70 and a test circuit 80.

Semiconductor memory device 100 is a DRAM used in a logic-mixed memory including a logic circuit and a memory in a mixed fashion.

Each of memory cell arrays 10 and 20 includes a plurality of memory cells, a plurality of word lines, a plurality of bit line pairs, a plurality of sense amplifiers and a plurality of equalize circuits. The plurality of memory cells are arranged in rows and columns. The plurality of word lines are arranged in the row direction of the plurality of memory cells arranged in rows and columns. The plurality of bit line pairs are arranged in the column direction of the plurality of memory cells arranged in rows and columns. The plurality of sense amplifiers are arranged corresponding to the plurality of bit line pairs, respectively. The plurality of equalize circuits are arranged corresponding to the plurality of bit line pairs.

Row column decoder 30 decodes an externally supplied address, and selectively activates the word line or bit line pair designated by the decoded address. More specifically, when row column decoder 30 receives the address in accordance with timing of switching of a row address strobe signal RAS, which is received from control circuit 60, from L-level to H-level, it determines the received address as a row address, and decodes it to activate the word line designated by the decoded row address. When row column decoder 30 receives the address in accordance with the timing of switching of a column address strobe signal CAS, which is received from control circuit 60, from L-level to H-level, it determines the received address as a column address, and decodes it to activate the bit line pair designated by the decoded column address.

Data buses 40 and 50 transmit the data between memory cell array 10 or 20 and an I/O circuit (not shown).

Control circuit 60 externally receives control signals such as row address strobe signal RAS, column address strobe signal CAS, a write enable signal WE, an output enable signal OE and a test mode signal TM. Control circuit 60 provides row address strobe signal RAS and column address strobe signal CAS to row column decoder 30, and provides row address strobe signal RAS to power supply circuit 70. Control circuit 60 also provides test mode signal TM to power supply circuit 70 and test circuit 80. Further, control circuit 60 provides write enable signal WE and output enable signal OE to the I/O circuit (not shown).

Power supply circuit 70 generates various internal voltages used in semiconductor memory device 100, as will be described later, and supplies these internal voltages to memory cell arrays 10 and 20, and others.

Test circuit 80 conducts various tests in accordance with test mode signal TM sent from control circuit 60.

In semiconductor memory device 100, row column decoder 30 is arranged between memory cell arrays 10 and 20. Power supply circuit 70 neighbors to memory cell array 10. Data buses 40 and 50, control circuit 60 and test circuit 80 are arranged in a peripheral portion of semiconductor memory device 100.

Figure 2:
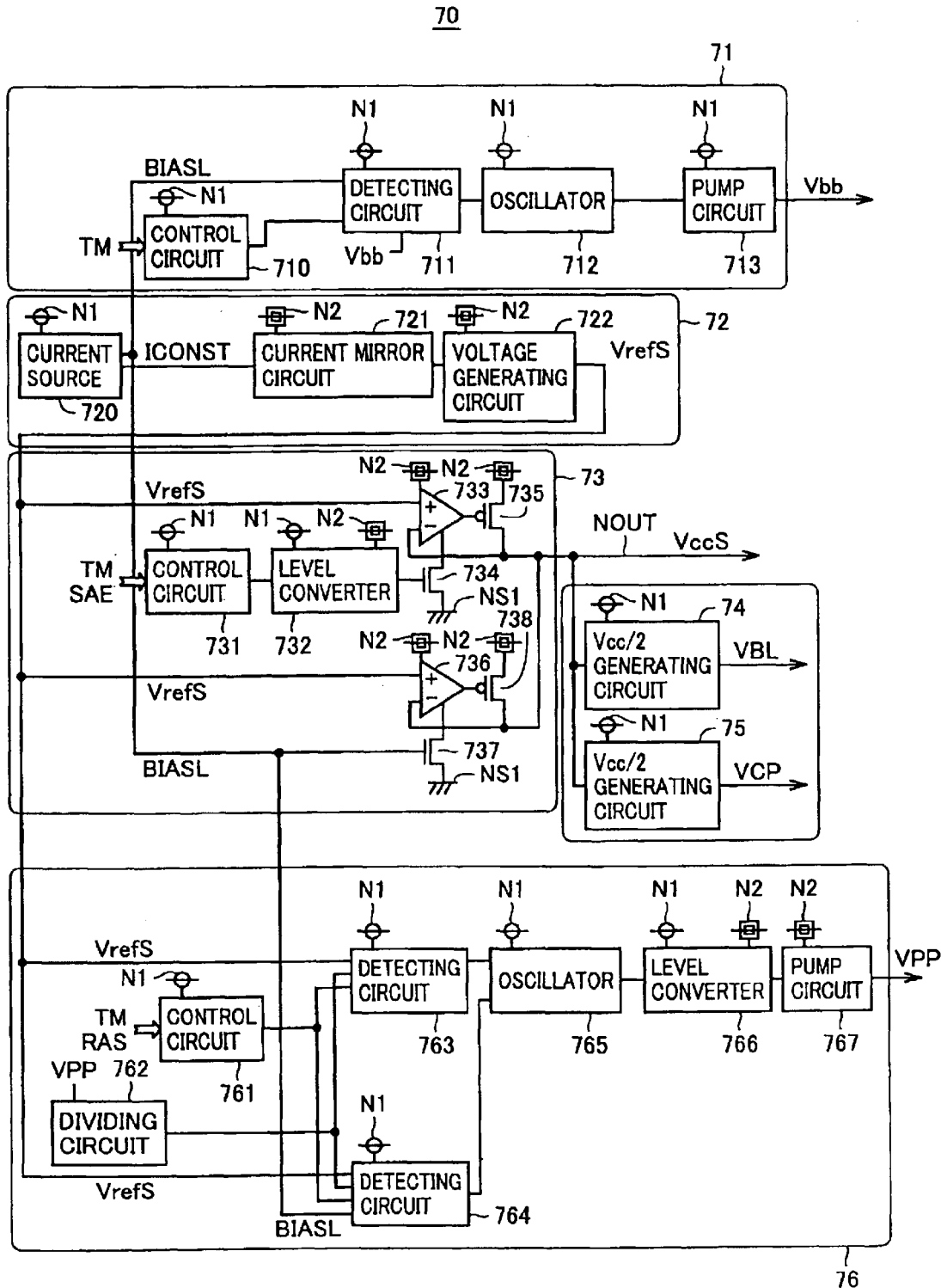
FIG. 2 is a circuit diagram showing a power supply circuit shown in FIG. 1 with some portions depicted in block forms.

Referring to FIG. 2, power supply circuit 70 includes a Vbb generating circuit 71, a reference voltage generating circuit 72, a voltage down converter 73, Vcc/2 generating circuits 74 and 75, and a VPP generating circuit 76.

Vbb generating circuit 71 includes a control circuit 710, a detecting circuit 711, an oscillator 712 and a pump circuit 713. Node N1 externally receives a power supply voltage of 1.5 V. Control circuit 710 receives the power supply voltage of 1.5 V from node N1. Therefore, control circuit 710 is formed of an MOS transistor, which is driven by the power supply voltage of 1.5 V and has a thin gate oxide film. In the present invention, the MOS transistor having a thin gate oxide film represents an MOS transistor having a gate oxide film thickness suitable to the power supply voltage of 1.5 V.

Control circuit 710 receives test mode signal TM to activate or deactivate detecting circuit 711 in accordance with contents of the test to be conducted.

Detecting circuit 711 is driven by the power supply voltage of 1.5 V received from node N1. Detecting circuit 711 receives signal BIASL from current source 720 of reference voltage generating circuit 72. When detecting circuit 711 is activated by the signal sent from control circuit 710, it detects a negative voltage Vbb, and issues a detection signal indicating the detection to oscillator 712.

Oscillator 712 is driven by the power supply voltage of 1.5 V received from node N1. Oscillator 712 receives the detection signal from detecting circuit 711, and issues clock CLK having a phase corresponding to the voltage level of the received detection signal.

Pump circuit 713 is driven by the power supply voltage of 1.5 V received from node N1. Pump circuit 713 receives clock CLK from oscillator 712, and pumps carriers in synchronization with received clock CLK to generate negative voltage Vbb.

Figure 3:
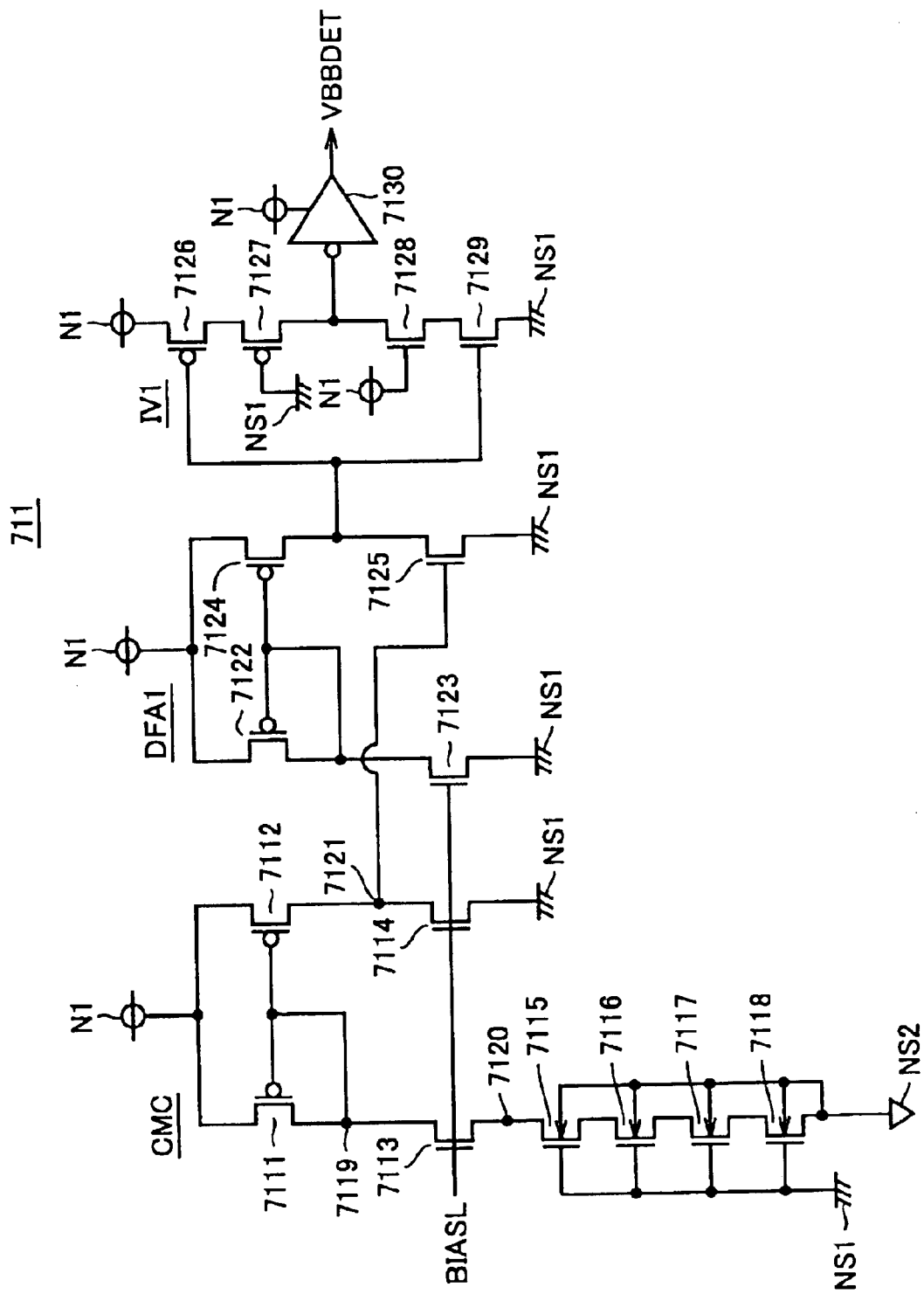
FIG. 3 is a circuit diagram of a detecting circuit included in a Vbb generating circuit shown in FIG. 2.

Referring to FIG. 3, detecting circuit 711 includes P-channel MOS transistors 7111, 7112, 7122, 7124, 7126 and 7127, N-channel MOS transistors 7113, 7114, 7115–7118, 7123, 7125, 7128 and 7129, and an inverter 7130. P-channel MOS transistors 7111, 7112, 7122, 7124, 7126 and 7127, N-channel MOS transistors 7113, 7114, 7115–7118, 7123, 7125, 7128 and 7129, and MOS transistors (not shown) forming inverter 7130 are MOS transistors having thin gate oxide films, respectively.

P- and N-channel MOS transistors 7111 and 7113 are connected in series between node N1 and node 7120. P- and N-channel MOS transistors 7112 and 7114 are connected in series between node N1 and ground node NS1. P- and N-channel MOS transistors 7111 and 7113 are connected in parallel to P- and N-channel MOS transistors 7112 and 7114.

P-channel MOS transistors 7111 and 7112 receive on their gate terminals a voltage on a node 7119. N-channel MOS transistors 7113 and 7114 receive signal BIASL from current source 720 on their gate terminals.

N-channel MOS transistors 7115–7118 are connected in series between node 7120 and a ground node NS2. Ground node NS2 receives negative voltage Vbb of –0.7 V. Each of N-channel MOS transistors 7115–7118 receives negative voltage Vbb of –0.7 V carried on ground node NS2 as a substrate voltage, and also receives on its gate terminal the voltage of 0 V carried on ground node NS1. Therefore, each of N-channel MOS transistors 7115–7118 is turned on by substantially receiving a positive voltage on the gate terminal.

N-channel MOS transistors 7115–7118 are provided for adjusting the potential on node 7120 to the ground potential (i.e., 0 V). For actual use, fuses (not shown) are selectively blown to adjust the number of N-channel MOS transistors 7115–7118 connected in series so that node 7120 may carry a potential of 0 V. Node 7120 carrying 0 V will be referred to as a "virtual ground".

When the potential on node 7120 is 0 V, the voltage applied across the both sides of P- and N-channel MOS transistors 7111 and 7113 connected in series is equal to the voltage applied across the both sides of P- and N-channel MOS transistors 7112 and 7114 connected in series. Further, N-channel MOS transistors 7113 and 7114 both receive signal BIASL at the voltage level of 0.7 V on their gate terminals. Therefore, the current flowing through P- and N-channel MOS transistors 7111 and 7113 is equal to that flowing through P- and N-channel MOS transistors 7112 and 7114, and the potential on a node 7121 is equal to the potential on node 719.

As described above, when negative voltage Vbb of –0.7 V is supplied to ground node NS2 to form the virtual ground by node 7120, node 7121 provides the voltage, which is higher than the potential (0 V) on ground node NS1 by an amount of voltage drop caused by the channel resistance of N-channel MOS transistor 7114.

Thus, a current mirror circuit CMC formed of P-channel MOS transistors 7111 and 7112 as well as N-channel MOS transistors 7113, 7114 and 7115–7118 detects negative voltage Vbb of –0.7 V, and converts detected negative voltage Vbb to a positive voltage for outputting it.

P- and N-channel MOS transistors 7122 and 7123 are connected in series between node N1 and ground node NS1. P- and N-channel MOS transistors 7124 and 7125 are connected in series between node N1 and ground node NS1. P- and N-channel MOS transistors 7122 and 7123 are connected in parallel to P- and N-channel MOS transistors 7124 and 7125.

P-channel MOS transistors 7122 and 7124 receive on their gate terminals a voltage placed between P- and N-channel MOS transistors 7122 and 7123. N-channel MOS transistor 7123 receives signal BIASL formed of the voltage level of 0.7 V on its gate terminal. N-channel MOS transistor 7125 receives a positive voltage supplied from node 7121 on its gate terminal.

A differential amplifier circuit DFA1 formed of P-channel MOS transistors 7122 and 7124 as well as N-channel MOS transistors 7123 and 7125 is of a current mirror type, and compares the voltage received on the gate terminal of N-channel MOS transistor 7125 with the voltage received on the gate terminal of N-channel MOS transistor 7123 to provide a voltage corresponding to results of the comparison to the gate terminals of P- and N-channel MOS transistors 7126 and 7129.

When the voltage received on the gate terminal of N-channel MOS transistor 7125 is higher than the voltage received on the gate terminal of N-channel MOS transistor 7123, differential amplifier circuit DFA1 issues a signal at L-level for turning on P-channel MOS transistor 7126 in inverter IV1 formed of P-channel MOS transistors 7126 and 7127 as well as N-channel MOS transistors 7128 and 7129, and for turning off N-channel MOS transistor 7129. When the voltage received on the gate terminal of N-channel MOS transistor 7125 is lower than the voltage received on the gate terminal of N-channel MOS transistor 7123, differential amplifier circuit DFA1 issues a signal at H-level for turning off P-channel MOS transistor 7126 in inverter IV1 and for turning on N-channel MOS transistor 7129.

P-channel MOS transistors 7126 and 7127 as well as N-channel MOS transistors 7128 and 7129 are connected in series between node N1 and ground node NS1. P-channel MOS transistor 7127 receives on its gate terminal the ground voltage of 0 V from ground node NS1. N-channel MOS transistor 7128 receives on its gate terminal the power supply voltage of 1.5 V from node N1. Therefore, when P- and N-channel MOS transistors 7127 and 7128 are supplied with the ground voltage of 0 V and the power supply voltage of 1.5 V, respectively, these transistors are always on.

P- and N-channel MOS transistors 7126 and 7129 receive on their gate terminals a signal sent from differential amplifier circuit DFA1. Inverter IV1 formed of P- and N-channel MOS transistors 7126, 7127, 7128 and 7129 provides a signal at H-level to inverter 7130 when differential amplifier circuit DFA1 issues a signal at L-level, and provides a signal at L-level to inverter 7130 when differential amplifier circuit DFA1 issues a signal at H-level.

Inverter 7130 inverts the input signal to provide a detection signal VBBDET to ground node NS2 and oscillator 712.

As described above, detecting circuit 711 is driven by the power supply voltage of 1.5 V, and detects negative voltage Vbb of −0.7 V for providing detection signal VBBDET to oscillator 712.

Figure 4:
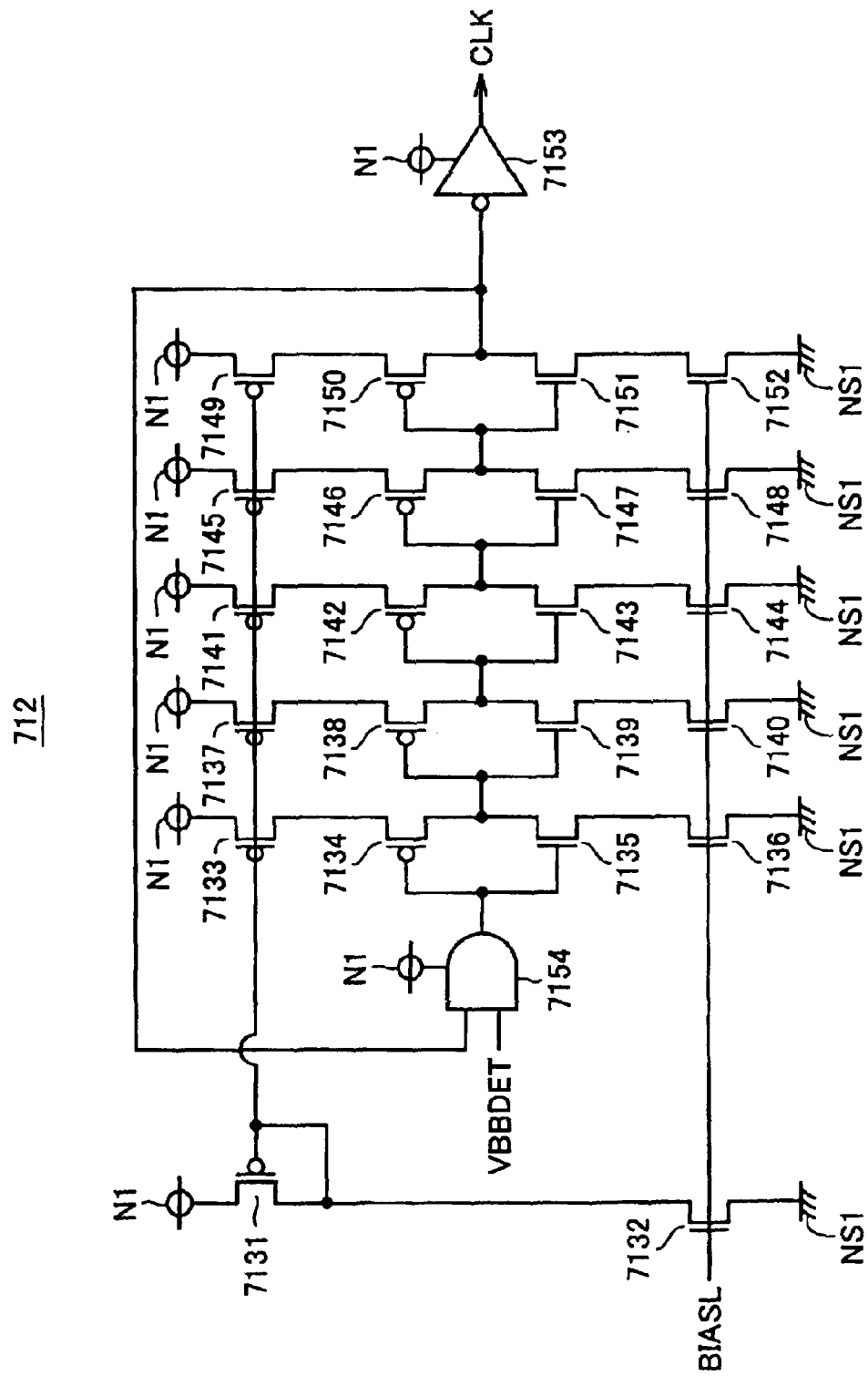
FIG. 4 is a circuit diagram of an oscillator included in the Vbb generating circuit shown in FIG. 2.

Referring to FIG. 4, oscillator 712 includes P-channel MOS transistors 7131, 7133, 7137, 7141, 7145, 7149, 7134, 7138, 7142, 7146 and 7150, N-channel MOS transistors 7132, 7135, 7139, 7143, 7147, 7151, 7136, 7140, 7144, 7148 and 7152, an inverter 7153 and an AND gate 7154.

P- and N-channel MOS transistors 7131 and 7132 are connected in series between node N1 and ground node NS1.

P-channel MOS transistors 7133 and 7134 as well as N-channel MOS transistors 7135 and 7136 are connected in series between node N1 and ground node NS1.

P-channel MOS transistors 7137 and 7138 as well as N-channel MOS transistors 7139 and 7140 are connected in series between node N1 and ground node NS1.

P-channel MOS transistors 7141 and 7142 as well as N-channel MOS transistors 7143 and 7144 are connected in series between node N1 and ground node NS1.

P-channel MOS transistors 7145 and 7146 as well as N-channel MOS transistors 7147 and 7148 are connected in series between node N1 and ground node NS1.

P-channel MOS transistors 7149 and 7150 as well as N-channel MOS transistors 7151 and 7152 are connected in series between node N1 and ground node. NS1.

P-channel MOS transistors 7131, 7133, 7137, 7141, 7145 and 7149 receive on their gate terminals a voltage placed between P- and N-channel MOS transistors 7131 and 7132. N-channel MOS transistors 7132, 7136, 7140, 7144, 7148 and 7152 receive signal BIASL formed of the voltage level of 0.7 V on their gate terminals.

When P-channel MOS transistor 7133 and N-channel MOS transistor 7136 are turned on, P- and N-channel MOS transistors 7134 and 7135 invert the input signal to provide an output signal to the gate terminals of P- and N-channel MOS transistors 7138 and 7139.

When P- and N-channel MOS transistors 7137 and 7140 are turned on, P- and N-channel MOS transistors 7138 and 7139 invert the input signal to provide an output signal to the gate terminals of P- and N-channel MOS transistors 7142 and 7143.

When P- and N-channel MOS transistors 7141 and 7144 are turned on, P- and N-channel MOS transistors 7142 and 7143 invert the input signal to provide an output signal to the gate terminals of P- and N-channel MOS transistors 7146 and 7147.

When P-channel MOS transistor 7145 and N-channel MOS transistor 7148 are turned on, P- and N-channel MOS transistors 7146 and 7147 invert the input signal to provide an output signal to the gate terminals of P- and N-channel MOS transistors 7150 and 7151.

When P- and N-channel MOS transistors 7149 and 7152 are turned on, P- and N-channel MOS transistors 7150 and 7151 invert the input signal to provide an output signal to inverter 7153 and AND gate 7154.

Inverter 7153 is driven by the power supply voltage of 1.5 V received from node N1, and inverts the input signal to issue clock CLK.

AND gate 7154 is driven by the power supply voltage of 1.5 V received from node N1, receives on one of its terminals an output signal of an inverter formed of P- and N-channel MOS transistors 7150 and 7151, and receives signal VBBDET sent from detecting circuit 711 on the other terminal. AND gate 7154 performs logical AND between the two signals, and issues a result of this logical product to the gate terminals of P- and N-channel MOS transistors 7134 and 7135.

As is apparent from the above, oscillator 712 is a ring oscillator including five inverters connected in a ring form.

When AND gate 7154 receives signal VBBDET at L-level, it issues a signal at L-level so that oscillator 712 issues dock CLK at L-level. When AND gate 7154 receives signal VBBDET at H-level, it issues a signal at the same logical level as the output signal of the inverter formed of P- and N-channel MOS transistors 7150 and 7151. Therefore, oscillator 712 issues dock CLK produced by inverting the logical level of the output signal of the inverter formed of P- and N-channel MOS transistors 7150 and 7151.

Accordingly, oscillator 712 issues clock CLK of a variable phase depending on the logical level of signal VBBDET.

Figure 5:
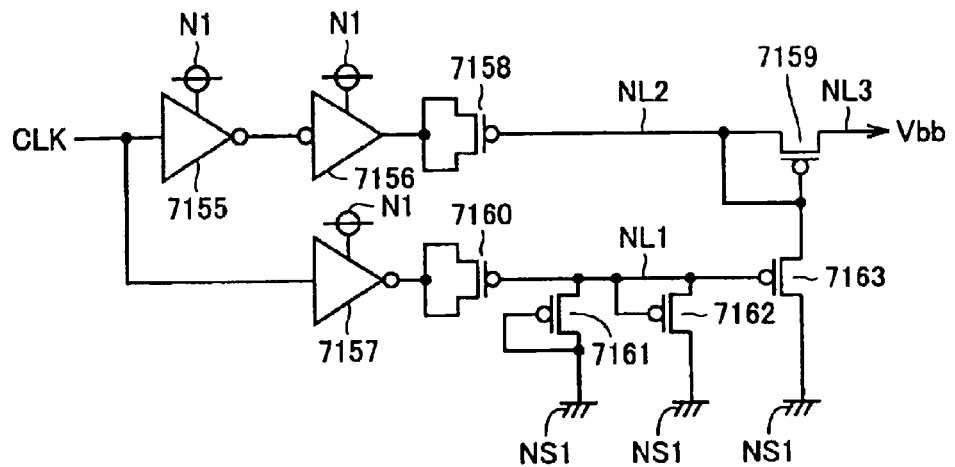
FIG. 5 is a circuit diagram of a pump circuit included in the Vbb generating circuit shown in FIG. 2.

Referring to FIG. 5, pump circuit 713 includes inverters 7155–7157 and P-channel MOS transistors 7158–7163. Inverters 7155–7157 are driven by the power supply voltage of 1.5 V received from node N1. Inverter 7155 receives clock CLK from oscillator 712, and inverts received clock CLK to provide the inverted clock to inverter 7156. Inverter 7156 inverts the output signal of inverter 7155 to provide it to the source and drain terminals of P-channel MOS transistor 7158.

Inverter 7157 receives dock CLK from oscillator 712, and inverts received dock CLK to provide the inverted clock to the source and drain terminals of P-channel MOS transistor 7160.

P-channel MOS transistors 7161 and 7162 are connected in parallel between a node NL1 and ground node NS1. P-channel MOS transistor 7161 receives on its gate terminal the ground voltage (0 V) from ground node NS1. P-channel MOS transistor 7162 receives on its gate terminal the voltage on node NL1.

P-channel MOS transistor 7163 is connected between the gate terminal of P-channel MOS transistor 7159 and ground node NS1. P-channel MOS transistors 7160 and 7163 receive on their gate terminals the voltage on node NL1.

P-channel MOS transistor 7159 is connected between nodes NL2 and NL3. P-channel MOS transistors 7158 and 7159 receive on their gate terminals the voltage on node NL2.

The signal issued from inverter 7156 is an inverted signal of the signal issued from inverter 7157. Therefore, carriers are induced on the gate terminal of P-channel MOS transistor 7158, i.e., on node NL2 in accordance with timing shifted in phase by 180 degrees from timing of the induction of carriers on node NL1.

When inverter 7157 provides the signal at H-level to the source and drain terminals of P-channel MOS transistor 7160, electrons flow from ground node NS1 to node NL1 through P-channel MOS transistor 7161.

Thereby, the potential on node NL1 further lowers, and electrons further flow from ground node NS1 to node NL1 through P-channel MOS transistor 7162. Therefore, the potential on node NL1 lowers in proportion to a period, during which the signal issued from inverter 7157 keeps H-level and thus clock CLK keeps H-level.

Thereby, the channel width of P-channel MOS transistor 7163 increases in accordance with lowering of the potential on node NL1, and the amount of electrons supplied from ground node NS1 to node NL2 increases. In this case, inverter 7156 provides the signal at L-level to the source and drain terminals of P-channel MOS transistor 7158. Therefore, electrons on node NL2 are supplied to node NL3 through P-channel MOS transistor 7159 in the on state. Node NL3 provides negative voltage Vbb of −0.7 V.

When inverter 7157 provides the signal at L-level to the source and drain terminals of P-channel MOS transistor 7160, and inverter 7156 provides the signal at H-level to the source and drain terminals of P-channel MOS transistor 7158, the electrons on node NL1 flow to ground node NS1 through P-channel MOS transistor 7161, and the potential on node NL1 rises.

Thereby, the electrons flowing from ground node NS1 to node NL2 through P-channel MOS transistor 7163 decrease, and the potential on node NL2 rises. Likewise, the electrons flowing from node NL2 to node NL3 through P-channel MOS transistor 7159 decrease, and the potential on node NL3 rises.

Thereafter, when inverter 7157 provides the signal at H-level to the source and drain terminals of P-channel MOS transistor 7160, and inverter 7156 provides the signal at L-level to the source and drain terminals of P-channel MOS transistor 7158, node NL3 provide negative voltage Vbb of −0.7 V, as already described.

As described above, pump circuit 713 provides negative voltage Vbb of −0.7 V while repeating a period for setting the potential on node NL3 to a significantly negative potential and a period for slightly raising the potential on node NL3. The operation of repeating the period for setting the potential on node NL3 to the significantly negative potential and the period for slightly raising the potential on node NL3 corresponds to the pumping.

Referring to FIG. 2 again, reference voltage generating circuit 72 includes current source 720, a current mirror circuit 721 and a voltage generating circuit 722. Current source 720 is driven by the power supply voltage of 1.5 V supplied from node N1. Current source 720 generates a uniform current, and produces signal ICONST and BIASL formed of a uniform voltage based on the uniform current thus generated. Current source 720 provides signal ICONST thus produced to current mirror circuit 721, and also provides signal BIASL to detecting circuit 711 and oscillator 712 of Vbb generating circuit 71, voltage down converter 73 and VPP generating circuit 76.

Current mirror circuit 721 is driven by the power supply voltage of 1.5 V supplied from node N1. Current mirror circuit 721 generates the same uniform current as that generated by current source 720 based on signal ICONST, and provides the voltage, which is produced based on the uniform current thus generated, to voltage generating circuit 722.

Voltage generating circuit 722 is driven by the power supply voltage of 1.5 V supplied from node N1. Voltage generating circuit 722 generates reference voltage VrefS based on the voltage supplied from current mirror circuit 721, and provides reference voltage VrefS thus generated to voltage down converter 73 and VPP generating circuit 76.

Figure 6:
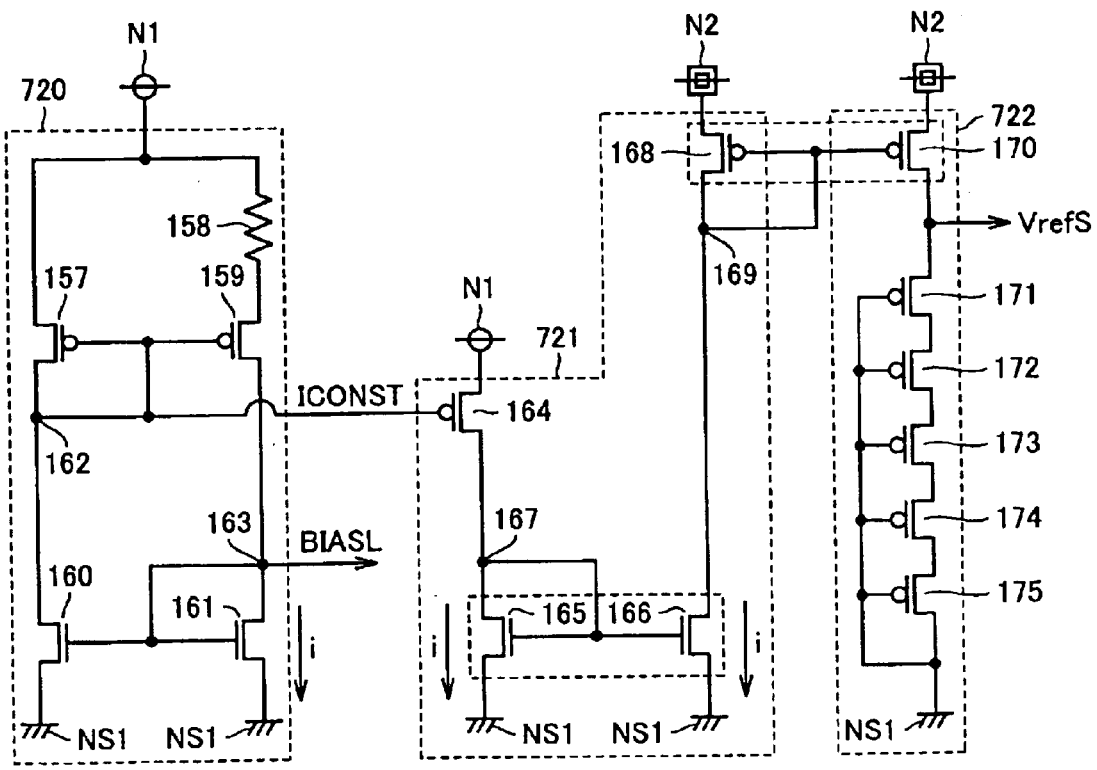
FIG. 6 is a circuit diagram of a reference voltage generating circuit shown in FIG. 2.

Referring to FIG. 6, current source 720 includes P-channel MOS transistors 157 and 159, a resistance 158 and N-channel MOS transistors 160 and 161. Current mirror circuit 721 includes P-channel MOS transistors 164 and 168 as well as N-channel MOS transistors 165 and 166. Voltage generating circuit 722 includes P-channel MOS transistors 170–175.

P-channel MOS transistors 157, 159, 164 and 171–175 as well as N-channel MOS transistors 160 and 161 are thin film MOS transistors, and N-channel MOS transistors 165 and 166 as well as P-channel MOS transistors 168 and 170 are thick film MOS transistors each having a thick gate oxide film.

In this invention, the thick film MOS transistor having a thick gate oxide film is an MOS transistor having a gate oxide film thickness suitable to the power supply voltage of 3.3 V.

P- and N-channel MOS transistors 157 and 160 are connected in series between node N1 and ground node NS1. Resistance 158, P-channel MOS transistor 159 and N-channel MOS transistor 161 are connected in series between node N1 and ground node NS1.

P- and N-channel MOS transistors 157 and 160 are connected in parallel to resistance 158 and P- and N-channel MOS transistors 159 and 161.

The size of P-channel MOS transistor 159 is larger than that of P-channel MOS transistor 157. Therefore, the voltage drop in P-channel MOS transistor 159 is smaller than that in P-channel MOS transistor 157.

The resistance value of resistance 158 is determined such that the voltage drop in resistance 158 and P-channel MOS transistor 159 is equal to the voltage drop in P-channel MOS transistor 157.

P-channel MOS transistors 157 and 159 receive on their gate terminals the voltage on a node 162.

N-channel MOS transistor 160 has the same size as N-channel MOS transistor 161. N-channel MOS transistors 160 and 161 receive on their gate terminals the voltage on a node 163.

The voltage drop in resistance 158 and P-channel MOS transistor 159 is equal to the voltage drop in P-channel MOS transistor 157, and N-channel MOS transistors 160 and 161 have the same size, and receive the same voltage on their gate terminals. Therefore, the current flowing from node N1 to ground node NS1 through P- and N-channel MOS transistors 157 and 160 is equal to a current i flowing from node N1 to ground node NS1 through P- and N-channel MOS transistors 159 and 161.

Current source 720 provides signal ICONST formed of the voltage on node 162 to current mirror circuit 721, and also provides signal BIASL formed of the voltage on node 163 to detecting circuit 711 of Vbb generating circuit 71, oscillator 712, voltage down converter 73 and VPP generating circuit 76.

In this case, the voltage forming signal ICONST is lower than a power supply voltage VddL (1.5 V) supplied to node N1 by a threshold voltage Vth of P-channel MOS transistor 157, and thus is equal to (VddL−Vth). This voltage of (VddL−Vth) corresponds to the maximum drain voltage in a linear operation region, where the drain current of the MOS transistor is invariable with respect to increase in drain voltage.

The voltage forming signal BIASL corresponds to the minimum drain voltage in the linear operation region of the MOS transistor.

As described above, current source 720 generates uniform current i, and produces signal ICONST and BIASL formed of the voltages produced based on uniform current i thus produced. Current source 720 provides signal ICONST thus produced to current mirror circuit 721, and provides signal BIASL thus produced to detecting circuit 711 of Vbb generating circuit 71, oscillator 712, voltage down converter 73 and VPP generating circuit 76.

P- and N-channel MOS transistors 164 and 165 are connected in series between node N1 and ground node NS1. P- and N-channel MOS transistors 168 and 166 are connected in series between node N2 and ground node NS1.

Node N2 is supplied with the power supply voltage of 3.3 V. P-channel MOS transistor 164 receives, on its gate terminal, signal ICONST formed of the same voltage as the voltage applied to the gate terminals of P-channel MOS transistors 157 and 159. P-channel MOS transistor 164 has the same size as P-channel MOS transistor 157. Therefore, the current flowing from node N1 to ground node NS1 through P- and N-channel MOS transistors 164 and 165 is equal to current i generated in current source 720.

N-channel MOS transistors 165 and 166 have the same size, and receive on their gate terminals the voltage on node 167. Therefore, the current flowing from node N2 to ground node NS1 through P- and N-channel MOS transistors 168 and 166 is equal to current i flowing from node N1 to ground node NS1 through P- and n-channel MOS transistors 164 and 165.

As described above, current mirror circuit 721 transfers current i, which flows from node N1 through P- and N-channel MOS transistors 164 and 165 to ground node NS1, to a circuit formed of node N2, P- and N-channel MOS transistors 168 and 166, and ground node NS1. Current mirror circuit 721 uses N-channel MOS transistors 165 and 166, i.e., thick film MOS transistors for performing this transfer of current i.

Current mirror circuit 721 provides the voltage, which is produced on node 169 by the flowing of current i from node N2 to ground node NS1 through P- and N-channel MOS transistors 168 and 166, to the gate terminal of P-channel MOS transistor 170.

P-channel MOS transistors 170–175 are connected in series between node N2 and ground node NS1. Each of P-channel MOS transistors 171–175 receives on its gate terminal the ground voltage of 0 V carried on ground node NS1.

P-channel MOS transistors 168 and 170 receive on their gate terminals the voltage carried on node 169. Therefore, the current flowing through P-channel MOS transistor 170 is equal to current i flowing through P-channel MOS transistor 168.

Thereby, reference voltage VrefS is represented as (VrefS=iRc+Vth3) where Rc represents a whole channel resistance of P-channel MOS transistors 171–175, and Vth3 represents a whole threshold voltage of P-channel MOS transistors 171–175.

Accordingly, if the number of P-channel MOS transistors 171–175 changes, the channel resistance Rc and threshold voltage Vth3 change, and the voltage level of reference voltage VrefS changes.

In voltage generating circuit 722, the number of P-channel MOS transistors 171–175 connected in series is determined by selectively blowing fuses to provide reference voltage VrefS equal to 1.5 V.

As described above, voltage generating circuit 722 generates reference voltage VrefS of 1.5 V by lowering the power supply voltage of 3.3 V, and provides reference voltage VrefS thus generated to voltage down converter 73 and VPP generating circuit 76.

The first embodiment has such a distinctive feature that N- and P-channel MOS transistors 165, 166 and 168 of current mirror circuit 721 as well as P-channel MOS transistor 170 of voltage generating circuit 722 are formed of thick film MOS transistors, respectively.

N-channel MOS transistors 165 and 166 are formed of the thick film MOS transistors for the following reasons. Since the power supply voltage of 3.3 V is applied to P-channel MOS transistor 168, N-channel MOS transistor 166 receives a voltage of 2.5 V obtained by subtracting the threshold voltage (0.8 V) of P-channel MOS transistor 168 from the power supply voltage of 3.3 V.

Therefore, if N-channel MOS transistor 166 were formed of a thin film MOS transistor, the reliability of N-channel MOS transistor 166 would lower due to the voltage of 2.5 V applied across the source and drain terminals of N-channel MOS transistor 166.

Since N-channel MOS transistor 166 is formed of the thick film MOS transistor, N-channel MOS transistor 165 must be similarly formed of the thick film MOS transistor in view of the required operations of N-channel MOS transistors 165 and 166 for transferring uniform current i.

Referring to FIG. 2 again, voltage down converter 73 includes a control circuit 731, a level converter 732, differential amplifier circuits 733 and 736, N-channel MOS transistors 734 and 737, and P-channel MOS transistors 735 and 738.

Level converter 732 and differential amplifier circuits 733 and 736 are formed of thick film MOS transistors, and N-channel MOS transistors 734 and 737 as well as P-channel MOS transistors 735 and 738 are thick film MOS transistors, respectively.

Control circuit 731 is driven by the power supply voltage of 1.5 V supplied from node N1. Control circuit 731 receives test mode signal TM or sense amplifier enable signal SAE, and provides received test mode signal TM or sense amplifier enable signal SAE to level converter 732.

More specifically, during the test mode of semiconductor memory device 100, control circuit 731 receives test mode signal TM at H- or L-level depending on contents of the intended test, and provides received test mode signal TM at H- or L-level to level converter 732.

In the normal operation of semiconductor memory device 100, control circuit 731 receives sense amplifier enable signal SAE at H-level, and provides received sense amplifier enable signal SAE at H-level to level converter 732.

During standby of semiconductor memory device 100, control circuit 731 receives sense amplifier enable signal SAE at L-level, and provides received sense amplifier enable signal SAE at L-level to level converter 732.

Level converter 732 receives the power supply voltage of 1.5 V from node N1, and also receives the power supply voltage of 3.3 V from node N2. Level converter 732 converts the voltage level, which forms test mode signal TM at H-level or sense amplifier enable signal SAE at H-level received from control circuit 731, from 1.5 V to 3.3 V, and provides test mode signal TM or sense amplifier enable signal SAE at H-level thus converted to the gate terminal of N-channel MOS transistor 734.

When level converter 732 receives test mode signal TM at L-level or sense amplifier enable signal SAE at L-level from control circuit 731, it does not convert the voltage level forming the received signal, and provides test mode signal TM at L-level or sense amplifier enable signal SAE at L-level to the gate terminal of N-channel MOS transistor 734.

Differential amplifier circuit 733 and N-channel MOS transistor 734 are connected in series between node N2 and ground node NS1. Differential amplifier circuit 733 is driven by the power supply voltage of 3.3 V. Differential amplifier circuit 733 is activated when N-channel MOS transistor 734 is turned on, and is deactivated when N-channel MOS transistor 734 is turned off.

Differential amplifier circuit 733 receives reference voltage VrefS from reference voltage generating circuit 72 on its noninverting input terminal, and receives array voltage VccS carried on output node NOUT on its inverting input terminal. When differential amplifier circuit 733 is active, it differentially amplifies array voltage VccS so that array voltage VccS attains the voltage level of reference voltage VrefS, and provides the amplified voltage of 1.5 V to the gate terminal of P-channel MOS transistor 735. When differential amplifier circuit 733 is inactive, it provides a voltage, which is dose to the power supply voltage of 3.3 V received from node N2, to the gate terminal of P-channel MOS transistor 735.

P-channel MOS transistor 735 is connected between node N2 and output node NOUT. P-channel MOS transistor 735 supplies carriers from node N2 to output node NOUT in accordance with the voltage received from differential amplifier circuit 733.

N-channel MOS transistor 734 receives, on its gate terminal, test mode signal TM or sense amplifier enable signal SAE from level converter 732.

Differential amplifier circuit 736 and N-channel MOS transistor 737 are connected in series between node N2 and ground node NS1. Differential amplifier circuit 736 is driven by the power supply voltage of 3.3 V supplied from node N2. Differential amplifier circuit 736 is active when N-channel MOS transistor 737 is on, and is inactive when N-channel MOS transistor 737 is off.

Differential amplifier circuit 736 receives reference voltage VrefS from reference voltage generating circuit 72 on its noninverting input terminal, and receives array voltage VccS carried on output node NOUT on its inverting input terminal. N-channel MOS transistor 737 receives signal BIASL from current source 720 of reference voltage generating circuit 72 on its gate terminal.

When differential amplifier circuit 736 is active, it differentially amplifies array voltage VccS so that array voltage VccS may attain the voltage level of reference voltage VreS, and provides the amplified voltage to the gate terminal of P-channel MOS transistor 738.

P-channel MOS transistor 738 is connected between node N2 and output node NOUT. P-channel MOS transistor 738 supplies carriers from node N2 to output node NOUT in accordance with the voltage received from differential amplifier circuit 736.

N-channel MOS transistor 737 receives signal BIASL sent from current source 720 of reference voltage generating circuit 72 on its gate terminal.

When N-channel MOS transistor 734 receives test mode signal TM at H-level or sense amplifier enable signal SAE at H-level on its gate terminal, differential amplifier circuit 733 is activated to amplify differentially array voltage VccS so that array voltage VccS may attain the voltage level of reference voltage VrefS, and to provide the voltage of 1.5 V thus amplified to the gate terminal of P-channel MOS transistor 735. P-channel MOS transistor 735 supplies carriers from node N2 to output node NOUT in accordance with the voltage of 1.5 V received from differential amplifier circuit 73, and thereby sets array voltage VccS on output node NOUT to 1.5 V. When differential amplifier circuit 733 is inactive, P-channel MOS transistor 735 receives on its gate terminal the voltage close to 3.3 V so that it is substantially or nearly turned off, and the voltage level of array voltage VccS on output node NOUT lowers.

When N-channel MOS transistor 737 receives the signal at H-level on its gate terminal, differential amplifier circuit 736 and P-channel MOS transistor 738 perform the same operations as differential amplifier circuit 733 and P-channel MOS transistor 735, respectively, so that array voltage VccS on output node NOUT is set to 1.5 V. When N-channel MOS transistor 737 receives signal BIASL at L-level to deactivate differential amplifier circuit 736, the voltage level of array voltage VccS on output node NOUT lowers similarly to the case where differential amplifier circuit 733 is deactivated.

During standby of semiconductor memory device 100, N-channel MOS transistor 734 receives sense amplifier enable signal SAE at L-level on its gate terminal, and N-channel MOS transistor 737 receives signal BIASL formed of the voltage level of 0.7 V on its gate terminal. As a result, differential amplifier circuit 733 is deactivated, and differential amplifier circuit 736 is activated.

Thereby, differential amplifier circuit 736 differentially amplifies array voltage VccS on output node NOUT so that array voltage VccS may attain the voltage level of reference voltage VrefS, and provides the amplified voltage to the gate terminal of P-channel MOS transistor 738. P-channel MOS transistor 738 supplies carriers from node N2 to output node NOUT in accordance with the voltage received from differential amplifier circuit 736.

During standby of semiconductor memory device 100, therefore, differential amplifier circuit 736 and P- and N-channel MOS transistors 738 and 737 lower the power supply voltage of 3.3 V to generate array voltage VccS of 1.5 V. In this case, N-channel MOS transistor 737 receives signal BIASL formed of the voltage level of 0.7 V on its gate terminal, and therefore has a smaller channel width than N-channel MOS transistor 734, which receives test mode signal TM or sense amplifier enable signal SAE formed of the voltage of 3.3 V. Therefore, the current flowing in differential amplifier circuit 736 is smaller than the current, which flows in differential amplifier circuit 733 during the normal operation, and differential amplifier circuit 736 provides a voltage, which is at a higher level than that during the normal operation, to the gate terminal of P-channel MOS transistor 738. Thereby, P-channel MOS transistor 738 supplies carriers smaller in amount than those during the normal operation from node N2 to output node NOUT so that array voltage VccS attains the voltage level of 1.5 V more slowly than that in the normal operation.

In the normal operation of semiconductor memory device 100, N-channel MOS transistor 734 receives sense amplifier enable signal SAE at H-level on its gate terminal, and N-channel MOS transistor 737 receives signal BIASL formed of the voltage level of 0.7 V on its gate terminal. As a result, differential amplifier circuits 733 and 736 are activated. In this case, since sense amplifier enable signal SAE at H-level is formed of the voltage level of 3.3 V, N-channel MOS transistor 734 has a larger channel width than that of N-channel MOS transistor 737. Thereby, the current flowing in differential amplifier circuit 733 is larger than the current flowing in differential amplifier circuit 736, and differential amplifier circuit 733 provides a voltage lower than that of differential amplifier circuit 736 to P-channel MOS transistor 735. Consequently, P-channel MOS transistor 735 supplies more carriers than P-channel MOS transistor 738 from node N2 to output node NOUT.

Accordingly, in the normal operation of semiconductor memory device 100, differential amplifier circuit 733 as well as P- and N-channel MOS transistors 735 and 734 set the voltage level of array voltage VccS to 1.5 V more rapidly than differential amplifier circuit 736 as well as P- and N-channel MOS transistors 738 and 737.

In the normal operation of semiconductor memory device 100, as described above, differential amplifier circuit 733 as well as P- and N-channel MOS transistors 735 and 734 lower the power supply voltage of 3.3 V to set array voltage VccS rapidly to the voltage level of 1.5 V. During standby of semiconductor memory device 100, differential amplifier circuit 736 as well as P- and N-channel MOS transistors 738 and 737 lower the power supply voltage of 3.3 V to set array voltage VccS slowly to the voltage level of 1.5 V.

The number of circuits each formed of differential amplifier circuit 733 and P- and N-channel MOS transistors 735 and 734 as well as the number of circuits each formed of differential amplifier circuit 736 and P- and N-channel MOS transistors 738 and 737 are variable depending on the number of blocks forming memory cell arrays 10 and 20.

As already described, voltage down converter 73 is driven by the power supply voltage of 3.3 V. In the normal operation of semiconductor memory device 100, voltage down converter 73 lowers the power supply voltage of 3.3 V to supply rapidly array voltage VccS of 1.5 V to output node NOUT. During standby of semiconductor memory device 100, voltage down converter 73 lowers the power supply voltage of 3.3 V to supply slowly array voltage VccS of 1.5 V to output node NOUT.

Figure 7:
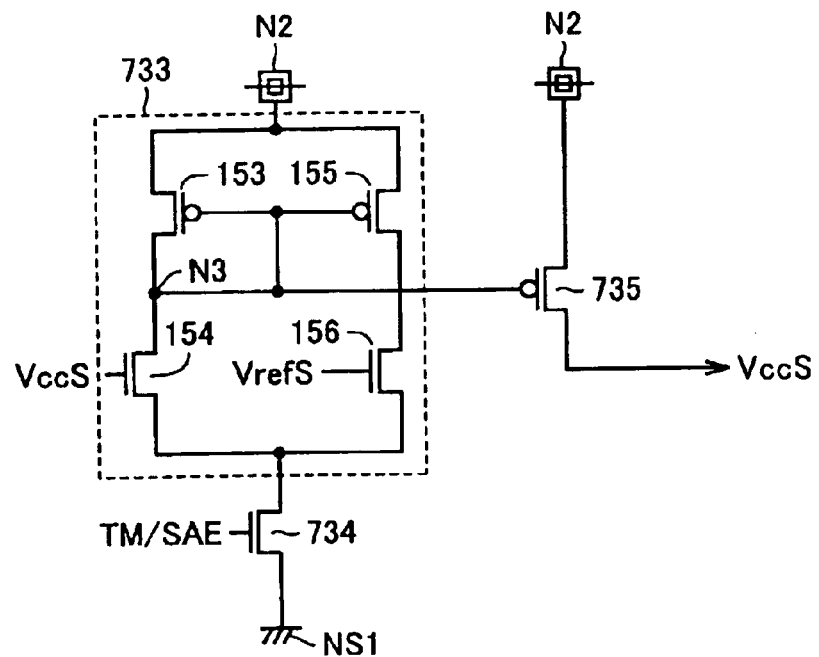
FIG. 7 is a circuit diagram of a differential amplifier circuit included in a voltage down converter shown in FIG. 2.

Referring to FIG. 7, differential amplifier circuit 733 includes P-channel MOS transistors 153 and 155 as well as N-channel MOS transistors 154 and 156. P-channel MOS transistors 153 and 155 as well as N-channel MOS transistors 154 and 156 are thick film MOS transistors, respectively.

P- and N-channel MOS transistors 153 and 154 are connected in series between node N2 and N-channel MOS transistor 734. P- and N-channel MOS transistors 155 and 156 are connected in series between node N2 and N-channel MOS transistor 734.

P- and N-channel MOS transistors 153 and 154 are connected in parallel to P- and N-channel MOS transistors 155 and 156.

P-channel MOS transistors 153 and 155 receive on their gate terminals the voltage carried on node N3. N-channel MOS transistor 154 receives, on its gate terminal, array voltage VccS carried on output node NOUT. N-channel MOS transistor 156 receives reference voltage VrefS from reference voltage generating circuit 72 on its gate terminal.

Differential amplifier circuit 733 differentially amplifies array voltage VccS to attain the voltage level of reference voltage VrefS, and provides the amplified voltage from node N3 to the gate terminal of P-channel MOS transistor 735.

Differential amplifier circuit 736 has the same circuit structure as differential amplifier circuit 733.

Figure 8:
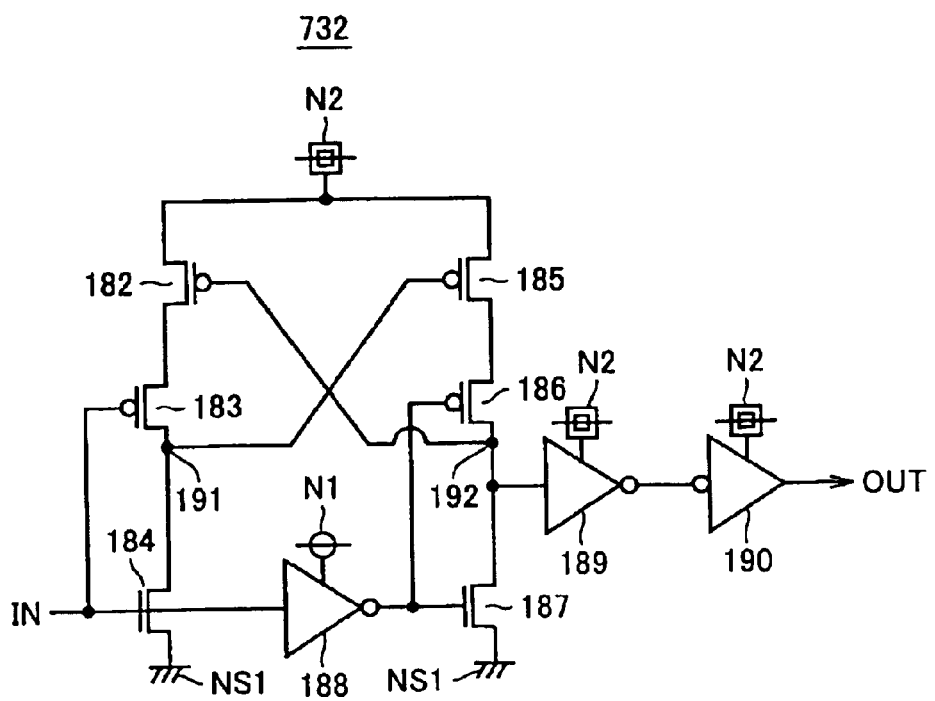
FIG. 8 is a circuit diagram of a level converter included in a voltage down converter shown in FIG. 2.

Referring to FIG. 8, level converter 732 includes P-channel MOS transistors 182, 183, 185 and 186, N-channel MOS transistors 184 and 187, and inverters 188–190.

P-channel MOS transistors 182, 183, 185 and 186, N-channel MOS transistors 184 and 187, and MOS transistors forming inverters 189 and 190 are thick film MOS transistors, respectively. MOS transistors forming inverter 188 are thin film MOS transistors.

P-channel MOS transistors 182 and 183 as well as N-channel MOS transistor 184 are connected in series between node N2 and ground node NS1. P-channel MOS transistors 185 and 186 as well as N-channel MOS transistor 187 are connected in series between node N2 and ground node NS1.

P- and N-channel MOS transistors 182, 183 and 184 are connected in parallel to P- and N-channel MOS transistors 185, 186 and 187.

Inverter 188 is connected between the gate terminal of N-channel MOS transistor 184 and the gate terminals of P- and N-channel MOS transistors 186 and 187. Inverter 188 inverts the logical level of the signal applied to the gate terminal of N-channel MOS transistor 184, and provides the inverted signal to the gate terminals of P- and N-channel MOS transistors 186 and 187. Inverter 188 is driven by the power supply voltage of 1.5 V supplied from node N1.

Inverter 189 inverts the logical level of the signal sent from node 192, and provides the inverted signal to inverter 190, which inverts the signal provided from inverter 189. Inverters 189 and 190 are driven by the power supply voltage of 3.3 V supplied from node N2.

P-channel MOS transistor 182 receives on its gate terminal the voltage carried on node 192. P- and N-channel MOS transistors 183 and 184 receive on their gate terminals the voltage forming input signal IN of level converter 732.

P-channel MOS transistor 185 receives on its gate terminal the voltage carried on node 191. P- and N-channel MOS transistors 186 and 187 receive on their gate terminals the voltage forming the output signal of inverter 188.

Input signal IN supplied to level converter 732 is test mode signal TM at H- or L-level, or is sense amplifier enable signal SAE at H- or L-level. Each of test mode signal TM and sense amplifier enable signal SAE at H-level is formed of a voltage of 1.5 V, and each of test mode signal TM and sense amplifier enable signal SAE at L-level is formed of a voltage of 0 V.

When input signal IN at H-level is supplied to level converter 732, N-channel MOS transistor 184 is turned on by receiving on its gate terminal the voltage of 1.5 V forming input signal IN at H-level so that the ground voltage of 0 V is placed on node 191. Thereby, P-channel MOS transistor 185 is turned on by receiving the ground voltage on node 191. P-channel MOS transistor 183 is turned off by receiving on its gate terminal the voltage of 1.5 V forming input signal IN at H-level.

Inverter 188 inverts input signal IN at H-level to provide a signal at L-level formed of the ground voltage to the gate terminals of P- and N-channel MOS transistors 186 and 187. P-channel MOS transistor 186 is turned on, and N-channel MOS transistor 187 is turned off.

Thereby, the voltage on node 192 attains 3.3 V, and P-channel MOS transistor 182 is turned off. Inverter 189 inverts the signal at H-level formed of the voltage of 3.3 V to provide a signal at L-level formed of the ground voltage (0 V), and inverter 190 inverts the signal at L-level formed of the ground voltage to provide an output signal OUT at H-level formed of the voltage of 3.3 V.

As described above, level converter 732 converts the signal at H-level formed of the voltage of 1.5 V to the signal at H-level formed of the voltage of 3.3 V.

When level converter 732 receives input signal IN at L-level formed of the ground voltage, P-channel MOS transistor 183 is turned on, and N-channel MOS transistor 184 is turned off. Inverter 188 converts input signal IN at L-level formed of the ground voltage to the signal at H-level formed of the voltage of 1.5 V, and provides the converted signal to the gate terminals of P- and N-channel MOS transistors 186 and 187.

Thereby, P-channel MOS transistor 186 is turned off, and N-channel MOS transistor 187 is turned on. The voltage on node 192 attains the ground voltage (0 V) so that P-channel MOS transistor 182 is turned on, and the voltage on node 191 attains 3.3 V. Thereby, P-channel MOS transistor 185 is turned off.

Inverter 189 inverts the signal at L-level formed of the ground voltage on node 192 to provide the signal at H-level formed of the voltage of 3.3 V. Inverter 190 inverts the signal at H-level formed of the voltage of 3.3 V to provide output signal OUT at L-level formed of the ground voltage.

As described above, level converter 732 does not change the voltage level of the received signal at L-level formed of the ground voltage, and provides the signal at L-level formed of the ground voltage.

Referring to FIG. 2 again, Vcc/2 generating circuit 74 is driven by the power supply voltage of 1.5 V received from node N1. Vcc/2 generating circuit 74 receives array voltage VccS on output node NOUT, and halves array voltage VccS to generate precharge voltage VBL. Vcc/2 generating circuit 75 is driven by the power supply voltage of 1.5 V received from node N1. Vcc/2 generating circuit 75 receives array voltage VccS on output node NOUT, and halves array voltage VccS to generate cell plate voltage VCP.

Figure 9:
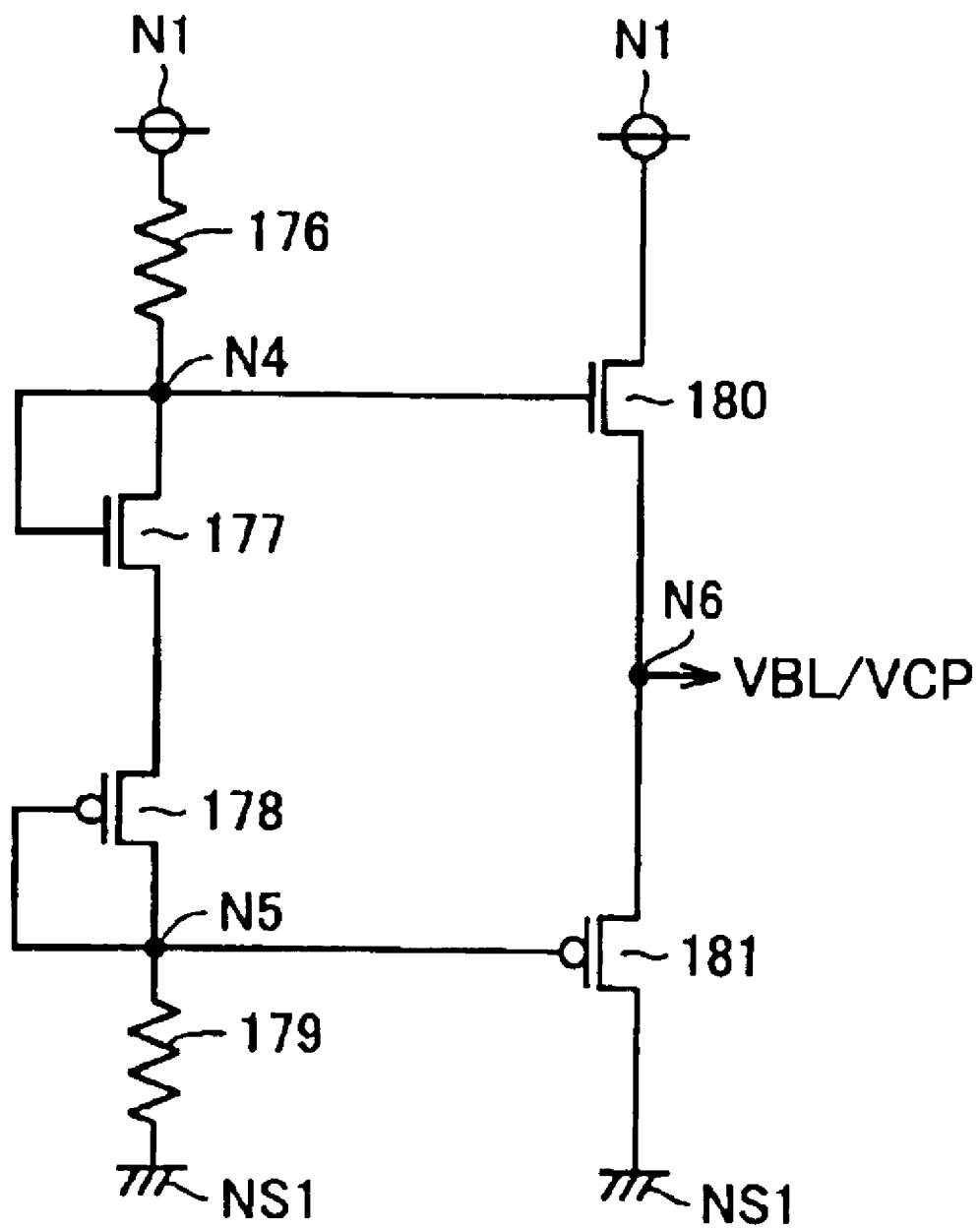
FIG. 9 is a circuit diagram of a Vcc/2 generating circuit shown in FIG. 2.

Referring to FIG. 9, Vcc/2 generating circuits 74 and 75 include resistances 176 and 179, N-channel MOS transistors 177 and 180, and P-channel MOS transistors 178 and 181.

N-channel MOS transistors 177 and 180 as well as P-channel MOS transistors 178 and 181 are thin film MOS transistors, respectively.

Resistance 176, N-channel MOS transistor 177, P-channel MOS transistor 178 and resistance 179 are connected in series between node N1 and ground node NS1. N- and P-channel MOS transistors 180 and 181 are connected in series between node N1 and ground node NS1.

Resistance 176, N-channel MOS transistor 177, P-channel MOS transistor 178 and resistance 179 are connected in parallel to N- and P-channel MOS transistors 180 and 181.

N-channel MOS transistors 177 and 180 receive on their gate terminals a voltage carried on a node N4. N-channel MOS transistor 177 is diode-connected. P-channel MOS transistors 178 and 181 receive on their gate terminals a voltage carried on a node N5. P-channel MOS transistor 178 is diode-connected.

Node N1 is supplied with array voltage VccS formed of the voltage of 1.5 V provided from voltage down converter 73. Resistance values of resistances 176 and 179 are determined such that a voltage of 0.75 V may be placed between N- and P-channel MOS transistors 177 and 178.

The voltage on node N4 is equal to a sum of 0.75 V and a threshold voltage Vth4 of N-channel MOS transistor 177, and thus is equal to (0.75+Vth4) V. The voltage on node N5 is equal to a difference of 0.75 V and threshold voltage Vth4 of N-channel MOS transistor 178, and thus is equal to (0.75−Vth4) V.

Voltage drop of 0.75V occurs in N- and P-channel MOS transistors 180 and 181, and each of Vcc/2 generating circuits 74 and 75 provides precharge voltage VBL of 0.75 V or cell plate voltage VCP of 0.75 V.

Referring to FIG. 2 again, VPP generating circuit 76 includes a control circuit 761, a dividing circuit 762, detecting circuits 763 and 764, an oscillator 765, a level converter 766 and a pump circuit 767.

Control circuit 761 is driven by the power supply voltage of 1.5 V supplied from node N1, and receives test mode signal TM or row address strobe signal RAS. Control circuit 761 provides the received test mode signal TM to detecting circuits 763 and 764, and provides received row address strobe signal RAS to detecting circuit 763.

More specifically, in the test mode of semiconductor memory device 100, control circuit 761 receives test mode signal TM at H- or L-level corresponding to contents of the test, and provides received test mode signal TM at H- or L-level to detecting circuits 763 and 764.

More specifically, in the normal operation of semiconductor memory device 100, control circuit 761 receives row address strobe signal RAS at H-level, and provides received row address strobe signal RAS at H-level to detecting circuit 763.

Further, during standby of semiconductor memory device 100, control circuit 761 receives row address strobe signal RAS at L-level, and provides received row address strobe signal RAS at L-level to detecting circuit 763.

Dividing circuit 762 halves boosted voltage VPP, and provides a divided voltage VPDIV thus halved to detecting circuits 763 and 764.

Detecting circuit 763 is driven by the power supply voltage of 1.5 V supplied from node N1. Detecting circuit 763 is activated by row address strobe signal RAS at H-level received from control circuit 761, and differentially amplifies divided voltage VPDIV such that divided voltage VPDIV received from dividing circuit 762 may be equal to reference voltage VrefS received from reference voltage generating circuit 72. Thus, detecting circuit 763 detects divided voltage VPDIV, and provides divided voltage VPDIV thus detected to oscillator 765.

Detecting circuit 764 is driven by the power supply voltage of 1.5 V supplied from node N1. Detecting circuit 764 is activated by signal BIASL sent from current source 720 of reference voltage generating circuit 72, and differentially amplifies divided voltage VPDIV received from dividing circuit 762 such that divided voltage VPDIV may become equal to reference voltage VrefS received from reference voltage generating circuit 72. Thus, detecting circuit 764 detects divided voltage VPDIV, and provides divided voltage VPDIV thus detected to oscillator 765.

Row address strobe signal RAS at H-level is formed of the voltage level of 1.5 V, and signal BIASL is formed of the voltage level of 0.7 V. Therefore, detecting circuit 763 detects divided voltage VPDIV more rapidly than detecting circuit 764, and provides it to oscillator 765.

Thereby, in the normal operation of semiconductor memory device 100, detecting circuit 763 receives row address strobe signal RAS at H-level, and detecting circuit 764 receives signal BIASL so that detecting circuit 763 detects divided voltage VPDIV more rapidly than detecting circuit 764, and provides it to oscillator 765. During standby of semiconductor memory device 100, detecting circuit 763 receives row address strobe signal RAS at L-level, and detecting circuit 764 receives signal BIASL formed of a voltage of 0.7 V. Detecting circuit 763 is deactivated, and detecting circuit 764 detects divided voltage VPDIV more slowly than the case in the normal operation, and provides it to oscillator 765. In the normal operation, therefore, detecting circuit 763 detects divided voltage VPDIV. During standby, detecting circuit 764 detects divided voltage VPDIV.

Oscillator 765 is driven by the power supply voltage of 1.5 V supplied from node N1. Oscillator 765 generates clock CLK having a phase, which corresponds to the voltage level of divided voltage VPDIV received from detecting circuit 763 or 764, and provides clock CLK thus generated to level converter 766.

Level converter 766 receives the power supply voltage of 1.5 V from node N1, and also receives the power supply voltage of 3.3 V from node N2. Level converter 766 converts the voltage, which forms the H-level of clock CLK received from oscillator 765, from 1.5 V to 3.3 V, and provides converted clock CLK to pump circuit 767.

Pump circuit 767 is driven by the power supply voltage of 3.3 V supplied from node N2. Pump circuit 767 pumps carriers to generate boosted voltage VPP in synchronization with clock CLK received from level converter 766. The number of pump circuits 767 are variable depending on the number of blocks forming memory cell arrays 10 and 20.

As described above, VPP generating circuit 76 is driven by the power supply voltage of 1.5 V and the power supply voltage of 3.3 V, and generates boosted voltage VPP by boosting the power supply voltage of 3.3 V.

Figure 10:
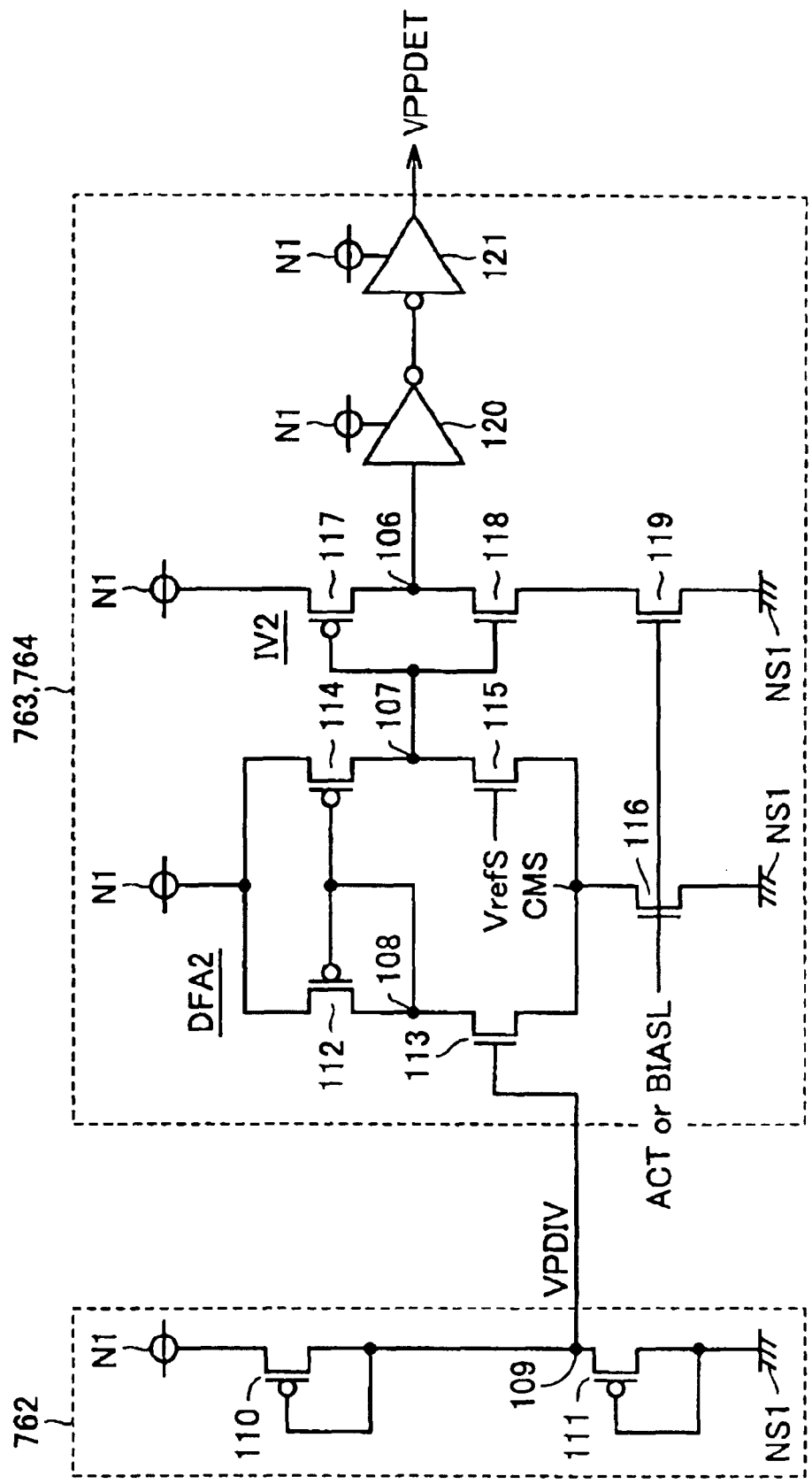
FIG. 10 is a circuit diagram showing a dividing circuit and a detecting circuit included in a VPP generating circuit shown in FIG. 2.

Referring to FIG. 10, dividing circuit 762 includes P-channel MOS transistors 110 and 111. P-channel MOS transistors 110 and 111 are connected in series between node N1 and ground node NS1. P-channel MOS transistor 110 has a size equal to that of P-channel MOS transistor 111. P-channel MOS transistor 110 receives on its gate terminal the voltage carried on node 109, and P-channel MOS transistor 111 receives on its gate terminal the ground voltage carried on ground node NS1. Node N1 is supplied with boosted voltage VPP of 3.3 V.

P-channel MOS transistors 110 and 111 function as resistances of the same resistance value, and the voltage of 1.65 V is placed on node 109 by halving boosted voltage VPP of 3.3 V.

Accordingly, dividing circuit 762 provides divided voltage VPDIV of 1.65 V prepared by halving boosted voltage VPP of 3.3 V from node 109.

Detecting circuits 763 and 764 include P-channel MOS transistors 112, 114 and 117, N-channel MOS transistors 113, 115, 116, 118 and 119, and inverters 120 and 121.

P-channel MOS transistors 112, 114 and 117 as well as N-channel MOS transistors 113, 115, 116, 118 and 119 are thin film MOS transistors, respectively. Inverters 120 and 121 are formed of thin film MOS transistors.

P- and N-channel MOS transistors 112 and 113 are connected in series between node N1 and a common source CMS. P- and N-channel MOS transistors 114 and 115 are connected in series between node N1 and common source CMS.

P- and N-channel MOS transistors 112 and 113 are connected in parallel to P- and N-channel MOS transistors 114 and 115.

P-channel MOS transistors 112 and 114 receive on their gate terminals the voltage carried on node 108. N-channel MOS transistor 113 receives divided voltage VPDIV provided from dividing circuit 762 on its gate terminal. N-channel MOS transistor 115 receives reference voltage VrefS provided from reference voltage generating circuit 762 on its gate terminal.

N-channel MOS transistor 116 is connected between common source CMS and ground node NS1. In detecting circuit 763, N-channel MOS transistor 116 receives row address strobe signal RAS as a signal ACT on its gate terminal. In detecting circuit 764, N-channel MOS transistor 116 receives signal BIASL sent from reference voltage generating circuit 72 on its gate terminal.

P- and N-channel MOS transistors 117, 118 and 119 are connected in series between node N1 and ground node NS1. P- and N-channel MOS transistors 117 and 118 receive on their gate terminals the voltage carried on node 107. In detecting circuit 763, N-channel MOS transistor 119 receives row address strobe signal RAS as signal ACT on its gate terminal. In detecting circuit 764 N-channel MOS transistor 119 receives signal BIASL from reference voltage generating circuit 72 on its gate terminal.

Inverter 120 inverts the signal on node 106, and inverter 121 inverts the output signal of inverter 120 to provide a detection signal VPPDET. Inverters 120 and 121 are driven by the power supply voltage of 1.5 V supplied from node N1.

A differential amplifier circuit DFA2, which is formed of P-channel MOS transistors 112 and 114 as well as N-channel MOS transistors 113, 115 and 116, is activated to compare divided voltage VPDIV with reference voltage VrefS when N-channel MOS transistor 116 receives row address strobe signal RAS (i.e., signal ACT) at H-level or signal BIASL formed of the voltage of 0.7 V on its gate terminal. When divided voltage VPDIV is higher than reference voltage VrefS, differential amplifier circuit DFA2 issues a signal at H-level, which is formed of a voltage turning off P-channel MOS transistor 117 and turning on N-channel MOS transistor 118, from node 107. When divided voltage VPDIV is lower than reference voltage VrefS, differential amplifier circuit DFA2 issues a signal at L-level, which is formed of a voltage turning on P-channel MOS transistor 117 and turning off N-channel MOS transistor 118, from node 107.

Usually, divided voltage VPDIV is 1.65 V, and reference voltage VrefS is 1.5 V so that differential amplifier circuit DFA2 issues the signal at H-level from node 107.

Inverter IV2 formed of P- and N-channel MOS transistors 117 and 118 is activated to invert the signal at H-level supplied from node 107 and issue a signal at L-level from node 106 when N-channel MOS transistor 119 receives row address strobe signal RAS (i.e., signal ACT) at H-level or signal BIASL formed of the voltage of 0.7 V on its gate terminal.

Inverter 120 inverts the signal at L-level sent from node 106, and thereby provides a signal at H-level. Inverter 121 inverts the signal at H-level sent from inverter 120, and thereby provides detection signal VPPDET at L-level to oscillator 765.

Figure 11:
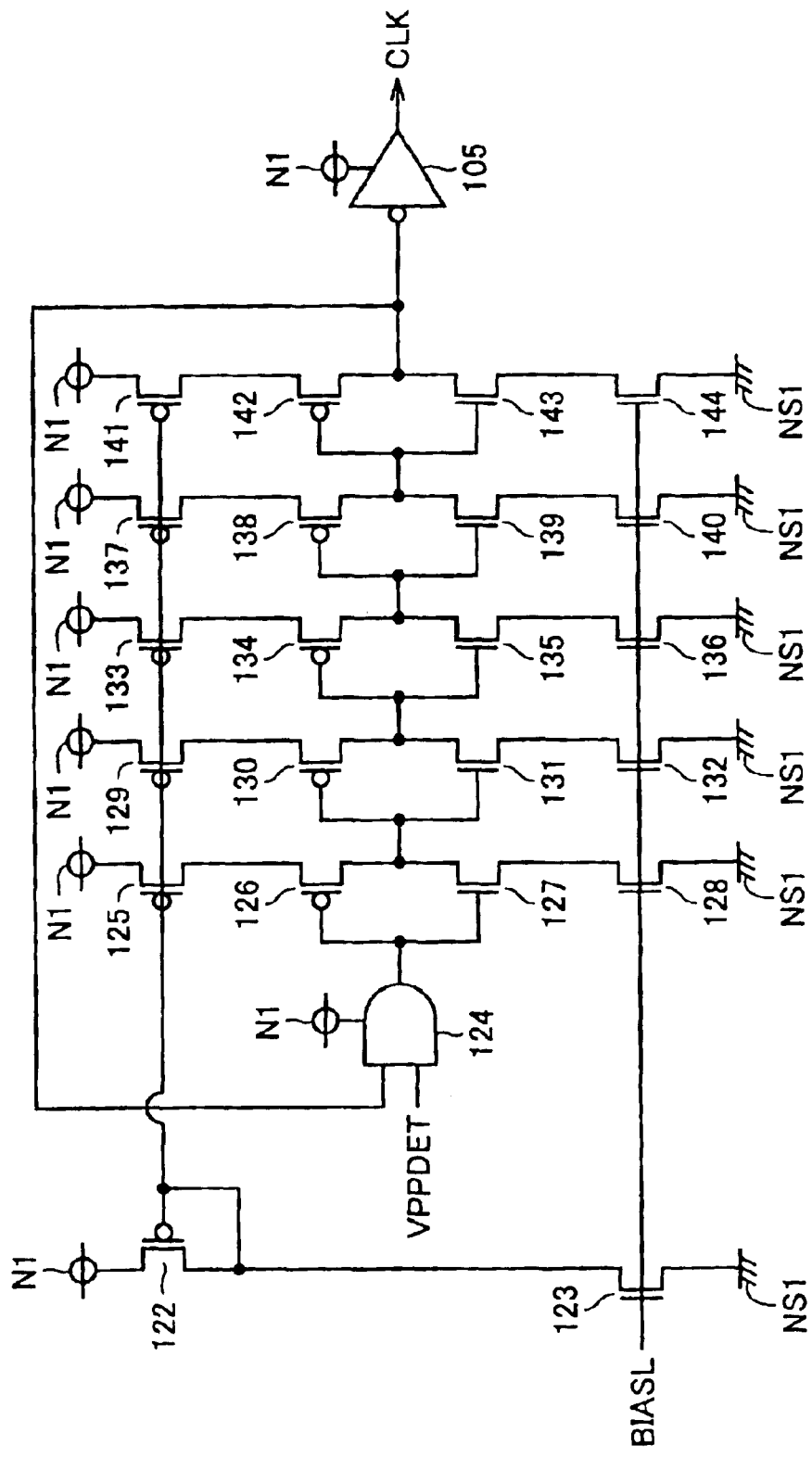
FIG. 11 is a circuit diagram of an oscillator circuit included in the VPP generating circuit shown in FIG. 2.

Referring to FIG. 11, oscillator 765 is formed of P-channel MOS transistors 122, 125, 126, 129, 130, 133, 134, 137, 138, 141 and 142, N-channel MOS transistors 123, 127, 128, 131, 132, 135, 136, 139, 140, 143 and 144, an AND gate 124 and an inverter 105.

P-channel MOS transistors 122, 125, 126, 129, 130, 133, 134, 137, 138, 141 and 142 as well as N-channel MOS transistors 123, 127, 128, 131, 132, 135, 136, 139, 140, 143 and 144 are thin film MOS transistors, respectively. Inverter 105 and AND gate 124 are formed of thin film MOS transistors, and are driven by the power supply voltage of 1.5 V supplied from node N1.

P-channel MOS transistors 122, 125, 126, 129, 130, 133, 134, 137, 138, 141 and 142, N-channel MOS transistors 123, 127, 128, 131, 132, 135, 136, 139, 140, 143 and 144, AND gate 124 and inverter 105 correspond to P-channel MOS transistors 7131, 7133, 7134, 7137, 7138, 7141, 7142, 7145, 7146, 7149 and 7150, N-channel MOS transistors 7132, 7135, 7136, 7139, 7140, 7143, 7144, 7147, 7148, 7151 and 7152, AND gate 7154 and inverter 7153 shown in FIG. 4, respectively.

Accordingly, oscillator 765 performs operations already described with reference to FIG. 4, and thereby issues clock CLK having a phase corresponding to the logical level of detection signal VPPDET.

Level converter 766 has the same structure as level converter 732 shown in FIG. 8.

Figure 12:
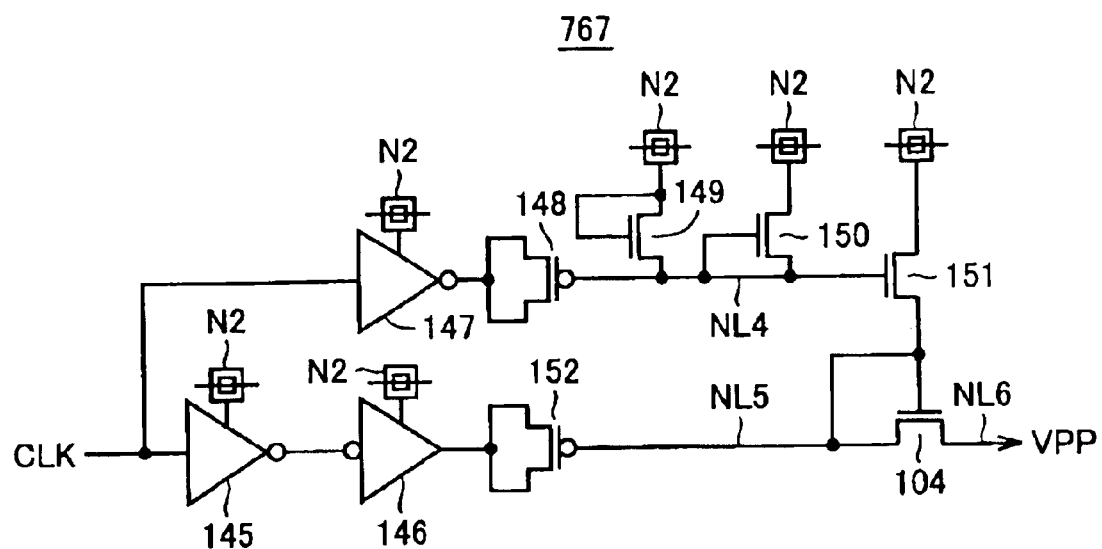
FIG. 12 is a circuit diagram of a pump circuit included in the VPP generating circuit shown in FIG. 2.

Referring to FIG. 12, pump circuit 767 includes inverters 145–147, P-channel MOS transistors 148 and 152, and N-channel MOS transistors 104 and 149–151.

Inverters 145–147 are formed of thick film MOS transistors, and are driven by the power supply voltage of 3.3 V supplied from node N2. P-channel MOS transistors 148 and 152 as well as N-channel MOS transistors 104 and 149–151 are thick film MOS transistors, respectively.

Inverter 145 inverts clock CLK sent from level converter 766, and provides the inverted dock to inverter 146. Inverter 146 inverts the output signal of inverter 145, and provides the inverted signal to the source and drain terminals of P-channel MOS transistor 152. Inverter 147 inverts clock CLK sent from level converter 766, and provides the inverted clock to the source and drain terminals of P-channel MOS transistor 148.

Accordingly, the logical level of the signal provided from inverter 146 is the same as the inverted level of the logical level of the signal provided by inverter 147.

N-channel MOS transistors 149 and 150 are connected in parallel between nodes N2 and NL4. N-channel MOS transistor 149 receives on its gate terminal the power supply voltage of 3.3 V supplied to node N2. N-channel MOS transistor 150 receives on its gate terminal the voltage carried on node NL4.

N-channel MOS transistor 151 is connected between node N2 and the gate terminal of N-channel MOS transistor 104. N-channel MOS transistor 151 receives on its gate terminal the voltage carried on node NL4. N-channel MOS transistor 104 is connected between nodes NL5 and NL6. N-channel MOS transistor 104 receives on its gate terminal the voltage carried on node NL5.

When inverter 147 provides the signal at L-level to the source and drain terminals of P-channel MOS transistor 148, holes flow from node N2 to node NL4 through N-channel MOS transistor 149. Thereby, the voltage on node NL4 rises so that the channel width of N-channel MOS transistor 150 increases in proportion to rising of the voltage on node NL4, and holes flowing from node N2 to node NL4 through N-channel MOS transistor 150 increase in amount. Thereby, the voltage on node NL4 further rises.

As described above, the voltage on node NL4 rises in proportion to a duration of the L-level of signal issued from inverter 147.

When the voltage on node NL4 rises, the channel width of N-channel MOS transistor 151 increases so that holes flowing from node N2 to node NL5 through N-channel MOS transistor 151 increase in amount, and the voltage on node NL5 rises.

While inverter 147 is issuing the signal at L-level, inverter 146 issues the signal at H-level to the source and drain terminals of P-channel MOS transistor 152 so that holes are supplied into the channel region of P-channel MOS transistor 152 from the source and drain terminals thereof, and holes on node NL5 are subject to a coulomb force acting to move them away from the gate terminal of P-channel MOS transistor 152.

Therefore, the holes on node NL5 are supplied to a node NL6 through N-channel MOS transistor 104, and the voltage on node NL6 rises. Node NL6 provides boosted voltage VPP of 3.3 V produced by boosting the power supply voltage of 3.3 V. The voltage level of boosted voltage VPP is the same as that of the power supply voltage supplied to node N2. However, an error in a range of about ±0.3 V is allowed in the power supply voltage supplied to node N2. Therefore, even if boosted voltage VPP is at the voltage level of 3.3 V, it is considered that boosted voltage VPP is produced by boosting the power supply voltage supplied to node N2.

During such operations that inverter 147 provides the signal at H-level to the source and drain terminals of P-channel MOS transistor 148, and inverter 146 provides the signal at L-level to the source and drain terminals of P-channel MOS transistor 152, electrons flow from node N2 to node NL4 through N-channel MOS transistors 149 and 150.

Thereby, the voltage on node NL4 slightly lowers, and the channel width of N-channel MOS transistor 150 decreases. Holes flowing from node N2 to node NL5 through N-channel MOS transistor 151 decreases in amount, and the holes supplied to node NL5 are attracted toward the gate terminal of P-channel MOS transistor 152.

During this period, therefore, boosted voltage VPP on node NL6 slightly lowers.

When inverter 147 provides the signal at L-level to the source and drain terminals of P-channel MOS transistor 148, and inverter 146 provides the signal at H-level to the source and drain terminals of P-channel MOS transistor 152, the voltage on node NL6 is boosted by the same operations as those already described.

As described above, pump circuit 767 provides boosted voltage VPP of 3.3 V while repeating the period for setting a significantly positive potential on node NL6 and the period for slightly lowering the potential on node NL6. The operation of repeating the period for setting the potential on node NL6 to the significantly positive potential and the period for slightly lowering the potential on node NL6 corresponds to the pumping.

Figure 13:
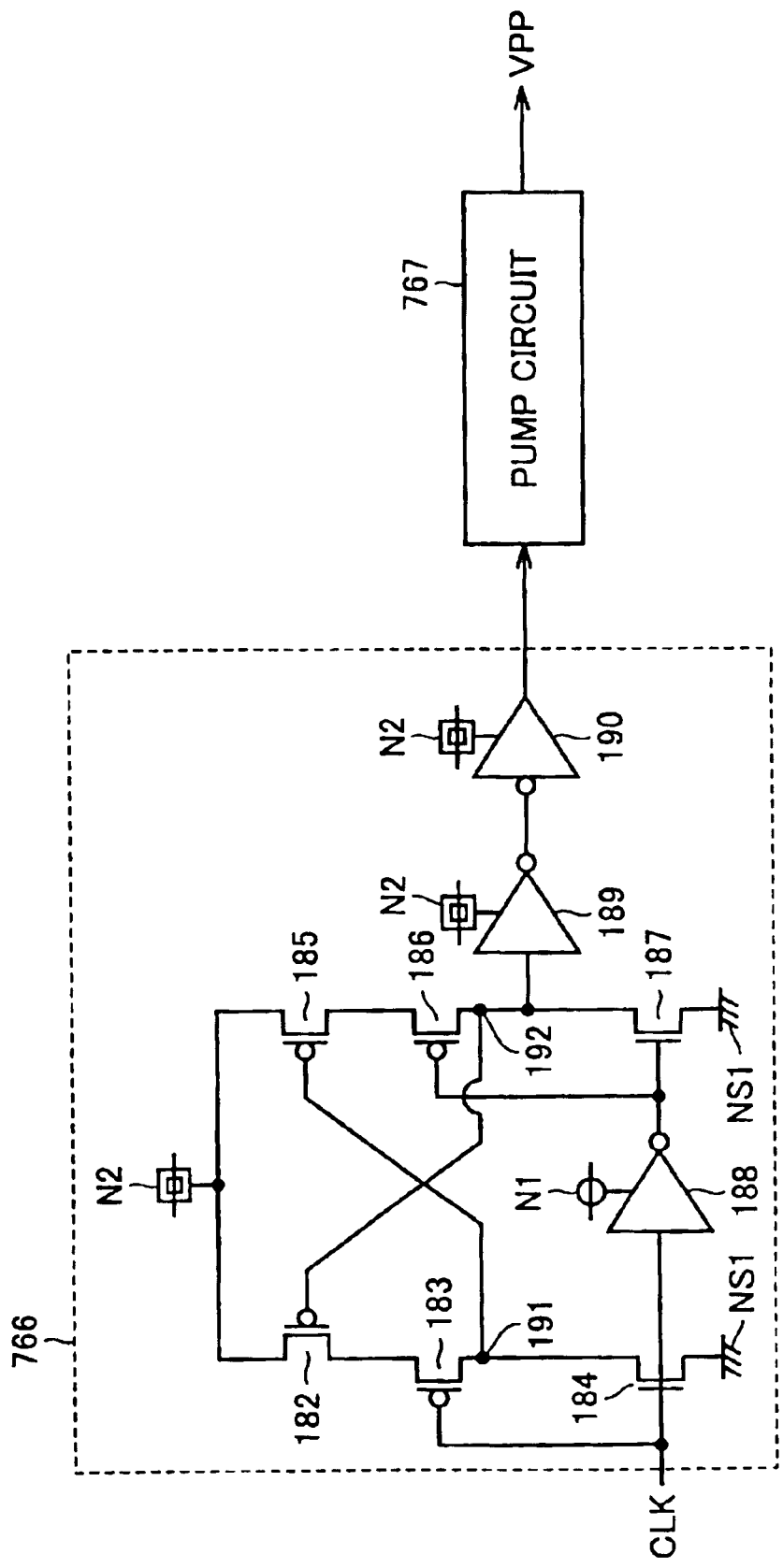
FIG. 13 is a circuit diagram showing a level converter included in the VPP generating circuit shown in FIG. 2, and also shows a pump circuit in a block form.
Figure 14:
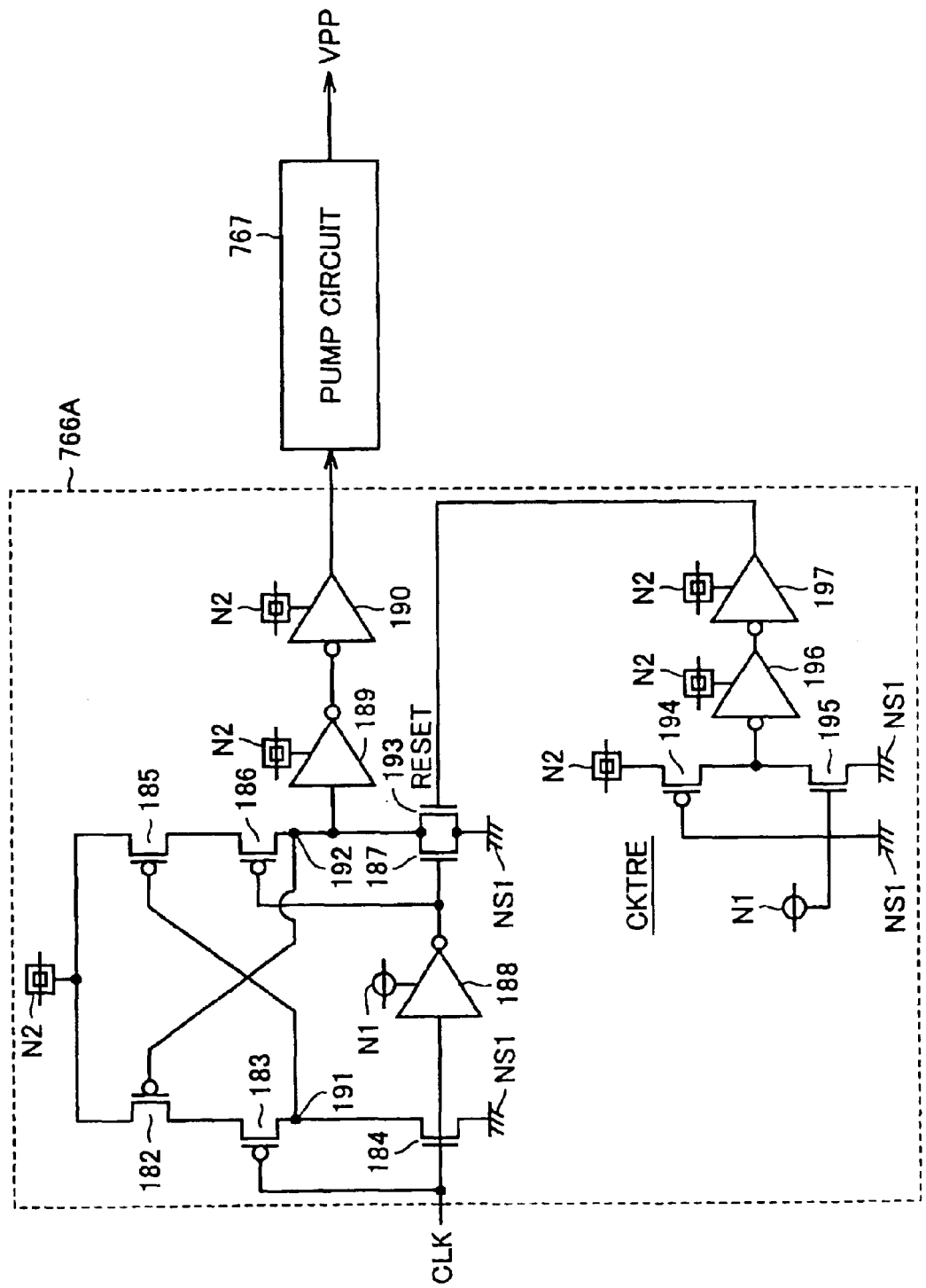
FIG. 14 is a circuit diagram showing another form of the level converter included in the VPP generating circuit shown in FIG. 2, and also shows the pump circuit in a block form.

Referring to FIGS. 13 and 14, level converter 766 in the embodiment will now be described. In FIG. 13, when node N1 is not supplied with the power supply voltage of 1.5 V for driving inverter 188, and the power supply voltage of 3.3 V for driving inverters 189 and 190 is supplied to node N2, level converter 766 may malfunction.

When clock CLK issued from oscillator 765 is at L-level, P-channel MOS transistor 183 is on, and N-channel MOS transistor 184 is off. Since inverter 188 is not supplied with the drive power, it provides the signal at L-level formed of the ground voltage to the gate terminals of P- and N-channel MOS transistors 186 and 187.

Thereby, P-channel MOS transistor 186 is turned on, and N-channel MOS transistor 187 is turned off. The voltages on nodes 191 and 192 are pulled and raised by the power supply voltage of 3.3 V supplied to node N2. Consequently, inverter 189 always receives the signal at H-level, and inverts this signal at H-level to provide a signal at L-level formed of the ground voltage to inverter 190. Inverter 190 inverts this signal at L-level to provide a signal at H-level formed of the power supply voltage of 3.3 V to pump circuit 767. These operations are also performed when clock CLK at H-level is supplied.

Therefore, level converter 766 may malfunction when the power supply voltage of 3.3 V is supplied, and the power supply voltage of 1.5 V is not supplied.

For the above reasons, a level converter shown in FIG. 14 preferably has a function of resetting by a reset signal RESET. Referring to FIG. 14, a level converter 766A is the same as level converter 766, which has the same circuit structures as level converter 732 shown in FIG. 8, except for that an N-channel MOS transistor 193 and a reset circuit CKTRE are additionally employed.

Reset circuit CKTRE includes a P-channel MOS transistor 194, an N-channel MOS transistor 195 and inverters 196 and 197.

N-channel MOS transistors 193 and 195 as well as P-channel MOS transistor 194 are thick film MOS transistors, respectively. Inverters 196 and 197 are formed of thick film MOS transistors.

N-channel MOS transistor 193 is connected between node 192 and ground node NS1, and has source and drain terminals, which are connected to source and drain terminals of N-channel MOS transistor 187, respectively. N-channel MOS transistor 193 receives reset signal RESET on its gate terminal.

P- and N-channel MOS transistors 194 and 195 are connected in series between node N2 and ground node NS1. P-channel MOS transistor 194 receives on its gate terminal the ground voltage from ground node NS1. N-channel MOS transistor 195 receives on its gate terminal the power supply voltage supplied to node N1.

Inverter 196 is driven by the power supply voltage of 3.3 V supplied from node N2, and inverts the input signal for providing the inverted signal to inverter 197. Inverter 197 inverts the input signal to provide reset signal RESET to the gate terminal of N-channel MOS transistor 193.

When the power supply voltage of 1.5 V and the power supply voltage of 3.3 V are supplied, P- and N-channel MOS transistors 194 and 195 are turned on, and inverter 196 receives and inverts the signal at L-level to provide a signal at H-level to inverter 197. Inverter 197 inverts the signal at H-level to provide reset signal RESET at L-level to the gate terminal of N-channel MOS transistor 193.

Thereby, N-channel MOS transistor 193 is turned off, and level converter 766A converts the voltage level forming the H-level of clock CLK from 1.5 V to 3.3 V by the operations already described.

When the power supply voltage of 1.5 V is not supplied, and the power supply voltage of 3.3 V is supplied, P-channel MOS transistor 194 is on, and N-channel MOS transistor 195 is off. Thereby, inverter 196 receives the signal at H-level, and inverts the received signal at H-level to provide a signal at L-level to inverter 197. Inverter 197 inverts the signal at L-level to provide reset signal RESET at H-level to the gate terminal of N-channel MOS transistor 193.

N-channel MOS transistor 193 is turned on by reset signal RESET at H-level to place the ground voltage on node 192. In this case, therefore, level converter 766A issues a signal at L-level so that a malfunction can be prevented.

By using level converter 766A as described above, it is possible to prevent the malfunction in the level converter even when the power supply voltage of 1.5 V is not supplied, and the power supply voltage of 3.3 V is supplied.

Preferably, level converter 766A is used as level converter 732.

When the power supply voltage of 1.5 V is not supplied, oscillator 765 issues clock CLK continuously keeping the L-level, and level converter 766A issues the signal continuously keeping the L-level in accordance with clock CLK continuously keeping the L-level. Level converter 766A continues to issue the signal continuously keeping the L-level until the power supply voltage of 1.5 V is supplied.

Thereby, pump circuit 767 operating in accordance with the signal continuously keeping the L-level does not perform the foregoing pumping operation, and provides voltage VPP at a low voltage level so that memory cell arrays 10 and 20 are deactivated.

In this case, the signal at L-level, which is provided by level converter 766A when the power supply voltage of 1.5 V is not supplied, form an inactive signal. Level converter 766A forms a "signal output circuit", which continues to issue the inactive signal until it is supplied with the power supply voltage of 1.5 V. Further, pump circuit 767 forms a circuit generating voltage VPP (internal voltage) formed of the voltage level for deactivating the memory cell array in accordance with the signal (inactive signal) at L-level issued from level converter 766A (signal output circuit).

Referring to FIG. 2 again, Vbb generating circuit 71, reference voltage generating circuit 72, voltage down converter 73, Vcc/2 generating circuits 74 and 75, and VPP generating circuit 76 included in power supply circuit 70 are constructed such that some portions of reference voltage generating circuit 72, voltage down converter 73 and VPP generating circuit 76 among these circuits are formed of thick film MOS transistors, and the other portions and circuits are formed of thin film MOS transistors, as already described.

In the above portions requiring the thick film MOS transistors, and thus in the portions of voltage down converter 73 providing array voltage VccS and VPP generating circuit 76 providing boosted voltage VPP, the number of required circuits depends on structures such as a changed array capacity, bank structures, I/O structures, a page size (the number of memory cell data latched by the sense amplifiers in accordance with row-related activation at a time) and a refresh cycle, because the current consumption depends' on the number of word lines to be activated at a time and the number of sense amplifiers to be activated in accordance with activation of the word lines. The number of circuits in these portions is substantially equal to an integral multiple of currents.

Accordingly, the circuits formed of the thick film MOS transistors are arranged to form units corresponding to the memory cell arrays, and the circuits formed of the thin film MOS transistors are arranged in a shuffled fashion.

Figure 15:
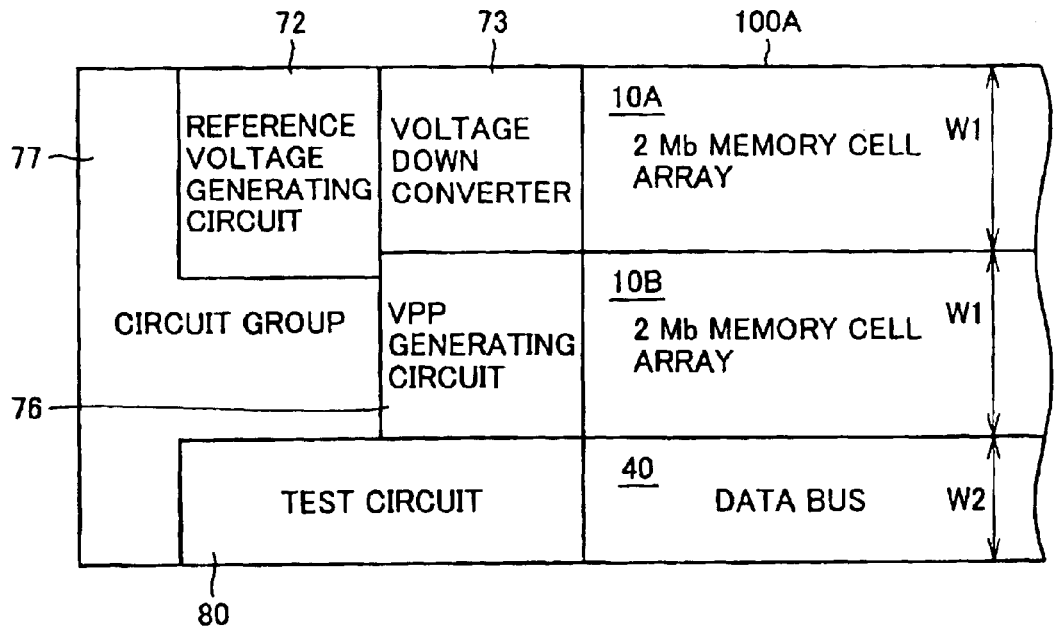
FIG. 15 is a schematic block diagram of a semiconductor memory device having a capacity of 4 Mb according to the first embodiment.
Figure 16:
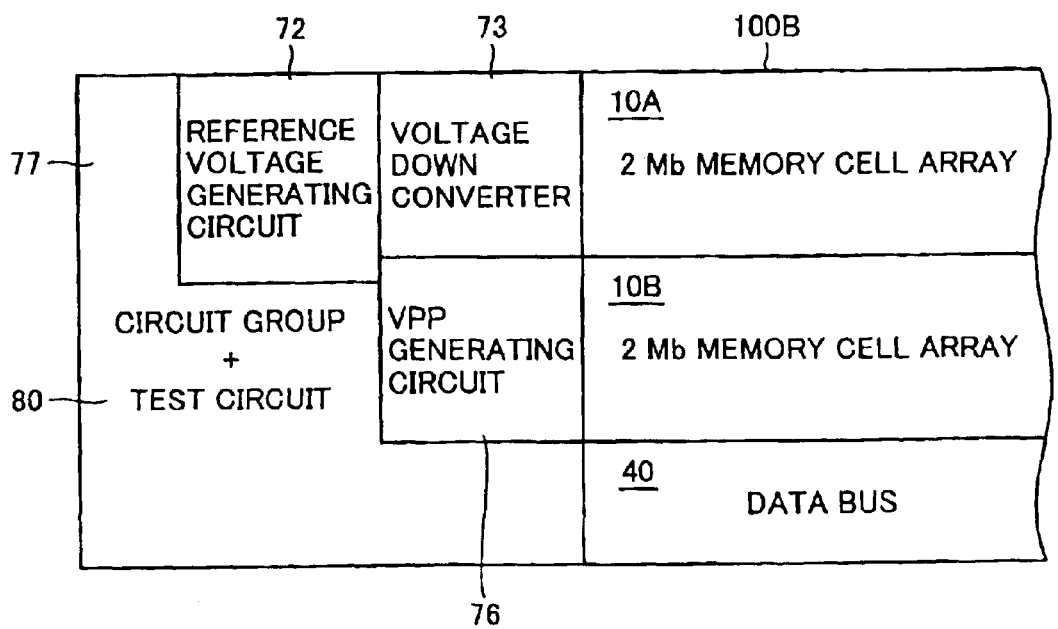
FIG. 16 is a schematic block diagram showing another structure of a semiconductor memory device having a capacity of 4 Mb according to the first embodiment.
Figure 17:
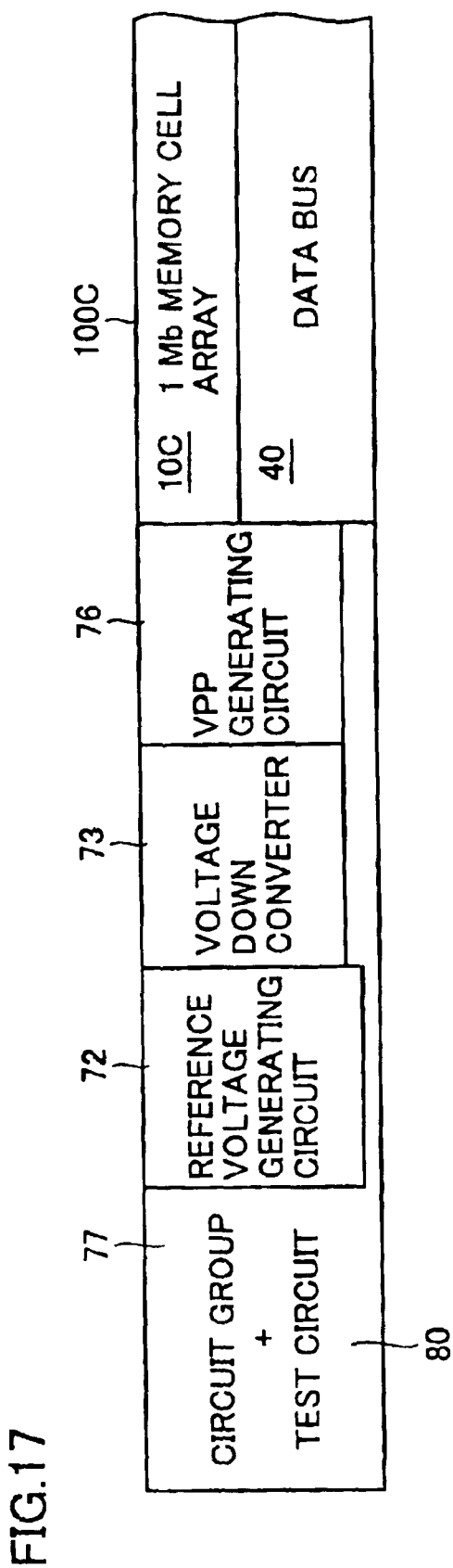
FIG. 17 is a schematic block diagram of a semiconductor memory device having a capacity of 1 Mb according to the first embodiment.

FIGS. 15–17 show examples of arrangement of the circuits in power supply circuit 70 according to the first embodiment. FIGS. 15 and 16 show arrangements for a capacity of 4 Mb, and FIG. 17 shows an arrangement for a capacity of 1 Mb.

Referring to FIG. 15, a semiconductor memory device 100A includes memory cell arrays 10A and 10B, data bus 40, reference voltage generating circuit 72, voltage down converter 73, VPP generating circuit 76, test circuit 80 and a circuit group 77. Circuit group 77 includes a power supply system, which produces the power supply voltages for Vbb generating circuit 71 and Vcc/2 generating circuits 74 and 75, and a control circuit formed of thin film MOS transistors.

Voltage down converter 73 neighbors to memory cell array 10A. VPP generating circuit 76 neighbors to memory cell array 10B. Reference voltage generating circuit 72 neighbors to voltage down converter 73. Thus, reference voltage generating circuit 72 voltage down converter 73 and VPP generating circuit 76, which include thick film MOS transistors, are arranged in accordance with the positions of memory cell arrays 10A and 10B.

Voltage down converter 73 extends over a width W1 of memory cell array 10A, and VPP generating circuit 76 extends over a width W1 of memory cell array 10B.

Test circuit 80 neighbors to data bus 40, and extends over a width W2 of data bus 40.

The positions of reference voltage generating circuit 72, voltage down converter 73, VPP generating circuit 76 and test circuit 80 are determined in view of areas occupied by the respective circuits. More specifically, reference voltage generating circuit 72, voltage down converter 73, VPP generating circuit 76 and test circuit 80 have certain sizes and occupy certain areas, respectively. For determining the positions of reference voltage generating circuit 72, voltage down converter 73, VPP generating circuit 76 and test circuit 80, boundaries between these circuits are taken into consideration, and it is assumed that the respective circuits have certain sizes. Accordingly, reference voltage generating circuit 72, voltage down converter 73, VPP generating circuit 76 and test circuit 80 are arranged while handling them as units or modular circuits. Elements forming reference voltage generating circuit 72 are not arranged in an irregularly mixed fashion with respect to the elements forming voltage down converter 73, and also the elements forming voltage down converter 73 are not arranged in an irregularly mixed fashion with respect to the elements forming VPP generating circuit 76.

The circuits including the thick film MOS transistors are arranged in the positions determined corresponding to memory cell arrays 10A and 10B, and neighbor to memory cell arrays 10A and 10B. Since reference voltage generating circuit 72, voltage down converter 73 and VPP generating circuit 76 must supply array voltage VccS and boosted voltage VPP, which are required for input/output of data to and from the memory cells included in memory cell arrays 10A and 10B, to memory cell arrays 10A and 10B, the above arrangement of reference voltage generating circuit 72, voltage down converter 73 and VPP generating circuit 76 is determined for preventing lowering of the voltage levels of array voltage VccS and boosted voltage VPP.

Therefore, reference voltage generating circuit 72, voltage down converter 73 and VPP generating circuit 76 are arranged in the region neighboring to memory cell arrays 10A and 10B, and form three units in the region. More specifically, the plurality of circuits including the thick film MOS transistors are arranged in the region neighboring to memory cell arrays 10A and 10B, and forms the units equal in number to the circuits including the thick film MOS transistors. The plurality of circuits including the thick film MOS transistors are arranged in the region neighboring to memory cell arrays 10A and 10B, and particularly are located at positions, which are adjusted and determined while handling each circuit as one unit.

The circuits included in circuit group 77 are arranged in the region other than the region, in which reference voltage generating circuit 72, voltage down converter 73, VPP generating circuit 76 and test circuit 80 are arranged, in a shuffled fashion. Each of the circuits included in circuit group 77 is not handled as a circuit occupying a certain area, and a plurality of elements forming each circuit are arranged to be present within a predetermined area or region. Thus, the plurality of elements forming each circuit are arranged as one "mass" to form one circuit. In some cases, therefore, the elements forming one of the circuits included in circuit group 77 are arranged in an irregularly mixed or shuffled fashion with respect to the elements forming another circuit. Each of the circuits included in circuit group 77 is arranged commonly to memory cell arrays 10A and 10B.

According to the arrangement shown in FIG. 15, the circuits including the thick film MOS transistors can be gathered in the region, where reference voltage generating circuit 72, voltage down converter 73 and VPP generating circuit 76 are arranged, and the circuits including the thin film MOS transistors can be gathered in the region, where circuit group 77 is arranged. Consequently, noises in semiconductor memory device 100A can be reduced, and an area loss, which occurs in a conventional semiconductor memory device, can also be reduced.

The layout conditions may become more severe, for example, due to decrease in width W1 of memory cell arrays 10A and 10B. In this case, control circuits 731 and 761 in voltage down converter 73 and VPP generating circuit 76 shown in FIGS. 2 and 15 may be removed from the units of voltage down converter 73, VPP generating circuit 76 and others, and may be arranged in a shuffled fashion in circuit group 77 because these circuits 73 and 76 are control circuits formed of thin film MOS transistors.

An automatic arranging device, which is referred to as EDA (Electronic Design Automation), may be used for determining the positions of the respective circuits in circuit group 77. Positions of reference voltage generating circuit 72, voltage down converter 73, VPP generating circuit 76 and test circuit 80 are determined manually in accordance with the positions of memory cell arrays 10A and 10B.

Referring to FIG. 16, a semiconductor memory device 100B is the same as semiconductor memory device 100A except for that test circuit 80 is included in circuit group 77.

Referring to FIG. 17, a semiconductor memory device 100C includes a memory cell array 10C, data bus 40, VPP generating circuit 76, voltage down converter 73, reference voltage generating circuit 72 and circuit group 77.

Semiconductor memory device 100C has a capacity of 1 Mb. In semiconductor memory device 100C, VPP generating circuit 76 neighbors to memory cell array 10C and data bus 40, voltage down converter 73 neighbors to VPP generating circuit 76 and reference voltage generating circuit 72 neighbors to voltage down converter 73. These reference voltage generating circuit 72, voltage down converter 73 and VPP generating circuit 76 are disposed in the positions adjusted in accordance with areas occupied by the respective circuits.

The circuits included in circuit group 77 are arranged in a shuffled fashion within a region other than that for arranging reference voltage generating circuit 72, voltage down converter 73 and VPP generating circuit 76.

In the invention, as described above, the circuits including the thick film MOS transistors are arranged to form units in a single region corresponding to the positions of the memory cell arrays. The circuits including thin film MOS transistors are arranged in a shuffled fashion. The positions of the circuits including the thick film MOS transistors are variable depending on the capacity of the memory cell array.

Figure 18:
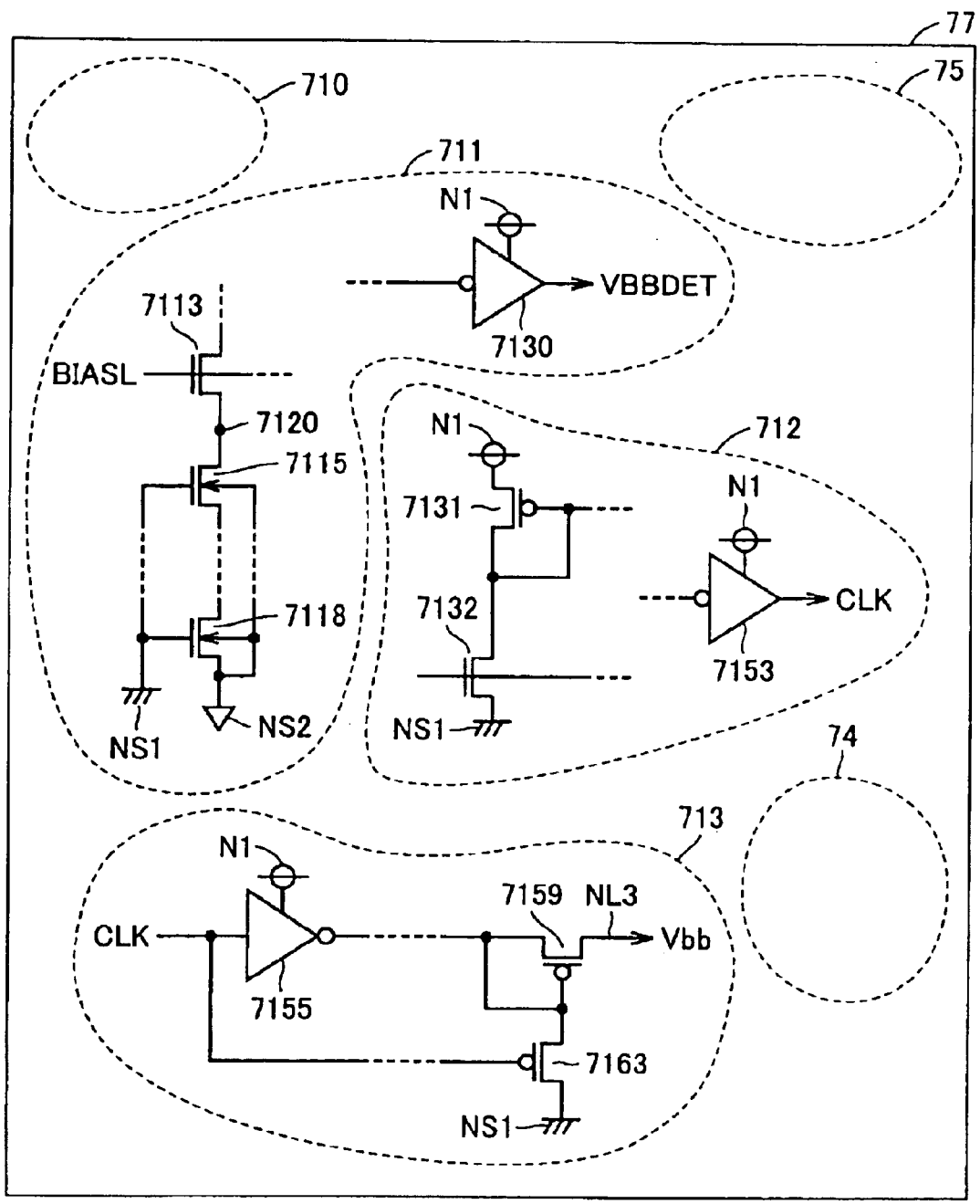
FIG. 18 is a diagram for showing an arrangement of circuits in a shuffled fashion.

Referring to FIG. 18, "arrangement in a shuffled fashion" according to the invention will now be described. Circuit group 77 includes Vbb generating circuit 71 as already described. Control circuit 710, detecting circuit 711, oscillator 712 and pump circuit 713 forming Vbb generating circuit 71 are arranged in a region depicted by a dotted line. For example, N-channel MOS transistor 7118 forming detecting circuit 711 neighbors to an N-channel MOS transistor 7132 forming oscillator 712. Therefore, the plurality of elements forming detecting circuit 711 may be disposed in an irregularly mixed or shuffled fashion with respect to the plurality of elements forming oscillator 712.

In addition to the circuits forming Vbb generating circuit 71, each of Vcc/2 generating circuits 74 and 75 formed of the thin film MOS transistors is likewise disposed in a region depicted by a dotted line.

According to the invention, the "arrangement in a shuffled fashion" does not represent such an arrangement that the plurality of elements forming each circuit are arranged in a random fashion, but represents such an arrangement that the plurality of elements forming each circuit are handled as one "mass" to form one circuit, and these circuits are arranged in an irregular fashion. When determining the arrangement of each circuit, boundaries between the circuits are not taken into consideration. Accordingly, the dotted lines in FIG. 18 do not represent the boundaries between the circuits, but approximately or roughly represents the regions, where the plurality of elements forming the respective circuits are arranged.

The operations of input/output of data with respect to the plurality of memory cells included in memory cell arrays 10 and 20 of semiconductor memory device 100 are the same as ordinary input/output operations, and therefore are not described.

Row column decoder 30, data buses 40 and 50, sense amplifiers and equalize circuits form "peripheral circuits" for inputting and outputting data to or from the plurality of memory cells included in memory cell arrays 10 and 20.

In FIGS. 15 and 16, whole memory call arrays 10A and 10B may be deemed as a signal memory cell array, in which case memory cell arrays 10A and 10B form a plurality of blocks included in this single memory cell array, respectively. Accordingly, voltage down converter 73 is disposed close to block 10A other than block 10B close to VPP generating circuit 76.

According to the first embodiment, the semiconductor memory device includes the reference voltage generating circuit, voltage down converter and VPP generating circuit, which are arranged corresponding to the position of the memory cell array, and also includes the circuit group including the Vbb generating circuit and others, which are arranged in a shuffled fashion. Therefore, even if the capacity of the memory cell array changes, the respective power supply circuits can be arranged while suppressing the area loss.

[Second Embodiment]

Figure 19:
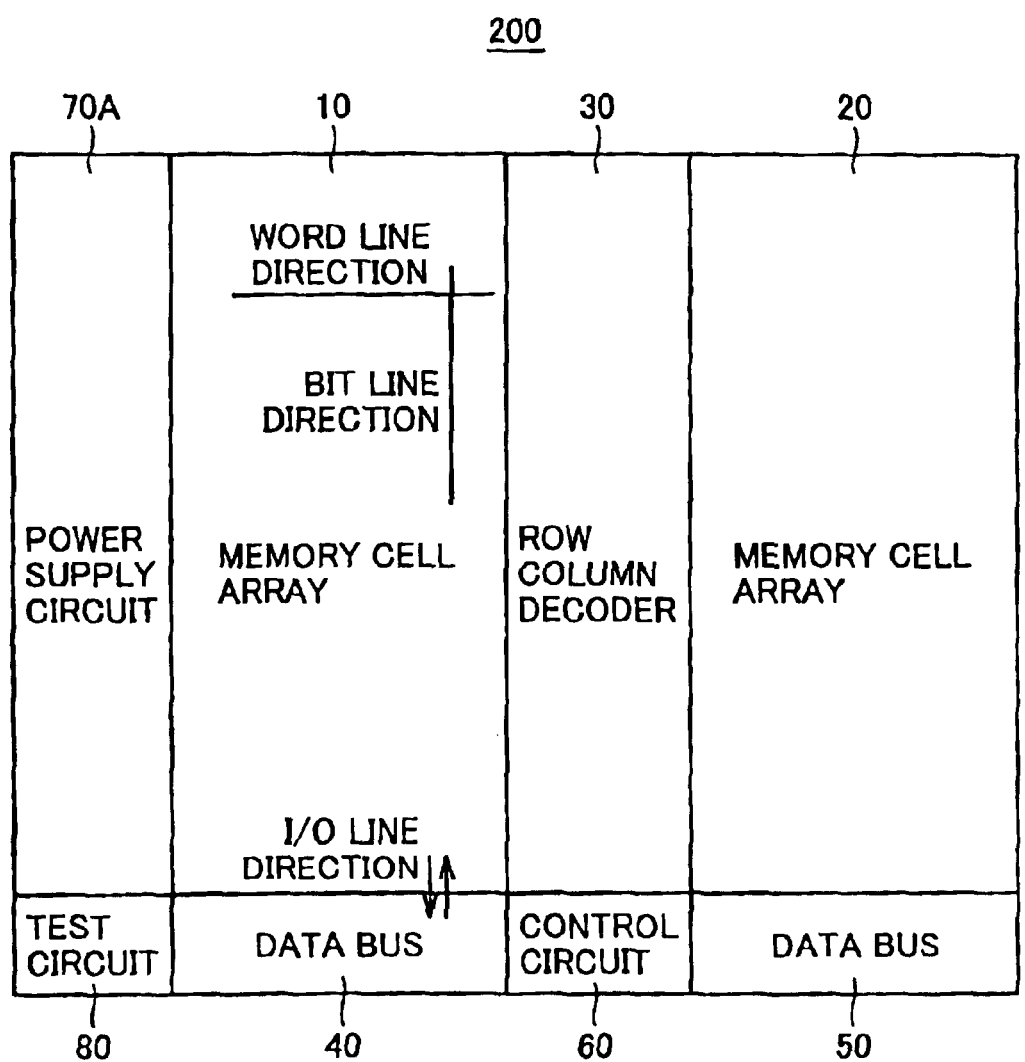
FIG. 19 is a schematic block diagram of a semiconductor memory device according to a second embodiment.

Referring to FIG. 19, a semiconductor memory device 200 according to a second embodiment is the same as semiconductor memory device 100 except for that power supply circuit 70 is replaced with a power supply circuit 70A.

Figure 20:
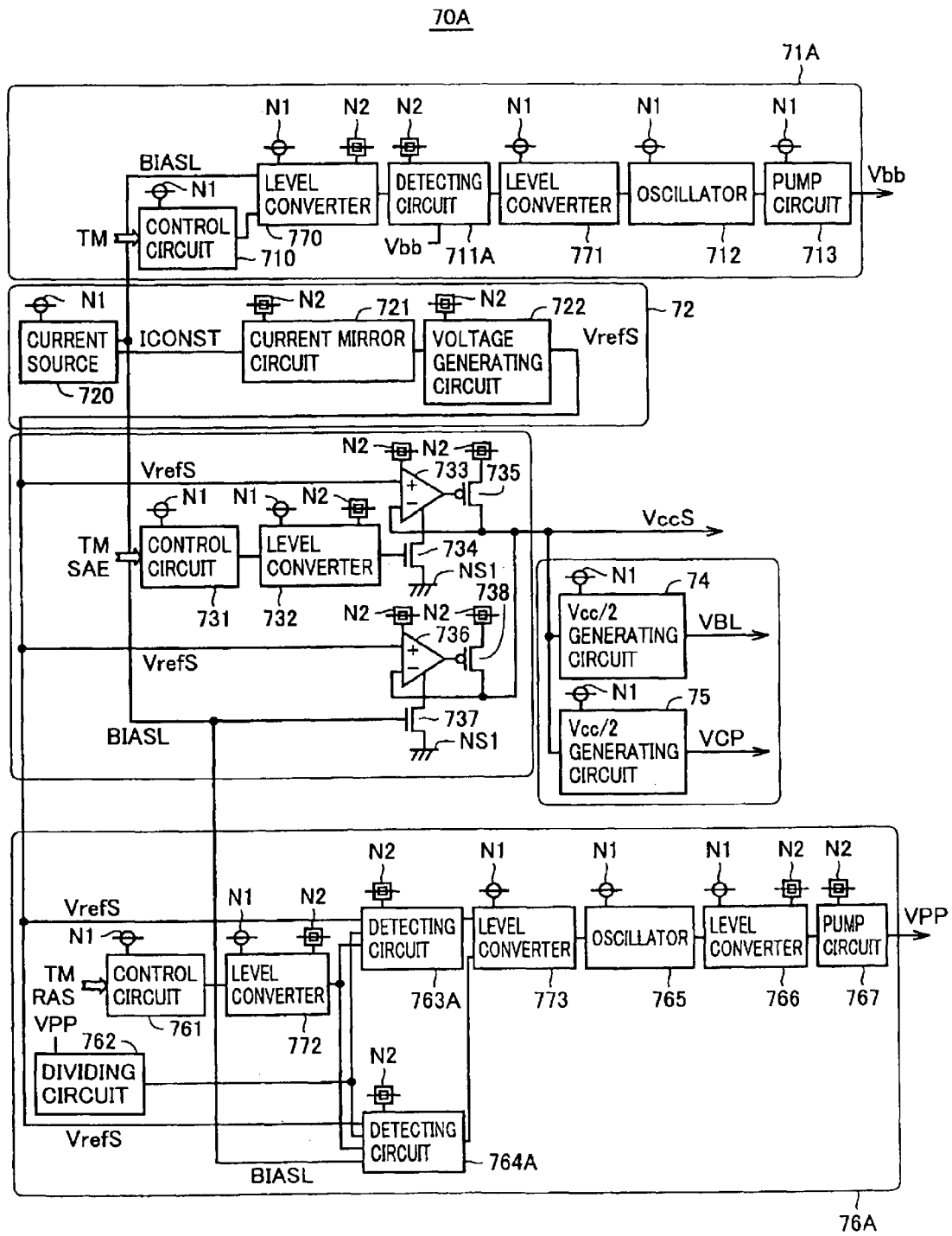
FIG. 20 is a circuit diagram showing a power supply circuit shown in FIG. 19 with some portions depicted in block forms.

Referring to FIG. 20, power supply circuit 70A is the same as power supply circuit 70 except for that Vbb generating circuit 71 is replaced with a Vbb generating circuit 71A, and VPP generating circuit 76 is replaced with a VPP generating circuit 76A.

Vbb generating circuit 71A is the same as Vbb generating circuit 71 except for that detecting circuit 711 is replaced with a detecting circuit 711A, and level converters 770 and 771 are additionally employed.

Level converter 770 is connected between control circuit 710 and detecting circuit 711A. Level converter 771 is connected between detecting circuit 711A and oscillator 712.

Level converter 770 receives the power supply voltage of 1.5 V from node N1, and also receives the power supply voltage of 3.3 V from node N2. Level converter 770 converts the voltage level, which forms test mode signal TM at H-level received from control circuit 710, from 1.5 V to 3.3 V, and provides it to detecting circuit 711A. Level converter 770 has the circuit structure shown in FIG. 8 or 14.

Detecting circuit 711A is driven by the power supply voltage of 3.3 V supplied from node N2. When detecting circuit 711A is active, it detects negative potential Vbb, and provide a detection signal to level converter 771.

Level converter 771 is driven by the power supply voltage of 1.5 V supplied from node N1. Level converter 771 converts the voltage level, which forms the detection signal received from detecting circuit 711A, from 3.3 V to 1.5 V, and provides it to oscillator 712.

Figure 21:
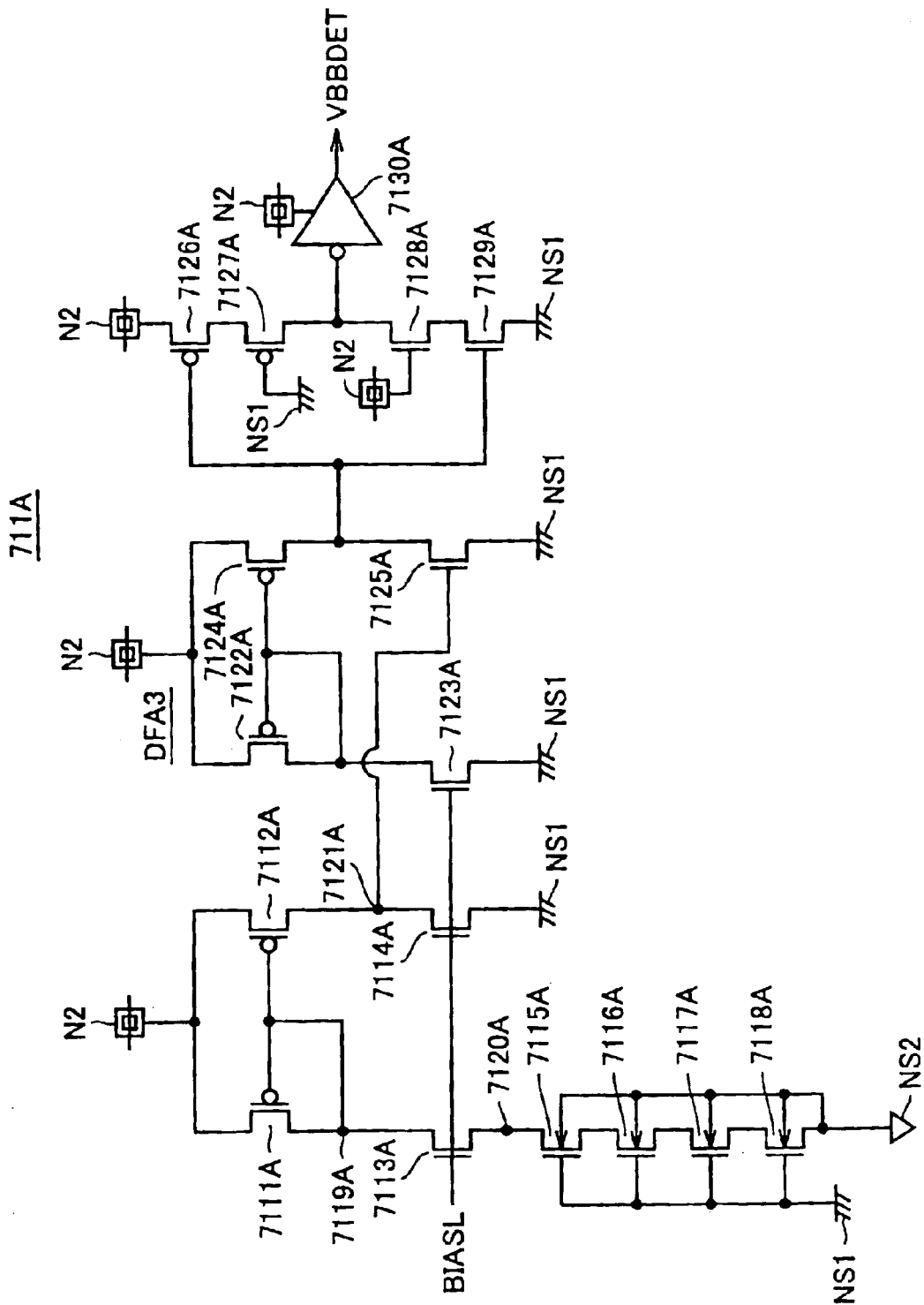
FIG. 21 is a circuit diagram of a detecting circuit included in a Vbb generating circuit shown in FIG. 20.

Referring to FIG. 21, detecting circuit 711A includes P-channel MOS transistors 7111A, 7112A, 7122A, 7124A, 7126A and 7127A, N-channel MOS transistors 7113A, 7114A, 7115A–7118A, 7123A, 7125A, 7128A and 7129A, and an inverter 7130A. P-channel MOS transistors 7111A, 7112A, 7122A, 7124A, 7126A and 7127A as well as N-channel MOS transistors 7113A, 7114A, 7115A–7118A, 7123A, 7125A, 7128A and 7129A are thick film MOS transistors, respectively, and inverter 7130A is formed of thick film MOS transistors.

P-channel MOS transistors 7111A, 7112A, 7122A, 7124A, 7126A and 7127A, N-channel MOS transistors 7113A, 7114A, 7115A–7118A, 7123A, 7125A, 7128A and 7129A, and inverter 7130A of detecting circuit 711A correspond to P-channel MOS transistors 7111, 7112, 7122, 7124, 7126 and 7127, N-channel MOS transistors 7113, 7114, 7115–7118, 7123, 7125, 7128 and 7129, and inverter 7130 of detecting circuit 711, respectively.

In detecting circuit 711A, node N2 supplies the power supply voltage of 3.3 V. Thus, detecting circuit 711A is supplied with the power supply voltage of 3.3 V as its drive power instead of the power supply voltage of 1.5 V.

A differential amplifier circuit DFA3 formed of P-channel MOS transistors 7122A and 7124A as well as N-channel MOS transistors 7123A and 7125A compares the voltage received on the gate terminal of N-channel MOS transistor 7125A with the voltage of 0.7 V forming signal BIASL received on the gate terminal of N-channel MOS transistor 7123A.

Differential amplifier circuit DFA3 is of a current mirror type, and it is preferable that the voltage of 0.7 V forming signal BIASL, which is the reference voltage, is set to a voltage obtained by adding a threshold voltage of N-channel MOS transistor 7125A to the potential on the common source.

The threshold voltage of thick film MOS transistor is 0.8 V, and ground node NS1 forms the common source of differential amplifier circuit DFA3. Therefore, by employing N-channel MOS transistor 7125A formed of the thick film MOS transistor, the voltage of 0.7 V forming signal BIASL, i.e., the reference signal becomes substantially equal to the voltage obtained by adding the threshold voltage of N-channel MOS transistor 7125A to the potential on the common source.

In the second embodiment, detecting circuit 711A is formed of the thick film MOS transistors. Detecting circuit 711A detects negative voltage Vbb of −0.7 V, and provides detection signal VBBDET formed of the voltage of 3.3 V.

As described above, detecting circuit 711A is formed of the thick film MOS transistors, whereby such a situation can be prevented that N-channel MOS transistor 7123A, i.e., the MOS transistor for comparison enters a linear operation region, and the voltage comparing operation of differential amplifier circuit DFA3 can be performed in a region providing a high response and a high gain.

Figure 22:
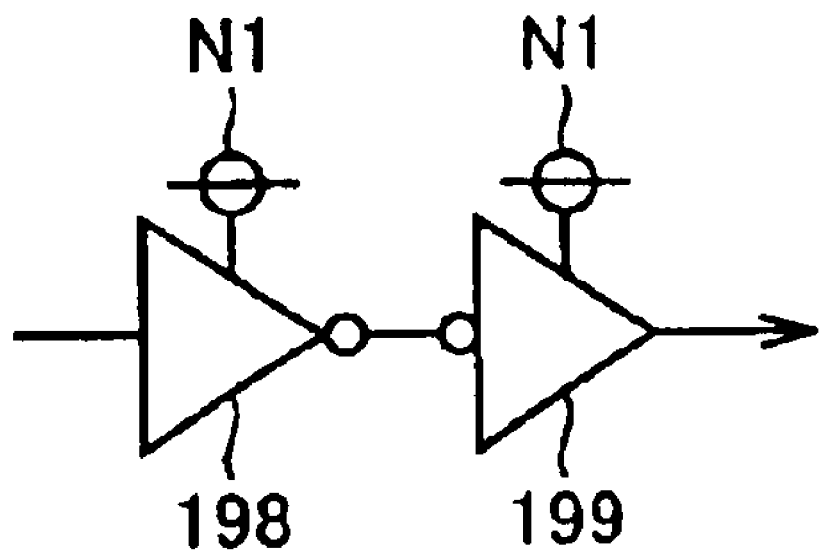
FIG. 22 is a circuit diagram of a level converter included in the Vbb generating circuit shown in FIG. 20.

Referring to FIG. 22, level converter 771 includes inverters 198 and 199, which are connected in series. Inverters 198 and 199 are driven by the power supply voltage of 1.5 V supplied from node N1. Inverter 198 inverts detection signal VBBDET at H-level formed of the power supply voltage of 3.3 V to provide detection signal VBBDET at L-level formed of the ground voltage to inverter 199.

Inverter 199 inverts detection signal VBBDET at L-level formed of the ground voltage, and provides detection signal VBBDET at H-level formed of the power supply voltage of 1.5 V. Thereby, the voltage level forming detection signal VBBDET is converted from 3.3 V to 1.5 V.

Referring to FIG. 20 again, VPP generating circuit 76A is the same as VPP generating circuit 76 except for that detecting circuits 763 and 764 in VPP generating circuit 76 are replaced with detecting circuits 763A and 764A, add level converters 772 and 773 are additionally employed.

Level converter 772 is connected between control circuit 761 and detecting circuits 763A and 764A. Level converter 773 is connected between oscillator 765 and detecting circuits 763A and 764A.

Level converters 772 and 773 receive the power supply voltage of 1.5 V from node N1, and level converter 772 receives the power supply voltage of 3.3 V. Level converter 772 is formed of the circuit structure shown in FIG. 8 or 14. Level converter 772 converts the voltage level, which is received from control circuit 761 and forms test mode signal TM at H-level or row address strobe signal RAS at H-level, from 1.5 V to 3.3 V, and provides the test mode signal TM or row address strobe signal RAS at H-level thus converted to detecting circuits 763A and 764A.

Detecting circuits 763A and 764A are driven by the power supply voltage of 3.3 V supplied from node N2. Detecting circuits 763A and 764A perform the same functions as detecting circuits 763 and 764, and provide detection signal VPPDET to level converter 773.

Level converter 773 converts the voltage level, which forms detection signal VPPDET received from detecting circuits 763A and 764A, from 3.3 V to 1.5 V, and provides the converted detection signal VPPDET to oscillator 765. Level converter 773 has the same circuit structure as level converter 771 shown in FIG. 22.

Figure 23:
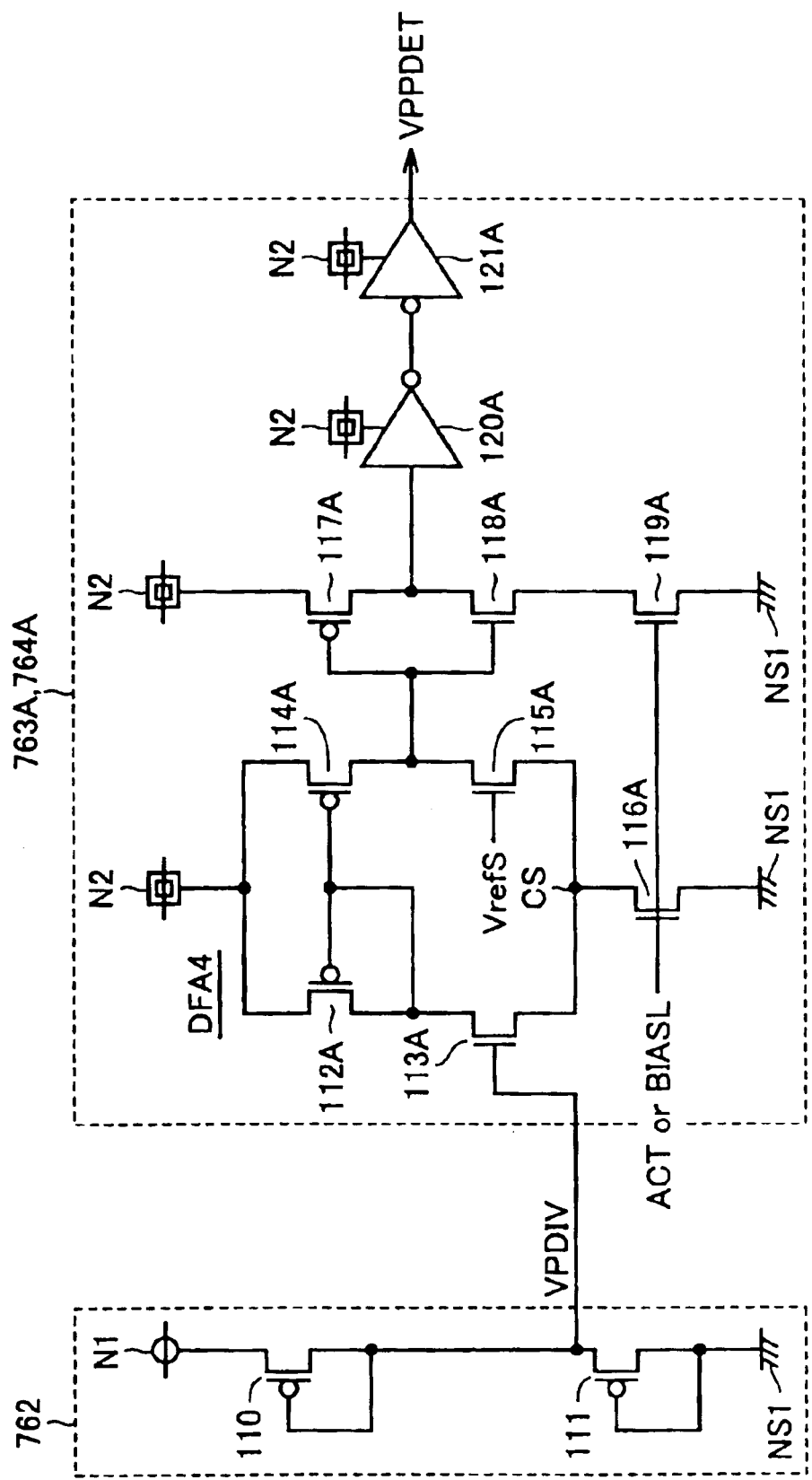
FIG. 23 is a circuit diagram showing a dividing circuit and the detecting circuit included in the Vbb generating circuit shown in FIG. 20.

Referring to FIG. 23, each of detecting circuits 763A and 764A includes P-channel MOS transistors 112A, 114A and 117A, N-channel MOS transistors 113A, 115A, 116A, 118A and 119A, and inverters 120A and 121A.

P-channel MOS transistors 112A, 114A and 117A as well as N-channel MOS transistors 113A, 115A, 116A, 118A and 119A are thick film MOS transistors, respectively. Inverters 120A and 121A are formed of thick film MOS transistors.

P-channel MOS transistors 112A, 114A and 117A, N-channel MOS transistors 113A, 115A, 116A, 118A and 119A, and inverters 120A and 121A of detecting circuits 763A and 764A correspond to P-channel MOS transistors 112, 114 and 117, N-channel MOS transistors 113, 115, 116, 118 and 119, and inverters 120 and 121 of detecting circuits 763 and 764, respectively. Therefore, the operations of these MOS transistors in detecting circuits 763A and 764A are the same as those already described.

In detecting circuits 763A and 764A, a differential amplifier circuit DFA4 compares divided voltage VPDIV formed of the voltage of 1.65 V with reference voltage VrefS formed of the voltage of 1.5 V. Therefore, for comparing divided voltage VPDIV with reference voltage VrefS in a region providing a high response and a high gain while preventing such a situation that N-channel MOS transistor 113A enters a linear operation region, the voltage of 1.65 V must be equal to the voltage produced by adding the threshold voltage of N-channel MOS transistors 113A and 115A to the potential on common source CS.

For the above reasons, N-channel MOS transistors 113A, 115A and 116A are formed of thick film MOS transistors so that the voltage (1.6 V) prepared by adding the threshold voltage (0.8 V) of N-channel MOS transistors 113A and 115A to the potential (0.8 V) on common source CS may be substantially equal to the voltage (i.e., divided voltage VPDIV of 1.65 V) for comparison.

Thereby, the comparing operation in differential amplifier circuit DFA4 can be performed in a region of a high response and a high gain, and the operations of detecting divided voltage VPDIV in detecting circuits 763A and 764A can be improved.

Structures and operations other than the above are the same as those of the first embodiment.

According to the second embodiment, the differential amplifier circuit of the current mirror type for performing the differential amplification by comparing two voltages is formed of the thick film MOS transistors, and the voltage applied thereto for comparison is substantially equal to a sum of the potential on the common source and the threshold voltage of the MOS transistor. Therefore, the two voltages can be compared in the region of a high response and a high gain so that the detecting circuit can perform the detecting operation more accurately.

[Third Embodiment]

Figure 24:
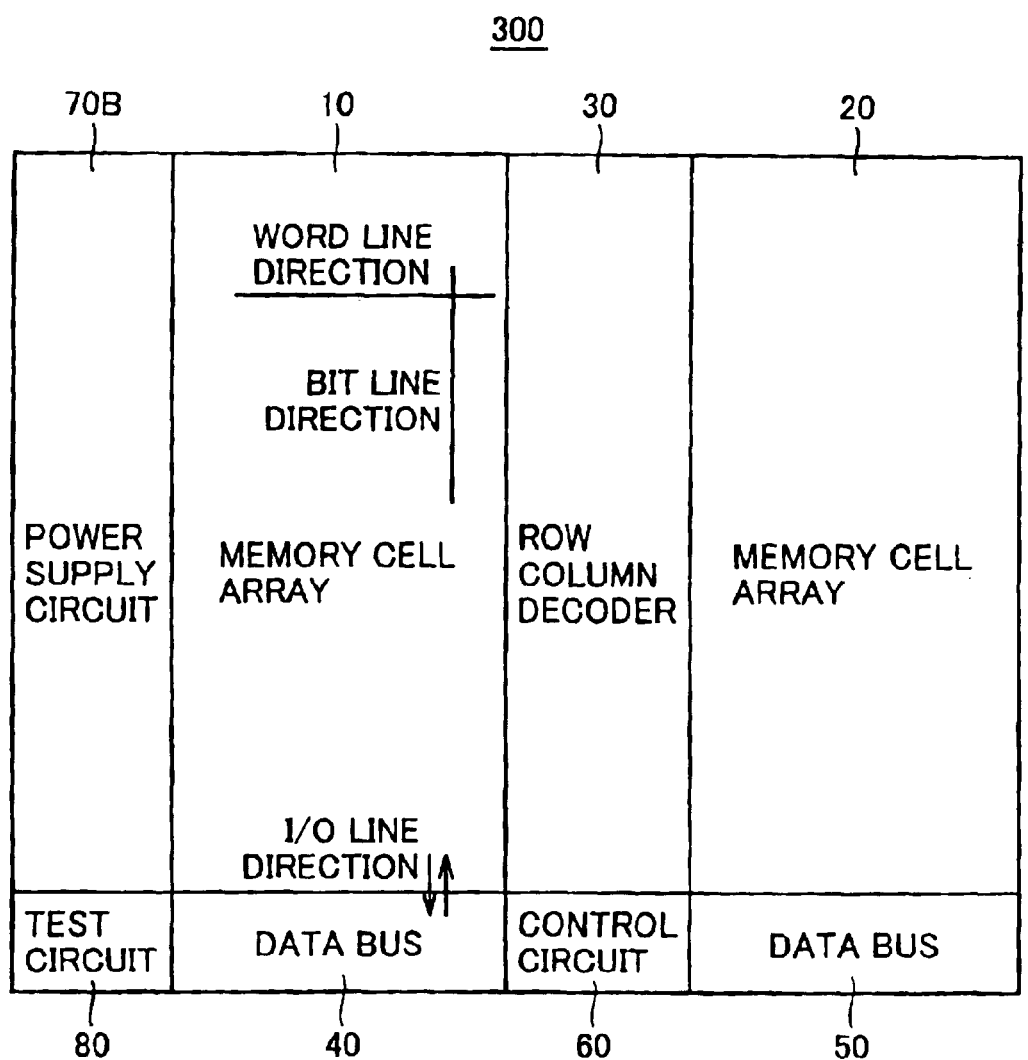
FIG. 24 is a schematic block diagram of a semiconductor memory device according to a third embodiment.

Referring to FIG. 24, a semiconductor memory device 300 according to a third embodiment is the same as semiconductor memory device 100 except for that power supply circuit 70 in semiconductor memory device 100 is replaced with a power supply circuit 70B.

Figure 25:
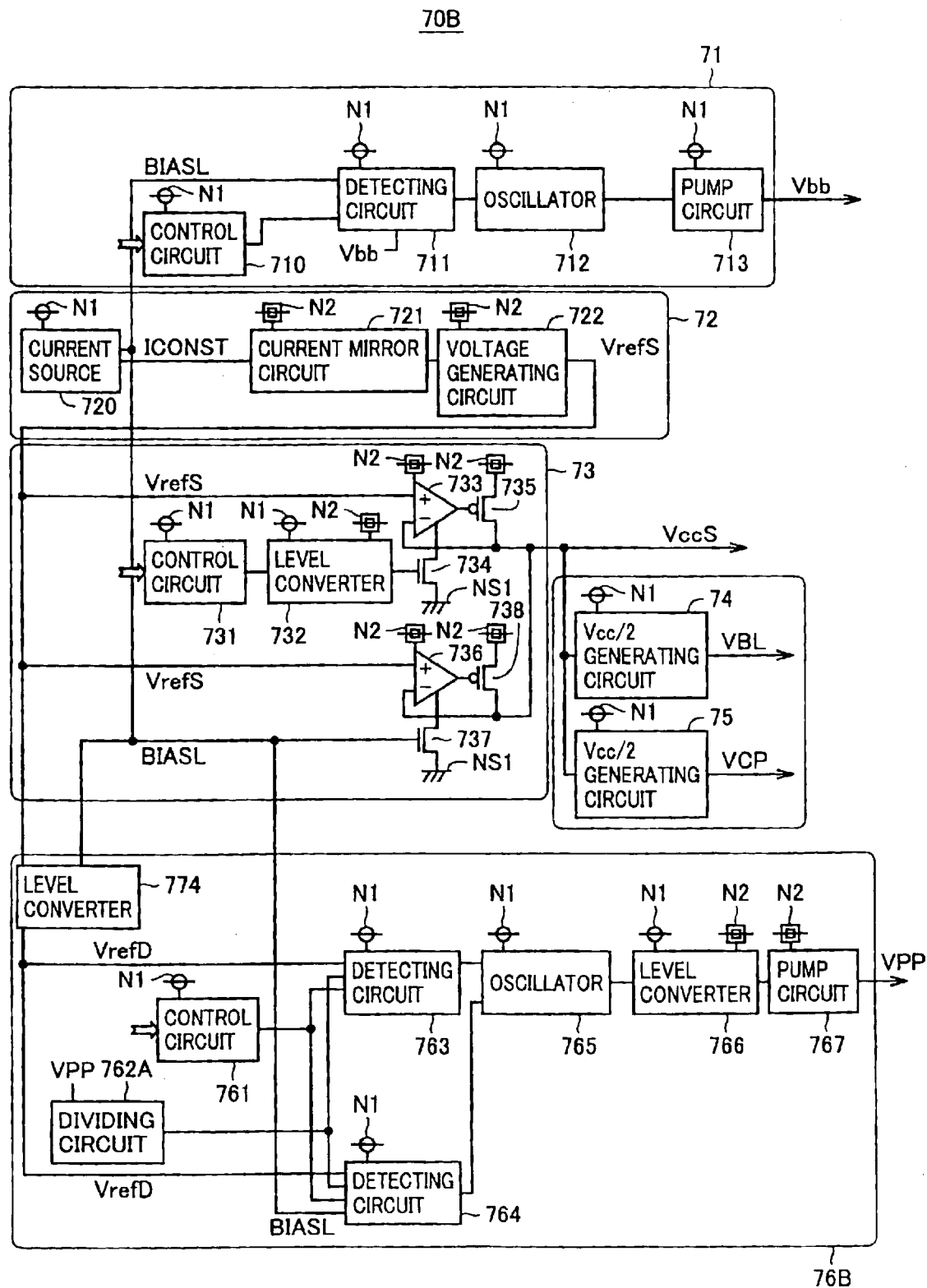
FIG. 25 is a circuit diagram showing a power supply circuit shown in FIG. 24 with some portions depicted in block forms.
Figure 26:
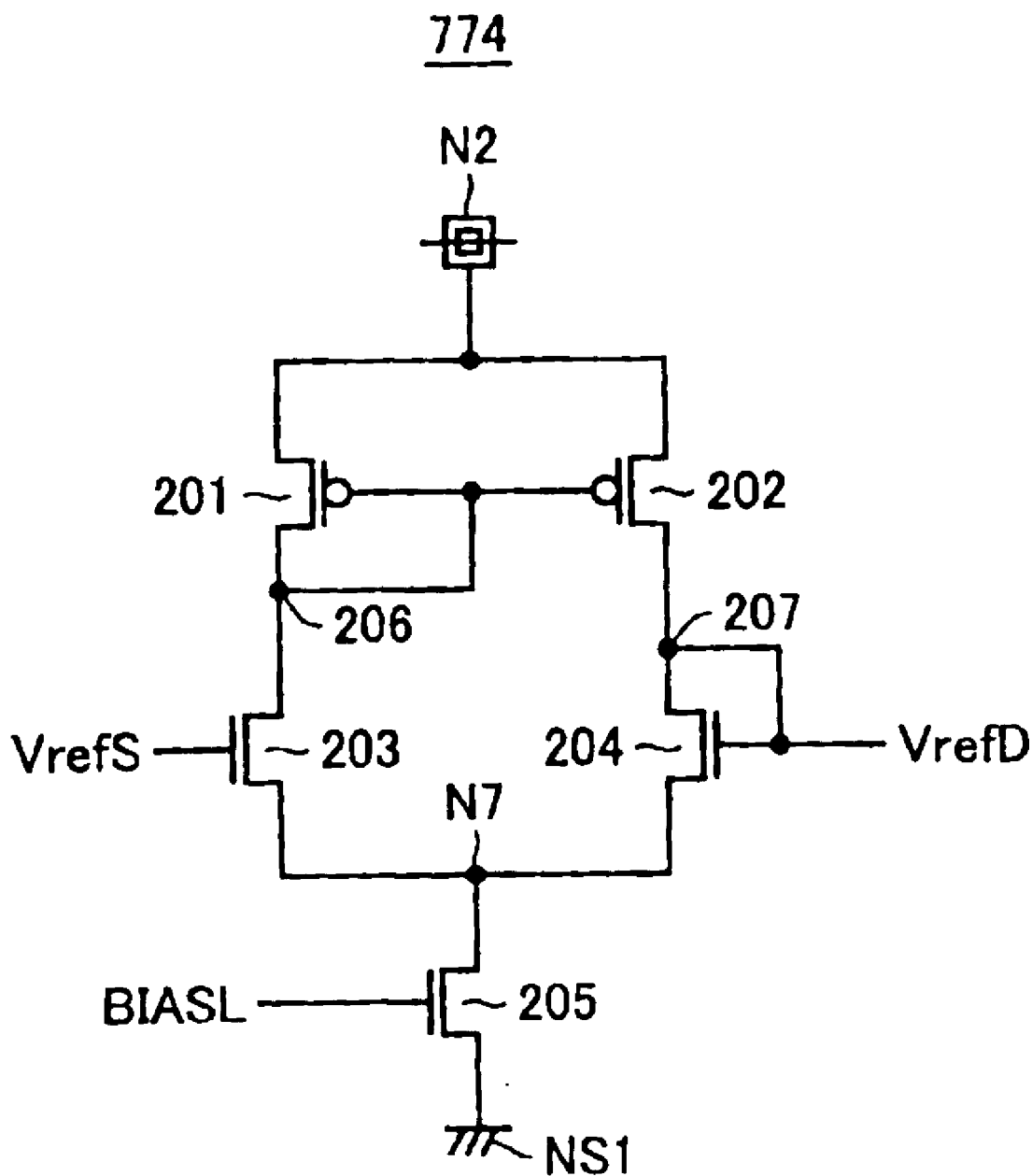
FIG. 26 is a circuit diagram of a level converter included in the VPP generating circuit shown in FIG. 25.

Referring to FIG. 25, power supply circuit 70B is the same as power supply circuit 70 except for that VPP generating circuit 76 in power supply circuit 70 is replaced with a VPP generating circuit 76B. VPP generating circuit 76B is the same as VPP generating circuit 76 except for that a level converter 774 is additionally employed, and dividing circuit 762 is replaced with a dividing circuit 762A. Referring to FIG. 26, level converter 774 includes P-channel MOS transistors 201 and 202 as well as N-channel MOS transistors 203–205. P- and N-channel MOS transistors 201 and 203 are connected in series between nodes N2 and N7. P- and N-channel MOS transistors 202 and 204 are connected in series between nodes N2 and N7. P- and N-channel MOS transistors 201 and 203 are connected in parallel to P- and N-channel MOS transistors 202 and 204.

N-channel MOS transistor 205 is connected between node N7 and ground node NS1. P-channel MOS transistors 201 and 202 receive on their gate terminals a voltage carried on a node 206. P-channel MOS transistor 202 has a smaller size than P-channel MOS transistor 201.

N-channel MOS transistor 203 receives reference voltage VrefS from reference voltage generating circuit 72 on its gate terminal. N-channel MOS transistor 204 receives on its gate terminal a voltage VrefD carried on a node 207. N-channel MOS transistor 205 receives signal BIASL sent from current source 720 of reference voltage generating circuit 72 on its gate terminal.

Level converter 774 is activated when N-channel MOS transistor 205 receives signal BIASL on its gate terminal, and thereby converts reference voltage VrefS of 1.5 V to a reference voltage VrefD of 1.1 V. Since P-channel MOS transistor 202 has a smaller size than P-channel MOS transistor 201, electric charges supplied from node N2 to node 207 are smaller in amount than those supplied from node N2 to node 206. Therefore, the potential on node 207 is lower than the potential on node 206, and reference voltage VrefS of 1.5 V is converted into reference voltage VrefD of 1.1 V.

Figure 27:
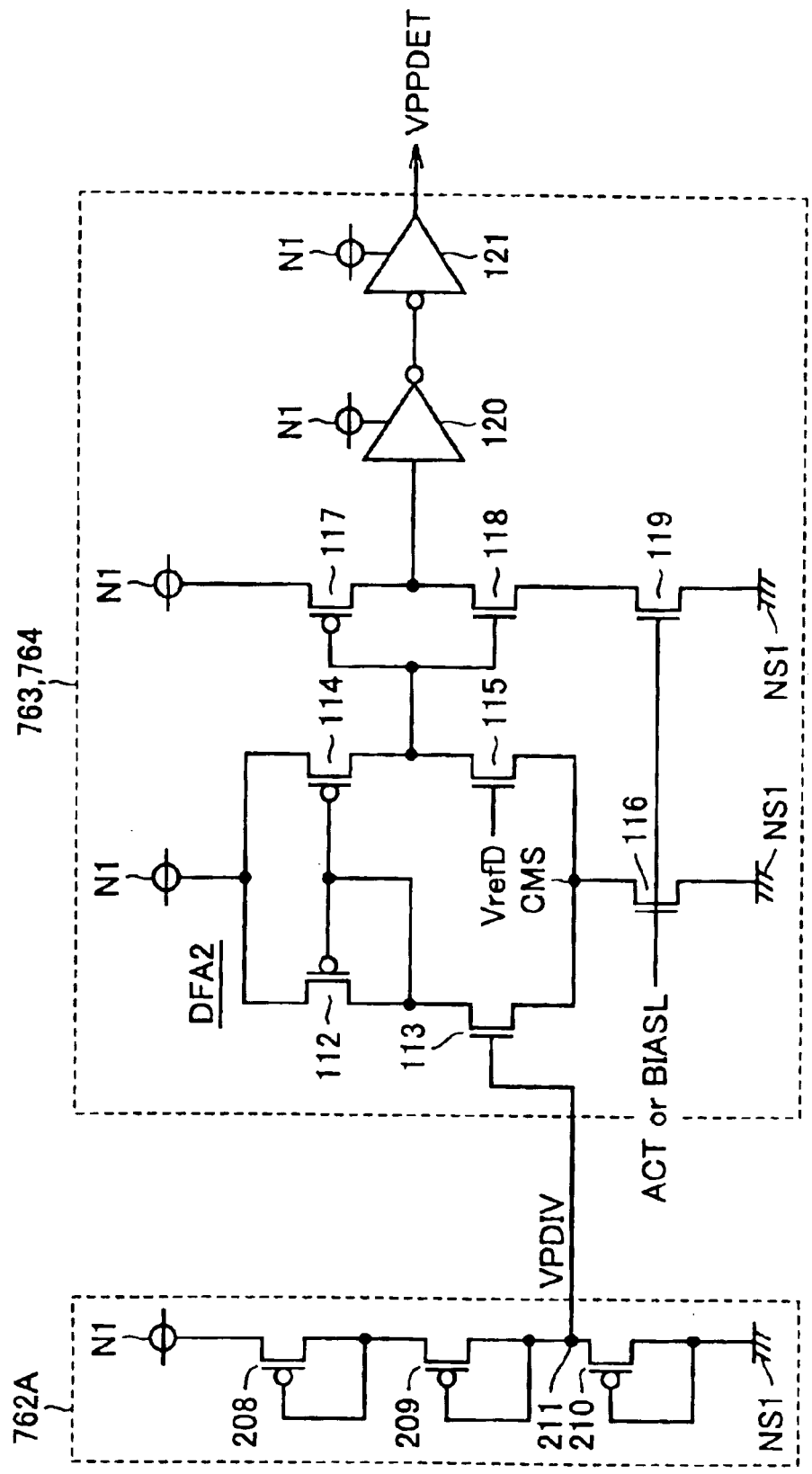
FIG. 27 is a circuit diagram showing a dividing circuit and the detecting circuit included in the VPP generating circuit shown in FIG. 25.

Referring to FIG. 27, dividing circuit 762A includes P-channel MOS transistors 208–210. P-channel MOS transistors 208–210 are diode-connected in series between node N1 and ground node NS1.

Therefore, dividing circuit 762A divides boosted voltage VPP supplied to node N1 by three, and provides divided voltage VPDIV from node 211 to detecting circuits 763 and 764.

Since boosted voltage VPP is equal to 3.3 V, divided voltage VPDIV is equal to 1.1 V.

Therefore, the voltage applied to the gate terminal of N-channel MOS transistor 113 of differential amplifier circuit DFA2 is divided voltage VPDIV of 1.1 V, and the voltage applied to the gate terminal of N-channel MOS transistor 115 is reference voltage VrefD of 1.1 V received from level converter 774.

Thereby, the voltage applied to the gate terminal of N-channel MOS transistors 113 and 115 is substantially equal to the voltage of (0.4+0.4=0.8 V) obtained by adding a threshold voltage (0.4 V) of N-channel MOS transistors 113 and 115 to the potential of 0.4 V (equal to the threshold voltage of N-channel MOS transistor 116) of common source CMS of differential amplifier circuit DFA2.

Since dividing circuit 762A divides boosted voltage VPP to produce ⅓ of the original voltage, the operation of comparing two voltages VPDIV and VrefD with each other in differential amplifier circuit DFA2 can be performed in a region of a high response and a high gain even if the differential amplifier circuit DFA2 is formed of the thin film MOS transistors.

In the foregoing example, dividing circuit 762A divides boosted voltage VPP by three. In the present invention, however, dividing circuit 762A is generally required to divide boosted voltage VPP by any natural number n, which is not restricted to three.

Structures and operations other than the above are the same as those of the first embodiment.

According to the third embodiment, since the semiconductor memory device includes the dividing circuit dividing the boosted voltage used for word line activation by n, the differential amplifier circuit of the current mirror type can differentially amplify the two voltages in the region of a high response and a high gain. As a result, the boosted voltage can be accurately detected.

[Fourth Embodiment]

Figure 28:
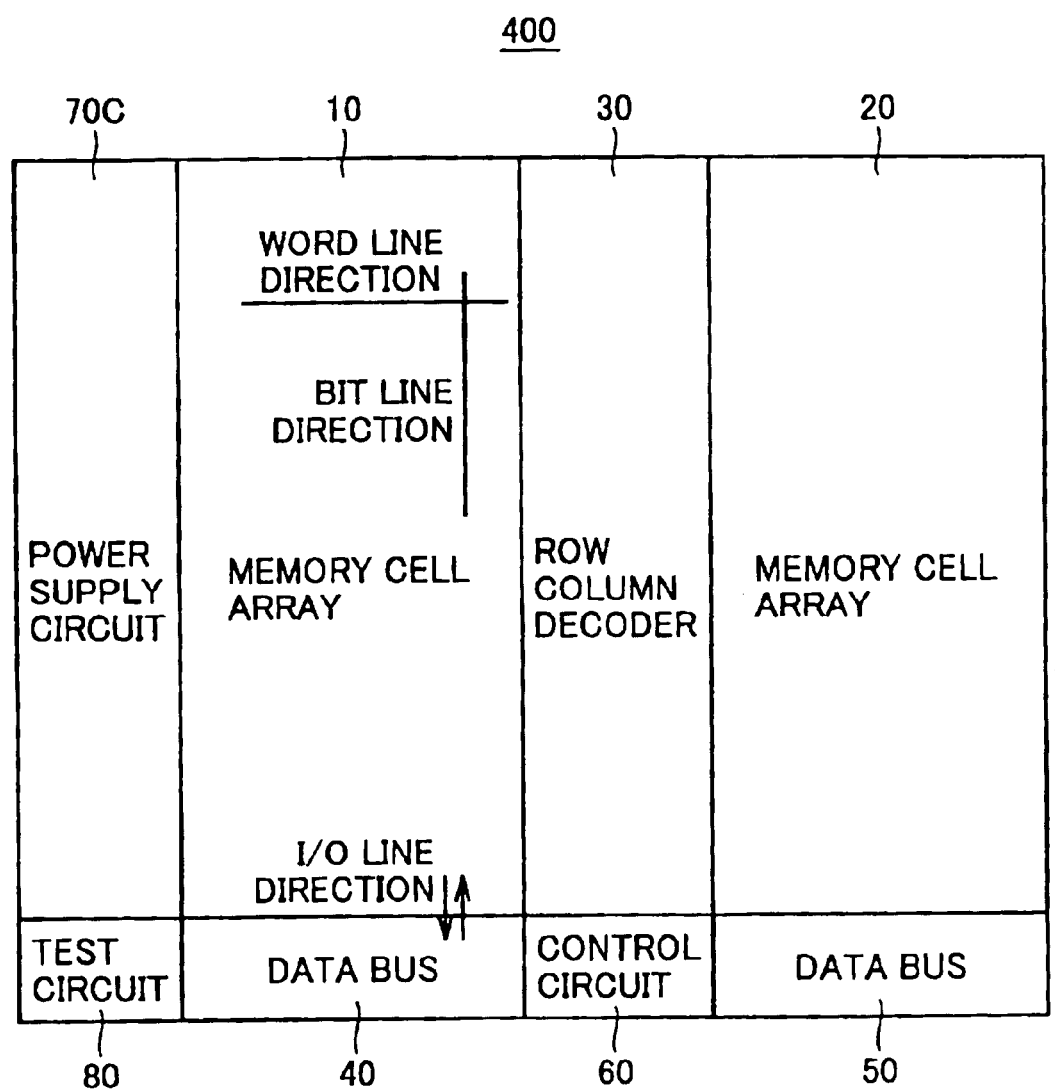
FIG. 28 is a schematic block diagram of a semiconductor memory device according to a fourth embodiment.

Referring to FIG. 28, a semiconductor memory device 400 according to a fourth embodiment is the same as semiconductor memory device 100 except for that power supply circuit 70 of semiconductor memory device 100 is replaced with a power supply circuit 70C.

Figure 29:
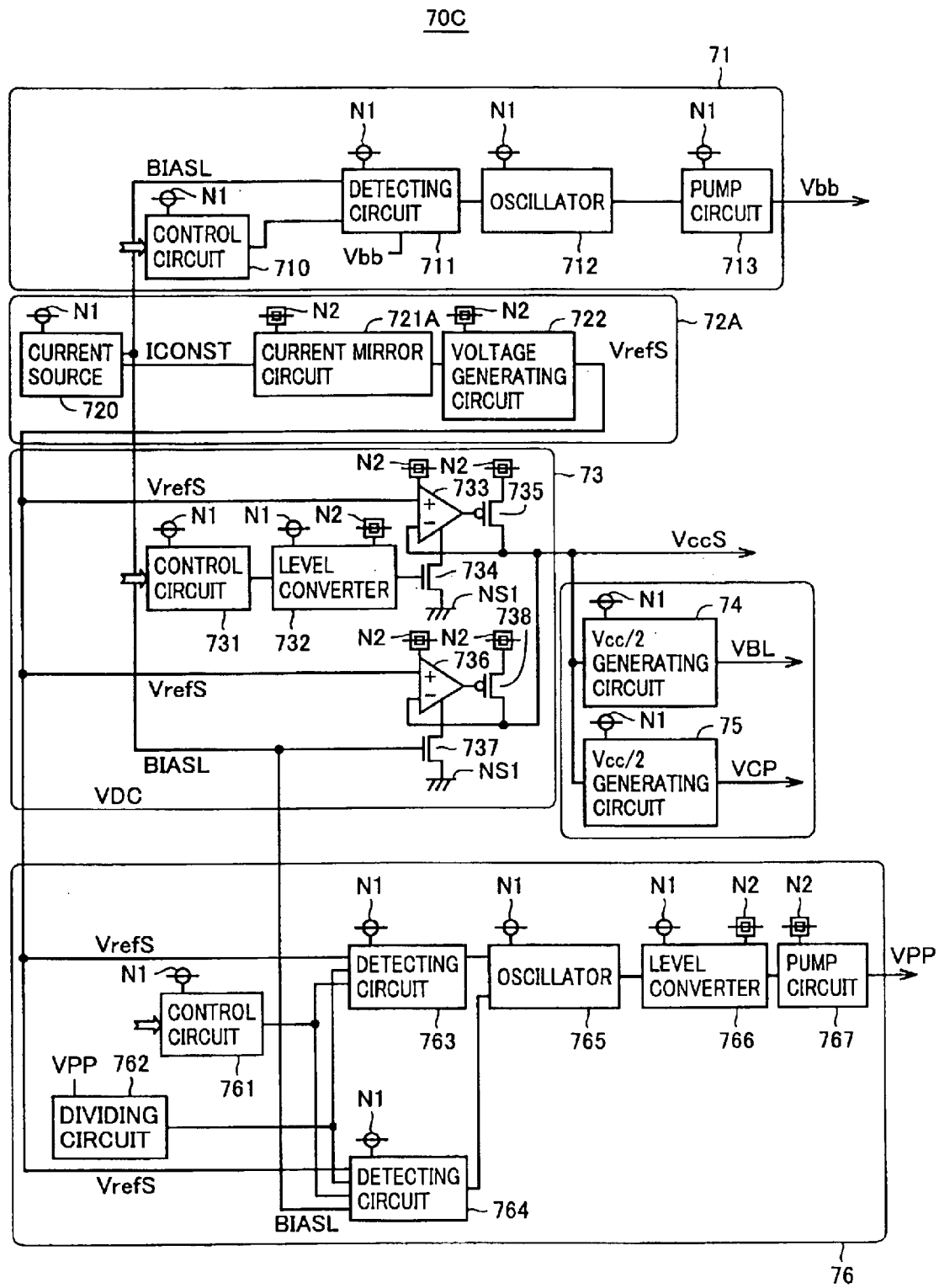
FIG. 29 is a circuit diagram showing a power supply circuit shown in FIG. 28 with some portions depicted in block forms.

Referring to FIG. 29, power supply circuit 70C is the same as power supply circuit 70 except for that reference voltage generating circuit 72 of power supply circuit 70 is replaced with a reference voltage generating circuit 72A.

Reference voltage generating circuit 72A is the same as reference voltage generating circuit 72 except for that current mirror circuit 721 of reference voltage generating circuit 72 is replaced with a current mirror circuit 721A.

Figure 30:
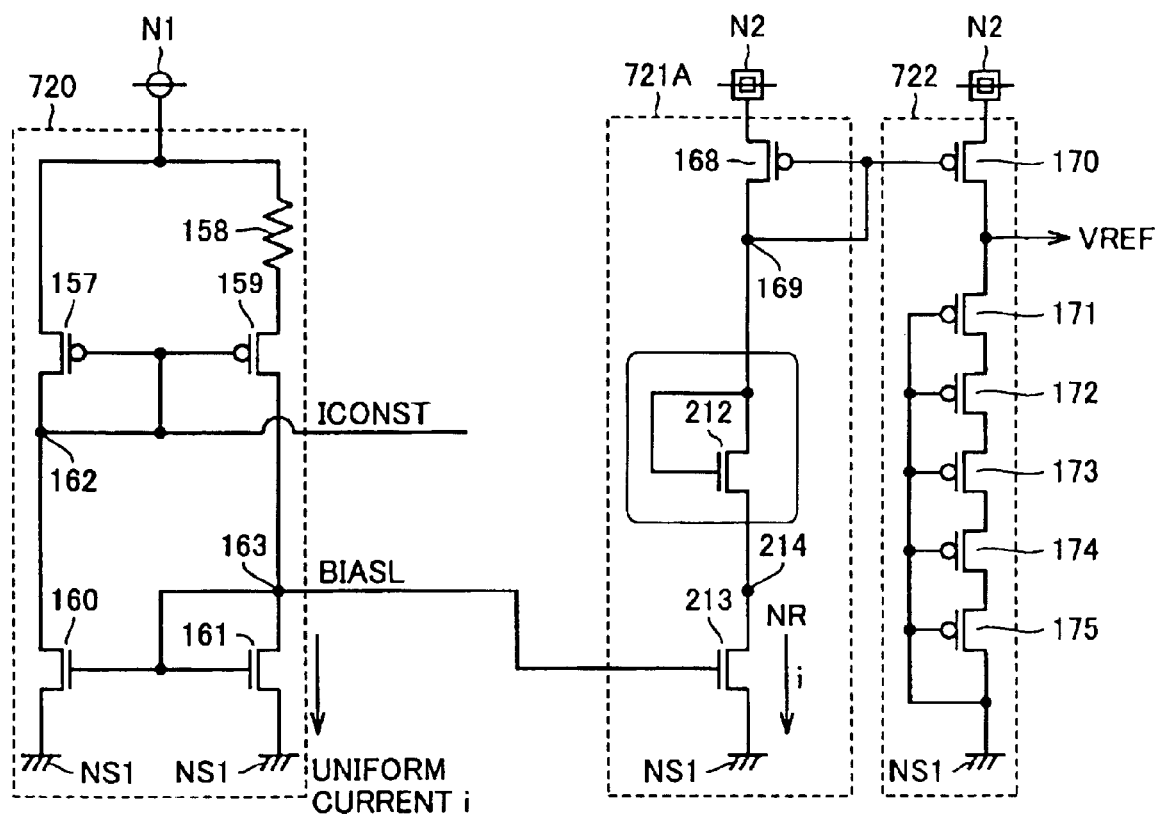
FIG. 30 is a circuit diagram of a reference voltage generating circuit shown in FIG. 29.

Referring to FIG. 30, current mirror circuit 721A is the same as current mirror circuit 721 except for that P- and N-channel MOS transistors 164 and 165 in current mirror circuit 721 are removed, N-channel MOS transistor 166 is replaced with an N-channel MOS transistor 213 and N-channel MOS transistor 212 is additionally employed.

P-channel MOS transistor 168 and N-channel MOS transistors 212 and 213 are connected in series between node N2 and ground node NS1.

N-channel MOS transistor 213 is a thin film MOS transistor, and receives signal BIASL sent from current source 720 on its gate terminal. N-channel MOS transistor 212 is a thick film MOS transistor, and is diode-connected.

N-channel MOS transistor 213 receives signal BIASL formed of the same voltage as the voltage, which is received on the gate terminals of N-channel MOS transistors 160 and 161, on its gate terminal, and therefore passes a uniform current i from node 214 to ground node NS1.

The power supply voltage of 3.3 V is supplied to node N2, and the voltage on node 169 is equal to 2.5 V. The voltage on node 214 is equal to 1.7 V obtained by lowering the voltage of 2.5 V on node 169 by the threshold (0.8 V) of N-channel MOS transistor 212.

Accordingly, only a voltage of about 1.7 V is applied across the source and drain terminals of N-channel MOS transistor 213 formed of the thin film MOS transistor, and N-channel MOS transistor 213 can transfer uniform current i generated by current source 720 with high reliability.

N-channel MOS transistor 212 lowers the voltage on node 169 to a voltage, which can be applied to the thin film MOS transistor, and supplies the lowered voltage to N-channel MOS transistor 213. Therefore, N-channel MOS transistor 212 provides a circuit protecting N-channel MOS transistor 213, which is the thin film MOS transistor.

Current mirror circuit 721A differs from current mirror circuit 721 in that node N1, P- and N-channel MOS transistors 164 and 165, and ground node NS1 are not present. Therefore, a through current of current mirror circuit 721A is smaller than that of current mirror circuit 721, and the current consumption can be reduced.

Current source 720 forms a current generating circuit.

Structures and operations other than the above are the same as those of the first embodiment.

According to the fourth embodiment, since the semiconductor memory device includes the reference voltage generating circuit, which generates reference voltage VrefS while suppressing the through current, the power consumption in the normal operation can be further reduced.

[Fifth Embodiment]

Figure 31:
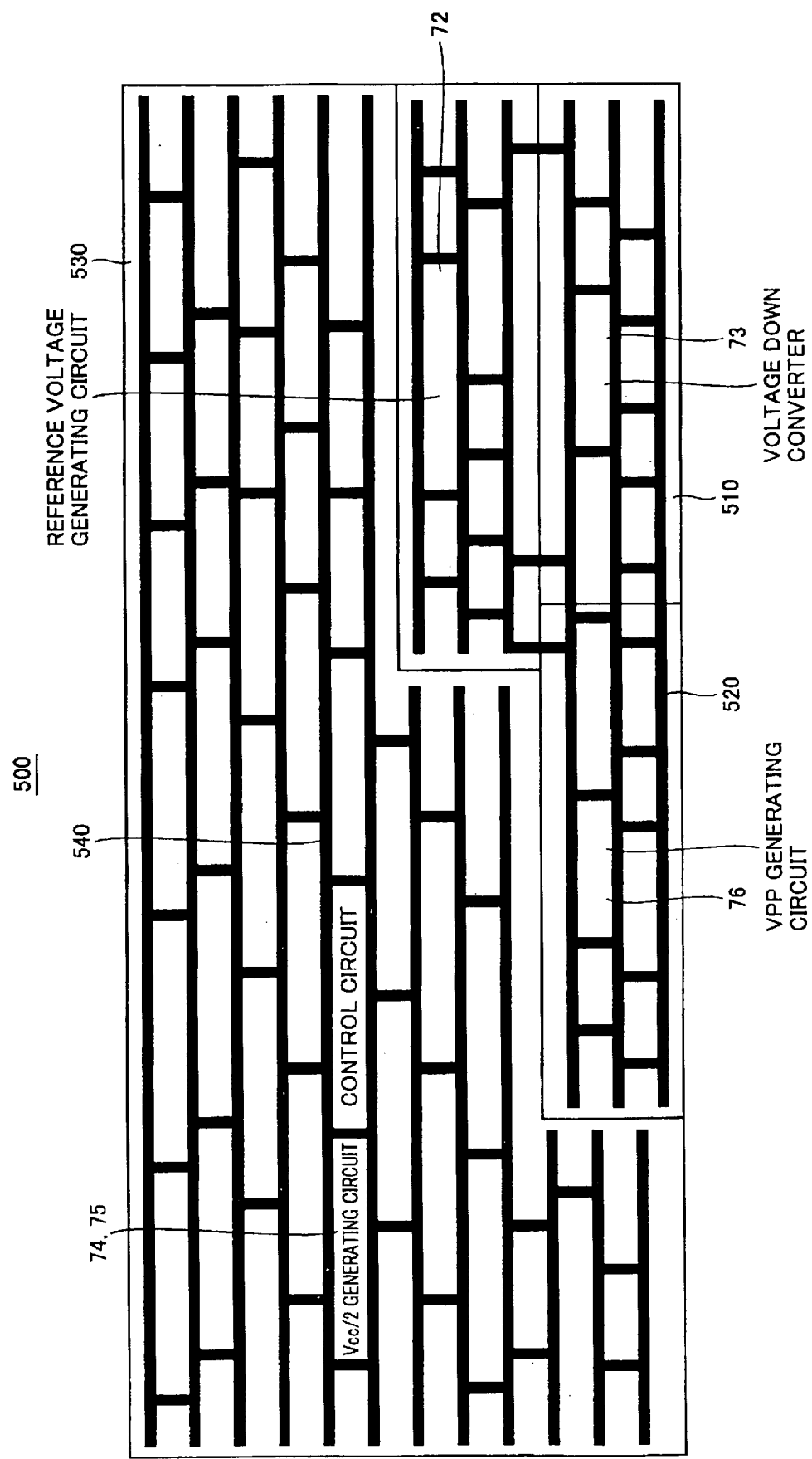
FIG. 31 is a plan showing a ground interconnection in a semiconductor memory device of a fifth embodiment.

Referring to FIG. 31, a semiconductor memory device 500 according to a fifth embodiment includes ground interconnections 520 and 540. Ground interconnection 520 is employed for the power supply voltage of 3.3 V, and ground interconnection 540 is employed for the power supply voltage of 1.5 V.

Ground interconnection 520 is arranged in a region 510. Reference voltage generating circuit 72, voltage down converter 73 and VPP generating circuit 76 including the thick film MOS transistors are arranged in region 510, and are connected to ground interconnection 510.

Ground interconnection 540 is arranged in region 530. Vcc/2 generating circuits 74 and 75, control circuits and others, which include thin film MOS transistors, are arranged in region 530, and are connected to ground interconnection 540.

According to semiconductor memory device 500 of the fifth embodiment, as described above, ground interconnection 520 for the power supply voltage at a higher voltage level is independent from ground interconnection 540 for the power supply voltage at a lower voltage level. If ground interconnections 520 and 540 were connected together, peak currents would occur on two ground interconnections 520 and 540 primarily due to different factors, respectively, and thereby interference would occur between ground interconnections 520 and 540 to raise potentials. For preventing such interference raising the potentials, ground interconnection 520 is electrically isolated from ground interconnection 540.

For example, sense amplifier operations of the DRAM consuming array voltage VccS cause the peak current on ground interconnection 520, and read/write operations of the memory cells cause the peak current on ground interconnection 540.

For example, in the semiconductor memory device having a plurality of banks, the potential on ground interconnection may rise during a read operation in a certain bank, and this may affect and raise the potential on ground interconnection 520. If a sense amplifier operation is performed in another bank during the above state, the potential on ground interconnection 520 may further rise, resulting in a malfunction.

In semiconductor memory device 500 of the fifth embodiment, therefore, ground interconnection 520 is electrically isolated from ground interconnection 540.

If a P-type substrate is employed, as is done in general semiconductor devices, the substrate itself attains the ground potential, and therefore cannot be completely insulated without difficulty. However, the electric resistance of the substrate is much larger than that of a metal interconnection. Therefore, if ground interconnections 520 and 540 are connected by metal interconnections, mutual interference with noises occurs between ground interconnections 520 and 540. However, the noise interference between ground interconnections 520 and 540 can be reduced by isolating ground interconnections 520 and 540 from each other.

Figure 32:
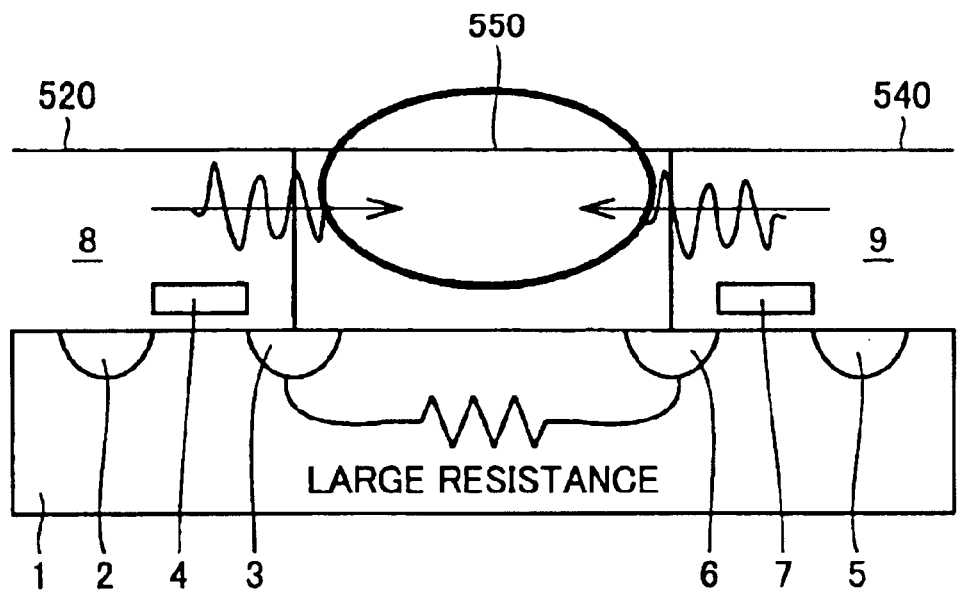
FIG. 32 is a cross section of a portion in the semiconductor memory device.

Referring to FIG. 32, P-type substrate 1 is provided with two MOS transistors 8 and 9. MOS transistor 8 is a thick film MOS transistor, and MOS transistor 9 is a thin film MOS transistor. MOS transistor 8 includes a source terminal 2, a drain terminal 3 and a gate terminal 4. MOS transistor 9 includes a source terminal 5, a drain terminal 6 and a gate terminal 7.

Ground interconnection 520 is connected to drain terminal 3 of MOS transistor 8. Ground interconnection 540 is connected to drain terminal 6 of MOS transistor 9. Ground interconnection 520 is connected to ground interconnection 540 by a metal interconnection 550.

Thereby, P-type substrate 1 provides a large resistance between drain terminal 3 of MOS transistor 8 and drain terminal 6 of MOS transistor 9 so that noises occurring on ground interconnection 520 are transmitted to ground interconnection 540 via metal interconnection 550, and noises occurring on ground interconnection 540 are transmitted to ground interconnection 520 via metal interconnection 550. Consequently, the noises occurring on ground interconnection 520 interfere with the noises occurring on ground interconnection 540.

Figure 33:
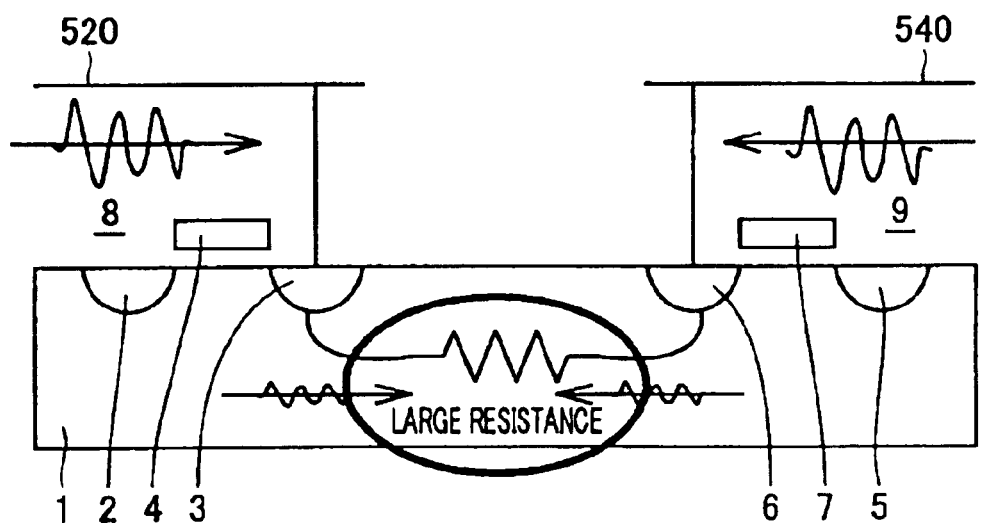
FIG. 33 is a cross section of another portion in the semiconductor memory device.
Figure 34:
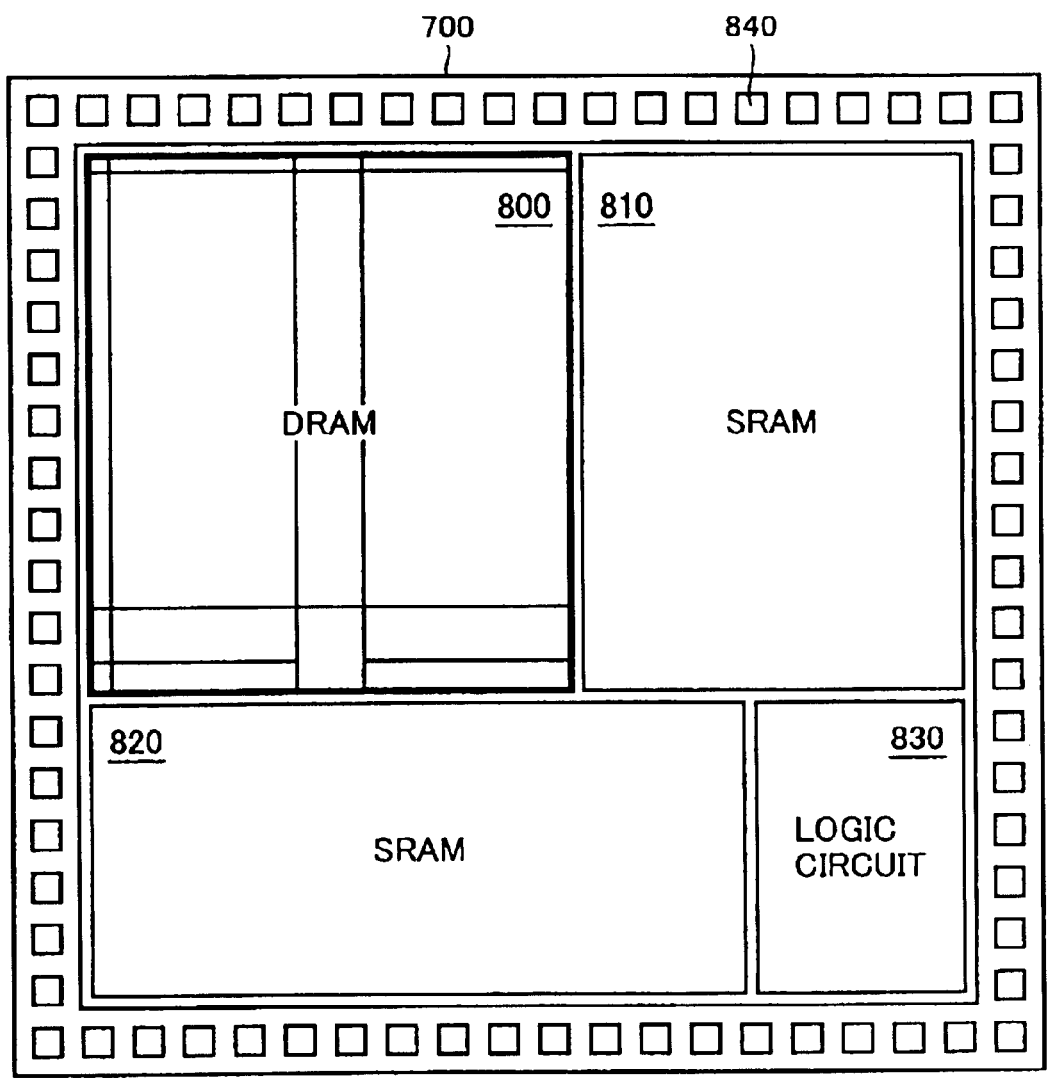
FIG. 34 is a schematic block diagram of a logic-mixed memory.
Figure 35:
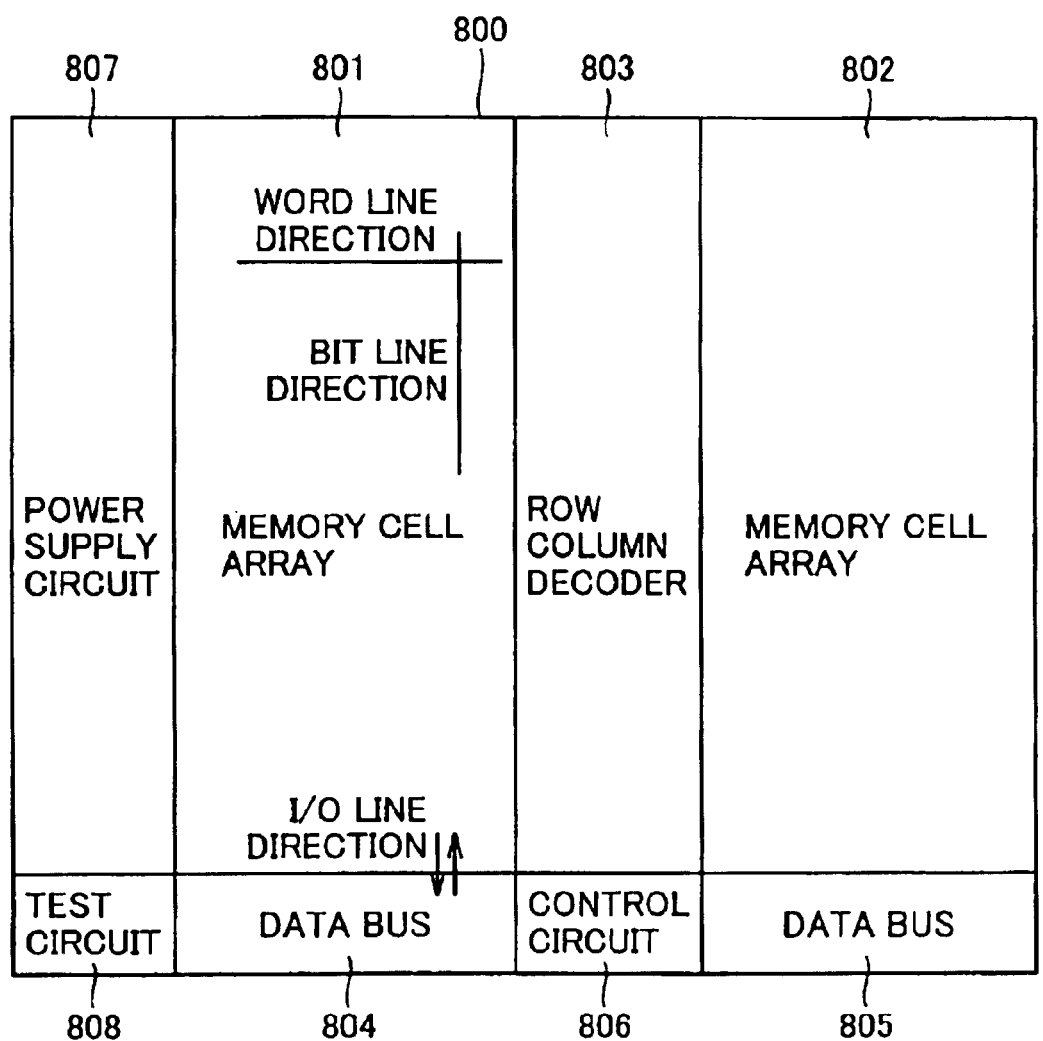
FIG. 35 is a schematic block diagram of a DRAM shown in FIG. 34.
Figure 36:
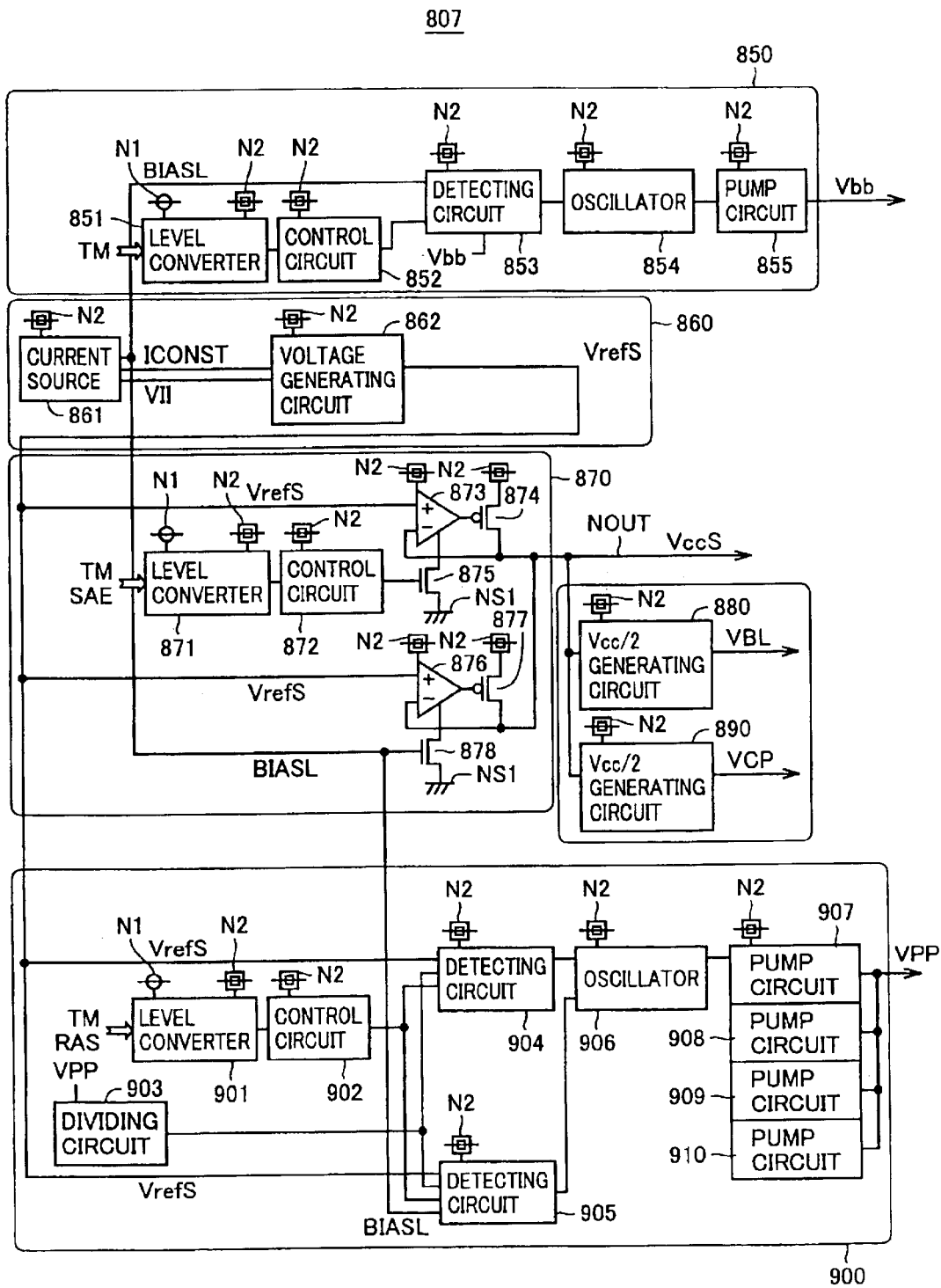
FIG. 36 is a circuit diagram showing a power supply circuit shown in FIG. 35 with some portions depicted in block forms.
Figure 38:
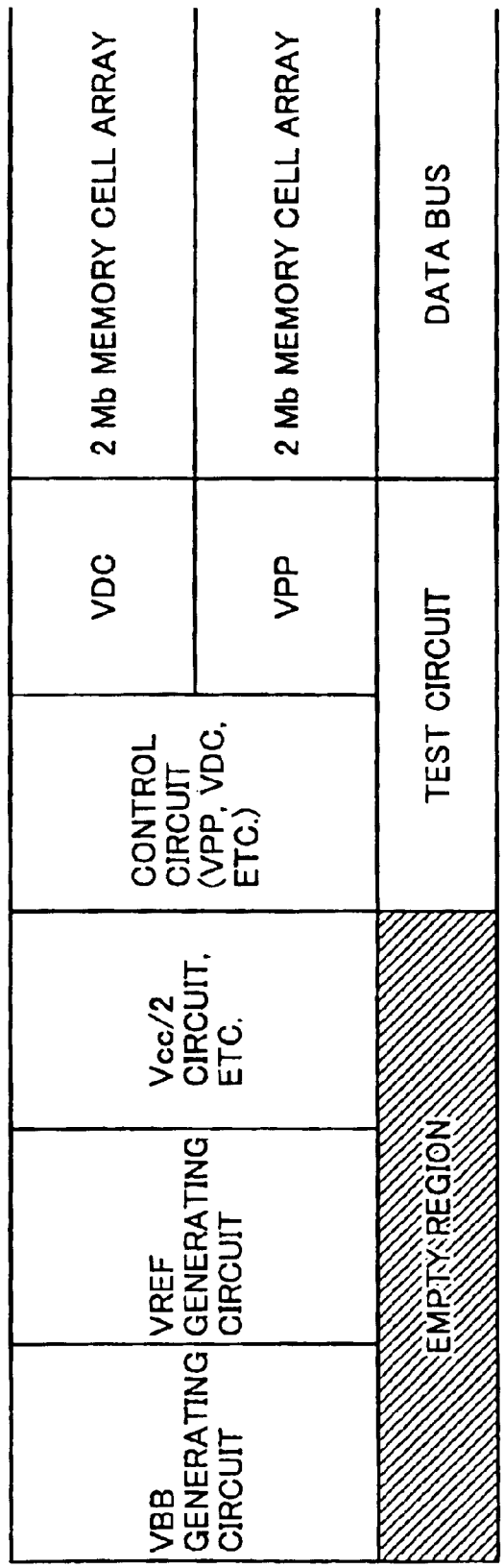
FIG. 38 is a schematic block diagram of a conventional semiconductor memory device having a capacity of 4 Mb.
Figure 39:
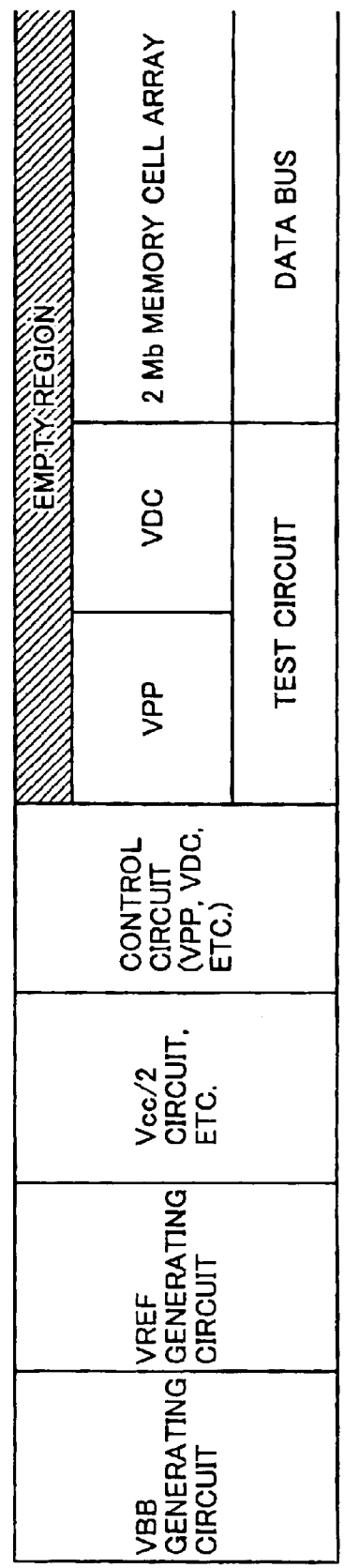
FIG. 39 is a schematic block diagram of a conventional semiconductor memory device having a capacity of 2 Mb.
Figure 40:
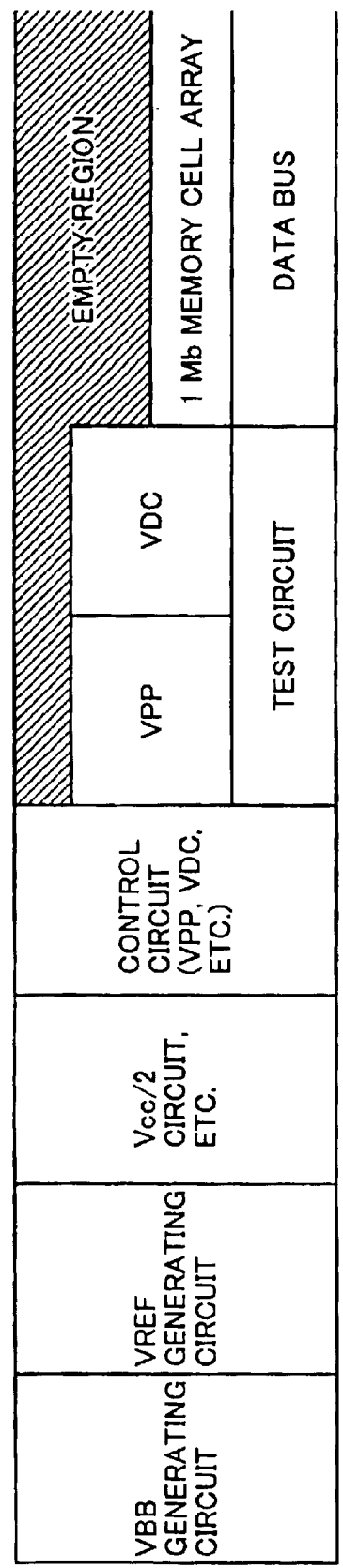
FIG. 40 is a schematic block diagram of a conventional semiconductor memory device having a capacity of 1 Mb.

As shown in FIG. 33, when ground interconnection 520 is electrically isolated from ground interconnection 540, noises occurring on ground interconnection 520 are hardly transmitted to ground interconnection 540, and noises occurring on ground interconnection 540 are hardly transmitted to ground interconnection 520 because P-type substrate 1 provides a large resistance between MOS transistors 8 and 9. Consequently, noises occurring on ground interconnection 520 hardly interfere with those on ground interconnection 540.

Structures and operations other than the above are the same as those in the first embodiment.

According to the fifth embodiment, since the two ground interconnections for the two different power supply voltages are isolated from each other, noises occurring on one of the ground interconnections can be prevented from being transmitted to the other ground interconnection. Consequently, a malfunction can be prevented in the semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array storing data;
   a peripheral circuit inputting data to and outputting data from said memory cell array; and
   a power supply circuit supplying a power supply voltage to said memory cell array and said peripheral circuit, said power supply circuit including:
      a first power supply circuit group including voltage generating circuits, m (m: natural number) in number, including thick film transistors having a first gate oxide film thickness, each voltage generating circuit generating an internal voltage for inputting the data to and outputting the data from said memory cell array, and
      a second power supply circuit group including voltage generating circuits, n (n: natural number) in number, including thin film transistors having a second gate oxide film thickness thinner than the first gate oxide film thickness, each voltage generating circuit generating an internal voltage, where
      said first power supply circuit group corresponds to said memory cell array, and is arranged in a first region neighboring said memory cell array, and said m voltage generating circuits are arranged in said first region in m units; and
      said second power supply circuit group is arranged in a second region and not in said first region, and said n voltage generating circuits are arranged in said second region in a shuffled fashion.

2. The semiconductor memory device according to claim 1, wherein said first power supply circuit group includes:
   a first voltage generating circuit generating a boosted voltage for activating a plurality of word lines included in said memory cell array, a second voltage generating circuit generating an array voltage supplied to said memory cell array, and a third voltage generating circuit generating a reference voltage used in said second voltage generating circuit, wherein said first and second voltage generating circuits are arranged in units in positions neighboring said memory cell array.

3. The semiconductor memory device according to claim 2, wherein said second power supply circuit group includes:

a fourth voltage generating circuit generating a cell plate voltage supplied to a plurality of memory cells included in said memory cell array, a fifth voltage generating circuit generating a precharge voltage for precharging bit line pairs included in said memory cell array, and a sixth voltage generating circuit generating a negative voltage supplied to said memory cell array.

4. The semiconductor memory device according to claim 2, wherein said memory cell array includes a plurality of blocks determined in accordance with storage capacity of said semiconductor memory device, and said first voltage generating circuit is arranged in a position neighboring a block other than the block neighboring said second voltage generating circuit.

5. The semiconductor memory device according to claim 1, wherein said memory cell array includes a plurality of blocks determined in accordance with storage capacity of said semiconductor memory device, and said second region is arranged commonly with said plurality of blocks.

6. The semiconductor memory device according to claim 1, wherein said m voltage generating circuits include a boosted voltage generating circuit generating a boosted voltage, and said boosted voltage generating circuit includes:

a first pump circuit including said thick film transistors generating the boosted voltage supplied to said memory cell array when the data is input and output, and a first voltage detecting circuit detecting voltage level of the boosted voltage, and providing a signal corresponding to the voltage level detected for producing a control signal controlling generation of the boosted voltage;

said n voltage generating circuits arranged in a shuffled fashion include a negative voltage generating circuit generating a negative voltage; and said negative voltage generating circuit includes:

a second pump circuit including said thin film transistors generating the negative voltage supplied to said memory cell array, and a second voltage detecting circuit detecting the voltage level of the negative voltage, and providing a signal corresponding to the voltage level detected for producing a control signal controlling generation of the negative voltage; and said first and second voltage detecting circuits include said thick film transistors.

7. The semiconductor memory device according to claim 6, wherein said first voltage detecting circuit includes:

a voltage dividing circuit dividing the boosted voltage to provide a divided voltage, and a first differential amplifier circuit having a current mirror circuit comparing the divided voltage with a first reference voltage, and providing a signal having a voltage level corresponding to results of the comparing;

said first differential amplifier circuit includes said thick film transistors and the divided voltage has a voltage level obtained by adding a threshold voltage of said thick film transistors to a potential on a common source of said first differential amplifier circuit;

said second voltage detecting circuit includes:

a second differential amplifier circuit having a current mirror circuit providing a positive voltage corresponding to voltage level of the negative voltage, and a third differential amplifier circuit comparing the positive voltage with a second reference voltage, and providing a signal having a voltage level corresponding to results of the comparing;

said third differential amplifier circuit includes said thick film transistors, and the positive voltage has a voltage level obtained by adding a threshold voltage of said thick film transistors to a potential on a common source of said third differential amplifier circuit.

8. The semiconductor memory device according to claim 1, wherein said m voltage generating circuits include a boosted voltage generating circuit generating a boosted voltage, and said boosted voltage generating circuit includes:

a pump circuit including said thick film transistors generating the boosted voltage supplied to said memory cell array when the data is input and output, and a voltage detecting circuit detecting voltage level of the boosted voltage, and providing a signal corresponding to the voltage level detected for producing a control signal controlling generation of the boosted voltage;

said voltage detecting circuit includes:

a voltage dividing circuit dividing the boosted voltage by p (p: natural number larger than two) to provide a divided voltage, and a differential amplifier circuit having a current mirror circuit comparing the divided voltage with a reference voltage, and providing a signal having a voltage level corresponding to results of the comparing; and said differential amplifier circuit includes said thin film transistors, and the divided voltage has a voltage level obtained by adding a threshold voltage of said thin film transistors to a potential on a common source of said differential amplifier circuit.

9. The semiconductor memory device according to claim 1, wherein said m voltage generating circuits arranged to form units include a voltage generating circuit and said voltage generating circuit includes:

a signal output circuit driven by a first power supply voltage having a first voltage level for providing an inactive signal until the first power supply voltage is supplied, and a pump circuit, driven by a second power supply voltage having a second voltage level higher than the first voltage level, for generating an internal voltage for operating said memory cell array, wherein said pump circuit generates an internal voltage having a voltage level for deactivating said memory cell array in accordance with the inactive signal.

10. The semiconductor memory device according to claim 1, wherein said m voltage generating circuits arranged to form units include a reference voltage generating circuit generating a reference voltage for generating an internal voltage supplied to said memory cell array when the data is input and output;

said reference voltage generating circuit includes:
- a current generating circuit generating a uniform current, and providing a first voltage having a voltage level corresponding to the uniform current generated,
- a current mirror circuit receiving the first voltage, generating the same current as said uniform current, and providing a second voltage having a voltage level corresponding to the current generated, and
- a voltage generating circuit receiving the second voltage, and generating the reference voltage in accordance with the second voltage received;

said current generating circuit includes said thin film transistors;

said voltage generating circuit includes said thick film transistors; and said current mirror circuit includes said thin film transistor receiving the first voltage.

11. The semiconductor memory device according to claim 1, further comprising:

a first ground line for supplying a first ground voltage to said m voltage generating circuits driven by a first power supply voltage, and a second ground line for supplying a second ground voltage to said n voltage generating circuits driven by a second power supply voltage having a lower voltage level than the first power supply voltage, wherein said first ground line is isolated from said second ground line.

* * * * *